US012597714B2

(12) United States Patent
Tsuruda

(10) Patent No.: US 12,597,714 B2
(45) Date of Patent: Apr. 7, 2026

(54) TERAHERTZ DEVICE

(71) Applicant: ROHM CO., LTD., Kyoto (JP)

(72) Inventor: Kazuisao Tsuruda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 489 days.

(21) Appl. No.: 18/006,804

(22) PCT Filed: Jul. 13, 2021

(86) PCT No.: PCT/JP2021/026336
§ 371 (c)(1),
(2) Date: Jan. 25, 2023

(87) PCT Pub. No.: WO2022/024749
PCT Pub. Date: Feb. 3, 2022

(65) Prior Publication Data
US 2024/0297444 A1     Sep. 5, 2024

(30) Foreign Application Priority Data

Jul. 30, 2020     (JP) ................................. 2020-129050

(51) Int. Cl.
*H01Q 19/13*          (2006.01)
*H01Q 19/15*          (2006.01)
*H03B 7/08*           (2006.01)

(52) U.S. Cl.
CPC ........... *H01Q 19/132* (2013.01); *H01Q 19/15* (2013.01); *H03B 7/08* (2013.01); *H03B 2200/0084* (2013.01)

(58) Field of Classification Search
CPC ........ H01Q 19/132; H01Q 19/15; H03B 7/08; H03B 2200/0084

(Continued)

(56) References Cited

U.S. PATENT DOCUMENTS

2010/0026401 A1*   2/2010   Mukai ...................... H03B 7/08
                                                    331/107 T
2015/0136987 A1*   5/2015   Kajiki ....................... G01J 3/28
                                                    250/493.1

(Continued)

FOREIGN PATENT DOCUMENTS

JP          2011053529 A       3/2011
JP          2015161669 A       9/2015

(Continued)

OTHER PUBLICATIONS

Office Action issued for German Patent Application No. 112021003425. 1, dated Oct. 17, 2024, 7 pages including English machine translation.

(Continued)

*Primary Examiner* — Jason L Mccormack

(74) *Attorney, Agent, or Firm* — HSML P.C.

(57)          ABSTRACT

A terahertz device includes: a support substrate; a terahertz element that is mounted to the support substrate and that emits an electromagnetic wave in a terahertz band; and a reflection body that is disposed on the opposite side to an element rear surface with respect to an element main surface in a z direction and at an interval in the z direction from the element main surface and that has a reflection surface for reflecting, in a direction crossing the z direction, an electromagnetic wave emitted in the z direction by the terahertz element.

16 Claims, 30 Drawing Sheets

(58) Field of Classification Search
USPC ...................................................... 250/493.1
See application file for complete search history.

(56) References Cited

U.S. PATENT DOCUMENTS

| | | | |
|---|---|---|---|
| 2017/0271774 A1 | 9/2017 | Mukai et al. | |
| 2019/0107567 A1* | 4/2019 | Morgan ................. | G01R 29/10 |
| 2020/0279776 A1 | 9/2020 | Mukai et al. | |

FOREIGN PATENT DOCUMENTS

| | | | | |
|---|---|---|---|---|
| JP | 2016111542 A | 6/2016 | | |
| JP | 2019075544 A | 5/2019 | | |
| WO | WO-2019059214 A1 * | 3/2019 | ......... | G01N 21/3581 |

OTHER PUBLICATIONS

Deng, X-D. et al., "A D-band Chip-to-Waveguide-Horn (CWH) Antenna with 18.9 dBi Gain Using CMOS Technology," 2015 IEEE International Wireless Symposium (IWS 2015), IEEE, 2015, 4 pages.

International Search Report and Written Opinion issued for International Patent Application No. PCT/JP2021/026336, Date of mailing: Sep. 28, 2021, 8 pages including English translation of Search Report.

Notice of Reasons for Refusal issued for Japanese Patent Application No. 2022-540146, Dispatch date: Mar. 11, 2025, 7 pages including English machine translation.

* cited by examiner

TERAHERTZ DEVICE

TECHNICAL FIELD

The present disclosure relates to a terahertz device.

BACKGROUND ART

Recent advances in miniaturization of electronic devices such as transistors have reduced the size of electronic devices to the nanoscale. As a result, a phenomenon called a quantum effect is observed. The quantum effect is used to develop an ultra-high-speed processing device and a device having a new function.

In such an environment, in particular, electromagnetic waves in the frequency range of 0.1 THz to 10 THz, which is called a terahertz band, are used in attempts to perform high capacity communication, information processing, imaging, and measurements. This frequency range has characteristics of both light and radio waves. If a device operating in this frequency band is realized, the device may be used in many applications such as measurements in various fields, for example, in the fields of physics, astronomy, and biology, in addition to imaging, high capacity communication, and information processing, which are described above.

A known element that transmits or receives electromagnetic waves having a frequency in the terahertz band may have a structure that integrates, for example, a resonant tunneling diode and a fine slot antenna (refer to, for example, patent literature 1). Patent literature 2 discloses an example of a terahertz device that packages an element such as that disclosed in patent literature 1.

CITATION LIST

Patent Literature

Patent Literature 1: Japanese Laid-Open Patent Publication No. 2016-111542
Patent Literature 2: Japanese Laid-Open Patent Publication No. 2019-75544

SUMMARY OF INVENTION

Technical Problem

There is room for improvement in antenna gain of conventional terahertz devices.

It is an objective of the present disclosure to provide a terahertz device that improves antenna gain.

Solution to Problem

To achieve the above objective, a terahertz device includes a terahertz element and a reflector. The terahertz element includes an element main surface and an element back surface that face in opposite directions and emits an electromagnetic wave in a terahertz band. The terahertz element has a thickness-wise direction that is orthogonal to the element main surface. The reflector is spaced apart and opposed to the element main surface in the thickness-wise direction. The reflector includes a reflection surface. When the terahertz element emits an electromagnetic wave in the thickness-wise direction, the reflection surface reflects the electromagnetic wave in a direction intersecting the thickness-wise direction.

In this structure, electromagnetic waves are emitted from the terahertz element and are reflected on the reflection surface of the reflector. This increases the directivity of the electromagnetic waves when exiting the terahertz device in a direction intersecting the thickness-wise direction of the terahertz element. Thus, antenna gain is improved.

To achieve the objective described above, a terahertz device includes a terahertz element and a reflector. The terahertz element includes an element main surface and an element back surface that face in opposite directions. The terahertz element receives and detects an electromagnetic wave in a terahertz band. The terahertz element has a thickness-wise direction that is orthogonal to the element main surface. The reflector includes an opening that is open in a direction intersecting the thickness-wise direction and a reflection surface spaced apart and opposed to the element main surface in the thickness-wise direction. When an electromagnetic wave is propagated through the opening from outside the terahertz device, the reflection surface reflects the electromagnetic wave toward the terahertz element.

In this structure, when electromagnetic waves are propagated through the opening in a direction intersecting the thickness-wise direction of the terahertz element, the electromagnetic waves are reflected on the reflection surface of the reflector and propagated toward the terahertz element. This improves the antenna gain of electromagnetic waves propagated in a direction intersecting the thickness-wise direction of the terahertz element.

Advantageous Effects of Invention

The terahertz device described above improves the gain of an antenna.

BRIEF DESCRIPTION OF DRAWINGS

FIG. 11 is an end view showing a comparative example of a terahertz device.

FIG. 21 is an end view showing an end structure of a fourth embodiment of a terahertz device.

DESCRIPTION OF EMBODIMENTS

Embodiments of a terahertz device will now be described with reference to the drawings. The embodiments described below exemplify configurations and methods for embodying a technical concept and are not intended to limit the material, shape, structure, layout, dimensions, and the like of each component to those described below. The embodiments described below may undergo various modifications.

First Embodiment

A first embodiment of a terahertz device 10 will now be described with reference to FIGS. 1 to 9. FIG. 2 is a plan view of the terahertz device 10 from which a reflector 40, described later, is omitted.

Figure 1:
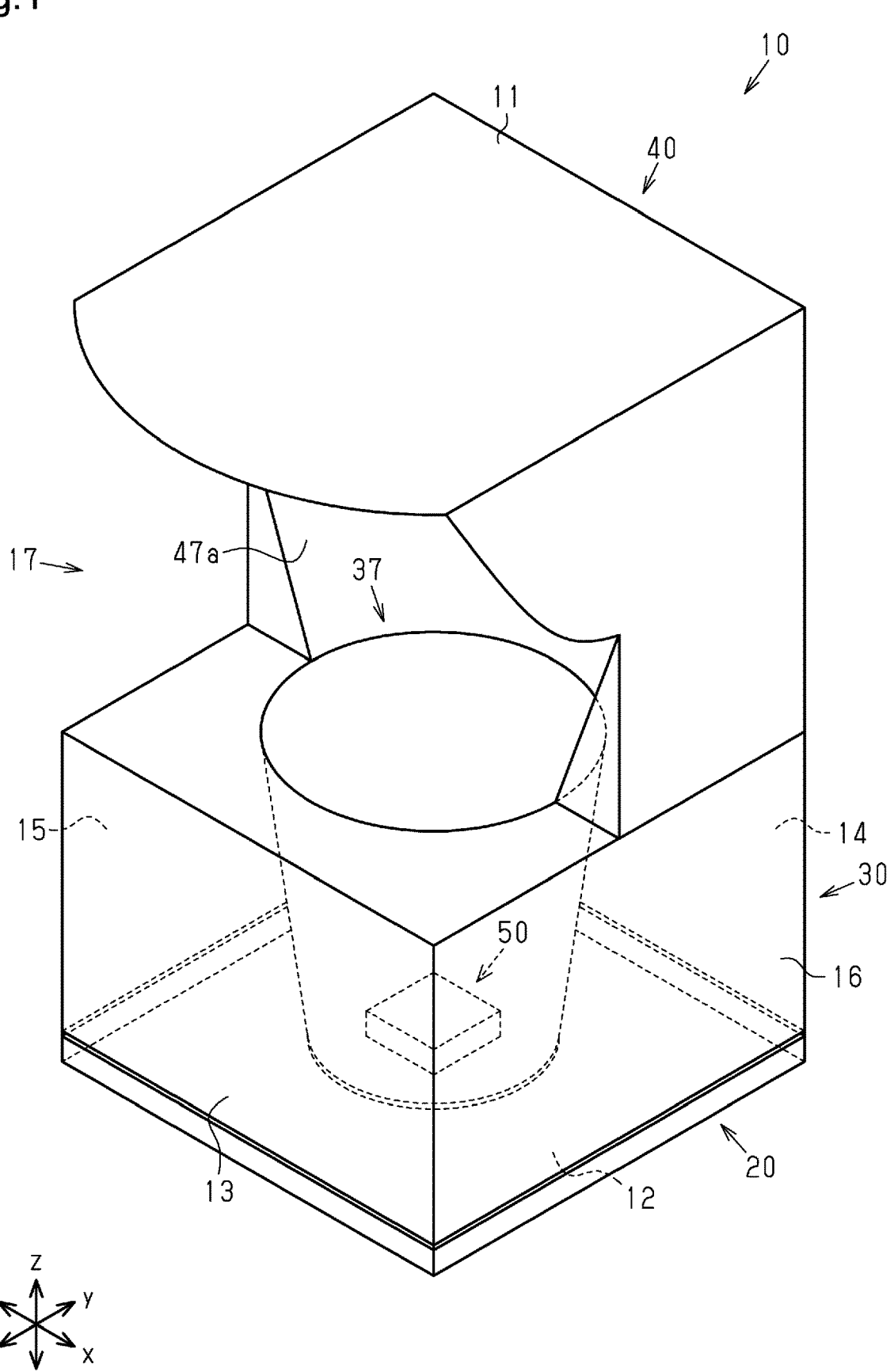
FIG. 1 is a perspective view showing a first embodiment of a terahertz device.
Figure 2:
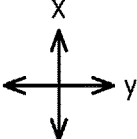
FIG. 2 is a plan view of the terahertz device shown in FIG. 1 with a reflector omitted.

As shown in FIG. 1, the terahertz device 10 has a structure in which a support substrate 20, a waveguide 30, and the reflector 40 are stacked. The support substrate 20 has the form of a rectangular plate. The waveguide 30 has the form of a rectangular box. The reflector 40 has the form of a rectangular box having an opening in one side. In the present embodiment, the waveguide 30 is stacked on the support substrate 20, and the reflector 40 is stacked on the waveguide 30.

In the description hereafter, the stacking direction of the support substrate 20, the waveguide 30, and the reflector 40 is referred to as the z-direction. Two directions that are orthogonal to each other and the z-direction are referred to as the x-direction and the y-direction. The z-direction may also refer to the height-wise direction of the terahertz device 10. As viewed in the z-direction, one side of the terahertz device 10 is defined in the x-direction, and another side of the terahertz device 10 is defined in the y-direction.

As shown in FIGS. 1 and 2, the terahertz device 10 includes two end surfaces in the z-direction, defining a device main surface 11 and a device back surface 12. The terahertz device 10 further includes four device side surfaces 13 to 16 disposed between the device main surface 11 and the device back surface 12 in the z-direction and extending in directions that intersect with the device main surface 11 and the device back surface 12. In the present embodiment, the device main surface 11 and the device back surface 12 face in opposite directions in the z-direction. The device side surfaces 13 to 16 each extend in a direction orthogonal to the device main surface 11 and the device back surface 12. As shown in FIG. 2, of the device side surfaces 13 to 16, the two device side surfaces 13 and 14 are spaced apart in the y-direction and include sides of the terahertz device 10 extending in the x-direction as viewed in the z-direction. Also, of the four device side surfaces 13, the two device side surfaces 15 and 16 are spaced apart in the x-direction and include sides of the terahertz device 10 extending in the y-direction as viewed in the z-direction.

The terahertz device 10 includes a terahertz element 50. The terahertz element 50 converts an electromagnetic wave in a terahertz band and electrical energy to and from each other. It is considered that the electromagnetic wave includes concepts of one or both of light and radio waves. The terahertz element 50 converts supplied electrical energy into electromagnetic waves in the terahertz band by oscillation. Thus, the terahertz element 50 emits the electromagnetic waves in the terahertz band, that is, terahertz waves. The frequency of electromagnetic waves is, for example, 0.1 Thz to 10 Thz. The structure of the terahertz element 50 will be described later in detail.

Figure 3:
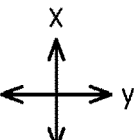
FIG. 3 is a plan view of the terahertz device shown in FIG. 2 with a waveguide omitted.

As shown in FIG. 3, the support substrate 20 supports the terahertz element 50. The support substrate 20 is formed from an electrically-insulative material, which is, for example, a resin material. An example of the resin material is an epoxy resin.

Figure 4:
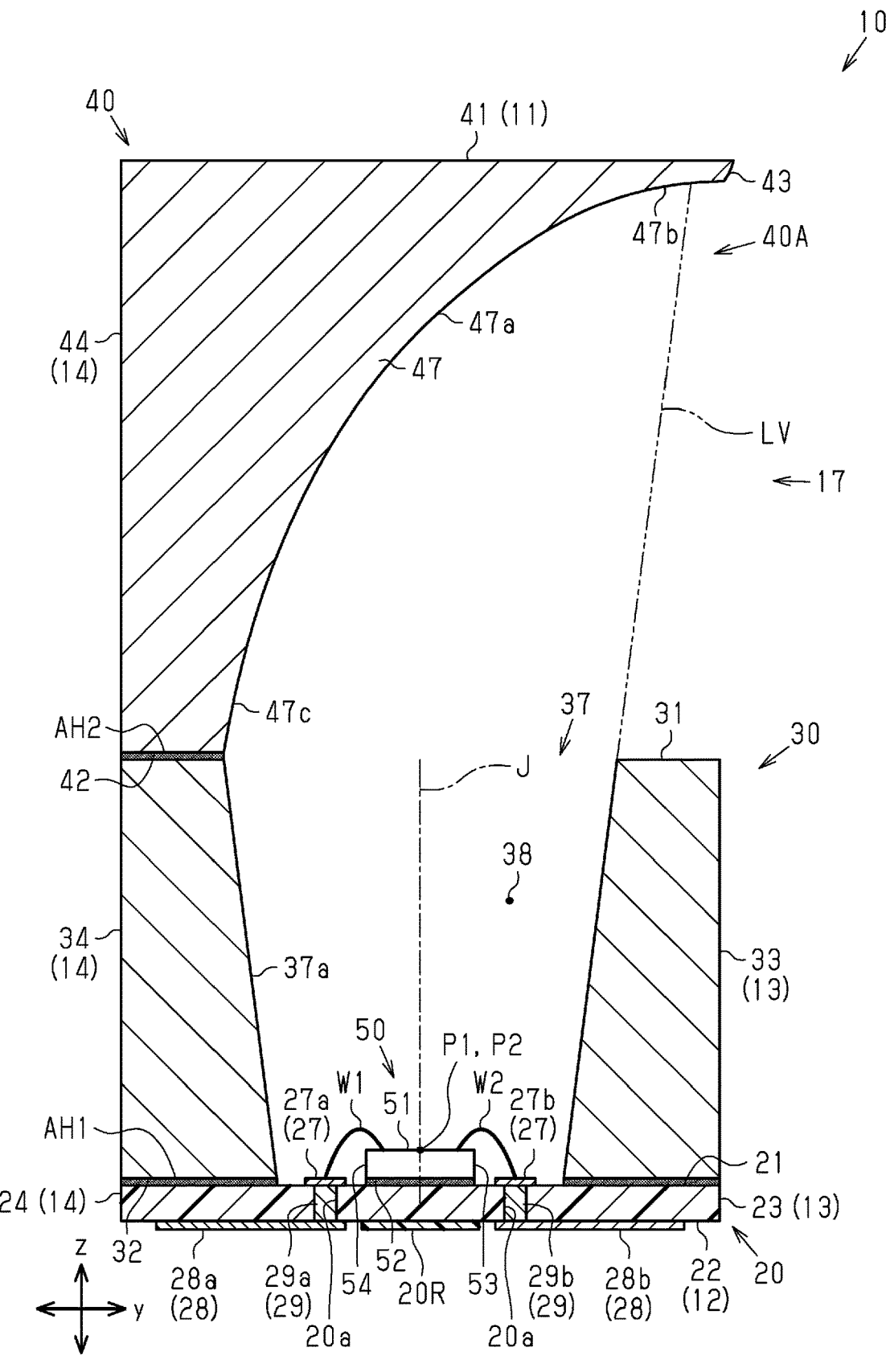
FIG. 4 is an end view showing an end structure of the terahertz device of the first embodiment.

As shown in FIG. 3, in the present embodiment, as viewed in the z-direction, the support substrate 20 is square. As shown in FIGS. 3 and 4, the support substrate 20 includes a substrate main surface 21 and a substrate back surface 22, which face in opposite directions in the z-direction, and four substrate side surfaces 23 to 26, which are disposed between the substrate main surface 21 and the substrate back surface 22 in the z-direction and extend in directions that intersect with the substrate main surface 21 and the substrate back surface 22. In the present embodiment, each of the substrate side surfaces 23 to 26 extends in a direction orthogonal to the substrate main surface 21 and the substrate back surface 22. In the present embodiment, the z-direction also refers to a direction that is orthogonal to both the substrate main surface 21 and the substrate back surface 22.

As shown in FIG. 4, the substrate main surface 21 and the device main surface 11 face in the same direction. The substrate back surface 22 and the device back surface 12 face in the same direction. In the present embodiment, the substrate back surface 22 includes the device back surface 12. As shown in FIG. 3, the substrate side surface 23 and the device side surface 13 face in the same direction. The substrate side surface 24 and the device side surface 14 face in the same direction. The substrate side surface 25 and the device side surface 15 face in the same direction. The substrate side surface 26 and the device side surface 16 face in the same direction. That is, the substrate side surfaces 23 to 26 include part of the device side surfaces 13 to 16. As shown in FIG. 4, the waveguide 30 is stacked on the substrate main surface 21. The terahertz element 50 is mounted on a center of the substrate main surface 21 in the x-direction and the y-direction.

As shown in FIG. 4, the support substrate 20 includes a power supply line 27 that is used as a transmission line connected to the terahertz element 50, an external terminal 28 that is configured to be electrically connected to an electronic device disposed outside the terahertz device 10, and a connection conductor 29 that connects the power supply line 27 and the external terminal 28. The power supply line 27 is formed on the substrate main surface 21 of the support substrate 20. The external terminal 28 is formed on the substrate back surface 22 of the support substrate 20.

In the present embodiment, the power supply line 27 is a coplanar line. Alternatively, the power supply line 27 may be a microstrip line, a stripline, or a slotline. The power supply line 27 is formed of, for example, copper (Cu). The power supply line 27 includes a main conductor 27a and a ground conductor 27b. The main conductor 27a and the ground conductor 27b are disposed at opposite sides of the terahertz element 50 in the x-direction. In an example, as viewed in the z-direction, the main conductor 27a is located closer to the substrate side surface 25 than the terahertz element 50, and the ground conductor 27b is located closer to the substrate side surface 26 than the terahertz element 50. As viewed in the z-direction, the conductors 27a and 27b are strip-shaped and extend in the x-direction. In an example, the conductors 27a and 27b are greater than the terahertz element 50 in dimension in the x-direction.

As viewed in the z-direction, the main conductor 27a and the ground conductor 27b are identical in shape. The main conductor 27a and the ground conductor 27b are aligned with each other in the x-direction and spaced from each other in the y-direction.

Figure 5:
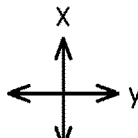
FIG. 5 is a back view of the terahertz device shown in FIG. 1.

The external terminal 28 is formed of, for example, a lamination of a nickel (Ni) layer, a palladium (Pd) layer, and a gold (Au) layer. As shown in FIGS. 4 and 5, the external terminal 28 includes a main terminal 28a and a ground terminal 28b that correspond to the main conductor 27a and the ground conductor 27b, respectively.

As viewed in the z-direction, the main terminal 28a and the ground terminal 28b are identical in shape. The main terminal 28a and the ground terminal 28b are aligned with each other in the x-direction and spaced from each other in the y-direction.

In the present embodiment, as viewed in the z-direction, the main terminal 28a and the ground terminal 28b are greater in area than the main conductor 27a and the ground conductor 27b. More specifically, the main terminal 28a and the ground terminal 28b are greater than the main conductor 27a and the ground conductor 27b in dimension in the x-direction. The main terminal 28a and the ground terminal 28b are greater than the main conductor 27a and the ground conductor 27b in dimension in the y-direction.

The connection conductor 29 is formed of, for example, Cu. As shown in FIG. 4, the connection conductor 29 extends through the support substrate 20. More specifically, through holes 20a extend through portions of the support substrate 20 corresponding to the main conductor 27a and the ground conductor 27b. The through holes 20a extend through the support substrate 20 in the z-direction. The connection conductor 29 is disposed in each through hole 20a. In the present embodiment, as viewed in the z-direction, the through hole 20a is rectangular so that the long sides extend in the x-direction and the short sides extend in the y-direction.

The connection conductor 29 includes a main connection conductor 29a, which connects the main conductor 27a to the main terminal 28a, and a ground connection conductor 29b, which connects the ground conductor 27b to the ground terminal 28b. In the present embodiment, as shown in FIG. 3, as viewed in the z-direction, the connection conductors 29a and 29b are identical in shape to the through holes 20a.

As shown in FIGS. 4 and 5, in the present embodiment, a back insulation layer 20R is formed on the substrate back surface 22 of the support substrate 20. The back insulation layer 20R is a resist layer formed from an electrically-insulative resin material. The back insulation layer 20R is used as a mark that determines the direction in which terahertz device 10 is connected. The back insulation layer 20R is disposed between the main terminal 28a and the ground terminal 28b in the x-direction near the center of the substrate back surface 22 in the x-direction. As viewed in the z-direction, the back insulation layer 20R has the form of a rectangle having a recess at the side of the main terminal 28a. The back insulation layer 20R is formed of a resist film that is applied to the substrate back surface 22 and cured. Alternatively, the back insulation layer 20R may be formed from a liquid resist. The recess of the back insulation layer 20R may be located at the side of the ground terminal 28b. The recess of the back insulation layer 20R may be arranged in any manner that allows for recognition of the direction in which the terahertz device 10 is connected.

As shown in FIG. 3, the terahertz element 50 mounted on the substrate main surface 21 has the form of a rectangular plate. In the present embodiment, as viewed in the z-direction, the terahertz element 50 is, for example, square. However, the shape of the terahertz element 50 as viewed in the z-direction is not limited to a square and may be a rectangle, a circle, an ellipse, or a polygon.

As shown in FIGS. 3 and 4, the terahertz element 50 includes an element main surface 51 and an element back surface 52, which face in opposite directions, and element side surfaces 53 to 56, which are disposed between the element main surface 51 and the element back surface 52 in the z-direction and extend in directions that intersect with the element main surface 51 and the element back surface 52. The thickness-wise direction of the terahertz element 50 is orthogonal to the element main surface 51. The element main surface 51 is formed in the x-y plane. Thus, the z-direction is also referred to as the thickness-wise direction of the terahertz element 50. In the present embodiment, the element back surface 52 is also formed in the x-y plane. Thus, the thickness-wise direction of the terahertz element 50 also refers to a direction that is orthogonal to both the element main surface 51 and the element back surface 52.

The element main surface 51 and the substrate main surface 21 face in the same direction. The element back surface 52 and the substrate back surface 22 face in the same direction. Thus, the terahertz element 50 is mounted on the substrate main surface 21 so that the element back surface 52 and the substrate main surface 21 face each other. In the present embodiment, the terahertz element 50 is mounted on the support substrate 20 when the element back surface 52 is in contact with the substrate main surface 21 or opposed to the substrate main surface 21 via an intermediate layer. An example of the intermediate layer is an adhesive layer.

The terahertz element 50 includes an emission pattern that emits electromagnetic waves in a direction that is orthogonal to both the element main surface 51 and the element back surface 52, that is, the z-direction conforming to the thickness-wise direction of the terahertz element 50. In the present embodiment, the terahertz element 50 emits electromagnetic waves away from the support substrate 20 in the z-direction. The power supply line 27 is formed on the substrate main surface 21 of the support substrate 20. In other words, the power supply line 27 is disposed at a side of the element main surface 51 of the terahertz element 50 opposite to a direction in which the terahertz element 50 emits electromagnetic waves in the z-direction.

In the present embodiment, the element side surfaces 53 to 56 extend in directions that are orthogonal to the element main surface 51 and the element back surface 52. The element side surface 53 and the substrate side surface 23 face in the same direction. The element side surface 54 and the substrate side surface 24 face in the same direction. The element side surface 55 and the substrate side surface 25 face in the same direction. The element side surface 56 and the substrate side surface 26 face in the same direction.

Figure 6:
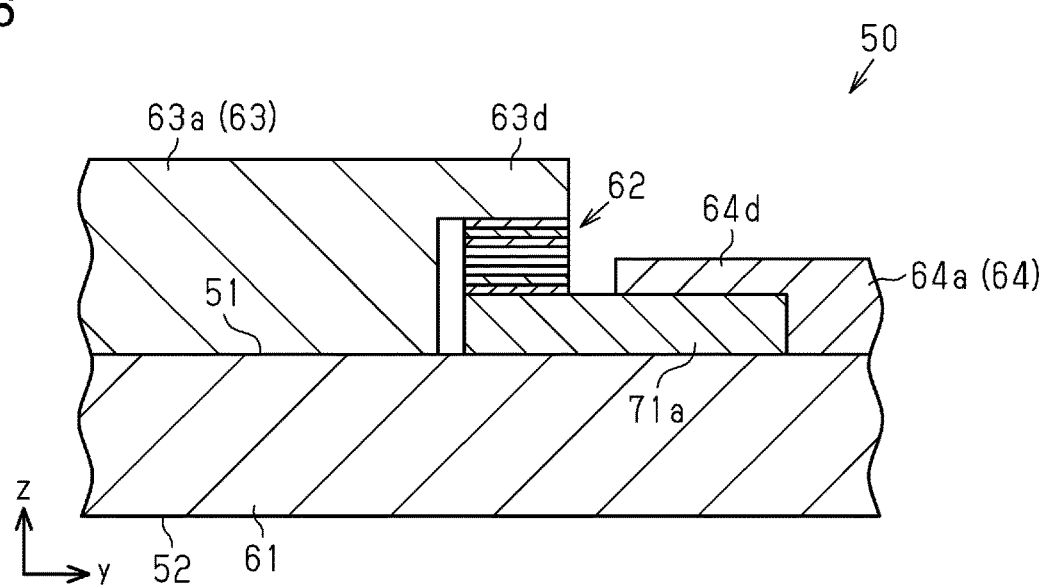
FIG. 6 is a schematic end view of an active element and its surroundings.
Figure 7:
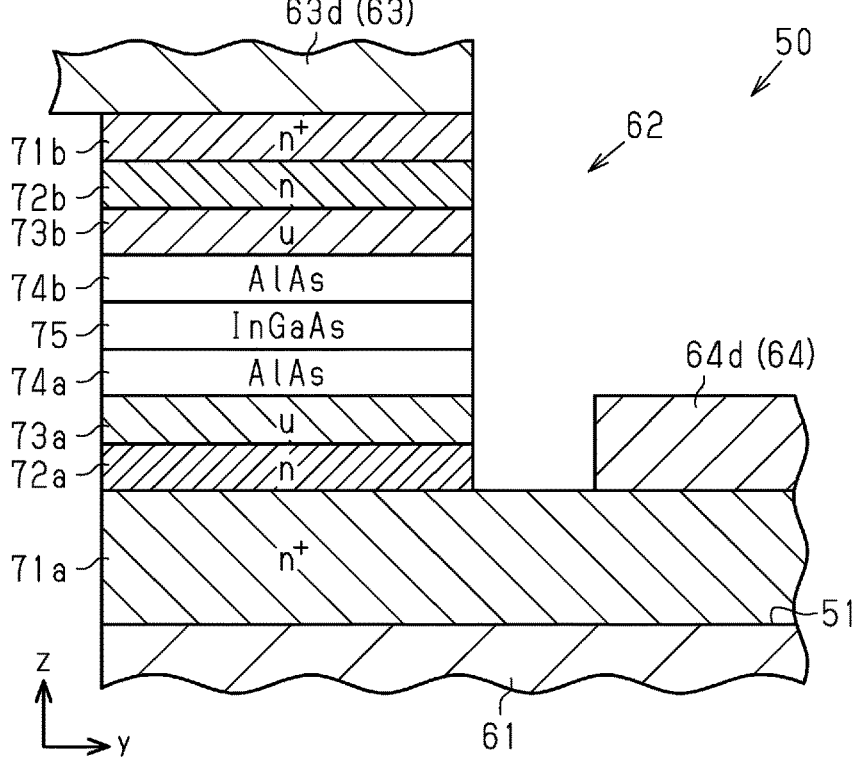
FIG. 7 is an enlarged end view showing an end structure of the active element shown in FIG. 6.

FIGS. 6 and 7 are diagrams showing a detailed structure of an example of the terahertz element 50. FIG. 6 is a schematic cross-sectional view showing an example of the terahertz element 50. FIG. 7 is an enlarged partial view of FIG. 6.

As shown in FIGS. 6 and 7, the terahertz element 50 includes an element substrate 61, an active element 62, a first conductive layer 63, and a second conductive layer 64.

The element substrate 61 is formed of a semiconductor and is semi-insulative. The semiconductor forming the element substrate 61 is, for example, indium phosphide (InP) but may be a semiconductor other than InP. When the element substrate 61 is formed of InP, the refractive index (absolute refractive index) is approximately 3.4. In the present embodiment, the element substrate 61 is rectangular and is, for example, square as viewed in the z-direction. The element main surface 51 and the element back surface 52 are the main surface and the back surface of the element substrate 61. The element side surfaces 53 to 56 are side surfaces of the element substrate 61.

The active element 62 converts electromagnetic waves in the terahertz band and electrical energy to and from each other. The active element 62 is disposed on the element substrate 61. In the present embodiment, the active element 62 is disposed in the center of the element main surface 51. When the active element 62 is connected to an antenna 65, the active element 62 converts supplied electrical energy into electromagnetic waves in the terahertz band. Thus, the terahertz element 50 emits the electromagnetic waves in the terahertz band (terahertz waves). Thus, the active element 62 may be referred to as a generation point P1 that generates terahertz waves. The antenna 65 may be referred to as an emission point P2 that emits terahertz waves. In the present embodiment, the terahertz element 50 includes the emission point P2 in the center of the element main surface 51. In the present embodiment, the emission point P2 and the generation point P1 are located at the same position of the terahertz element 50.

The active element 62 is typically a resonant tunneling diode (RTD). The active element 62 may be, for example, a tunnel injection transit time (TUNNETT) diode, an impact ionization avalanche transit time (IMPATT) diode, a GaAs-base field effect transistor (FET), a GaN-base FET, a high electron mobility transistor (HEMT), or a hetero junction bipolar transistor (HBT).

An example for obtaining the active element 62 will now be described.

A semiconductor layer 71*a* is formed on the element substrate 61. In an example, the semiconductor layer 71*a* is formed of GaInAs. The semiconductor layer 71*a* is doped with an n-type impurity at a high concentration.

A GaInAs layer 72*a* is stacked on the semiconductor layer 71*a*. The GaInAs layer 72*a* is doped with an n-type impurity. In an example, the GaInAs layer 72*a* has a lower impurity concentration than the semiconductor layer 71*a*.

A GaInAs layer 73*a* is stacked on the GaInAs layer 72*a*. The GaInAs layer 73*a* is not doped with impurities.

An AlAs layer 74*a* is stacked on the GaInAs layer 73*a*. An InGaAs layer 75 is stacked on the AlAs layer 74*a*. An AlAs layer 74*b* is stacked on the InGaAs layer 75. The AlAs layer 74*a*, the InGaAs layer 75, and the AlAs layer 74*b* form a resonant tunneling portion.

A GaInAs layer 73*b* is not doped with impurities and is stacked on the AlAs layer 74*b*. A GaInAs layer 72*b* is doped with an n-type impurity and is stacked on the GaInAs layer 73*b*. A GaInAs layer 71*b* is stacked on the GaInAs layer 72*b*. The GaInAs layer 71*b* is doped with an n-type impurity at a high concentration. In an example, the GaInAs layer 71*b* has a higher impurity concentration than the GaInAs layer 72*b*.

The active element 62 may have any specific structure configured to generate (or detect or both generate and detect) electromagnetic waves. In other words, it is sufficient that the active element 62 performs at least one of generation and detection of electromagnetic waves in the terahertz band.

Figure 8:
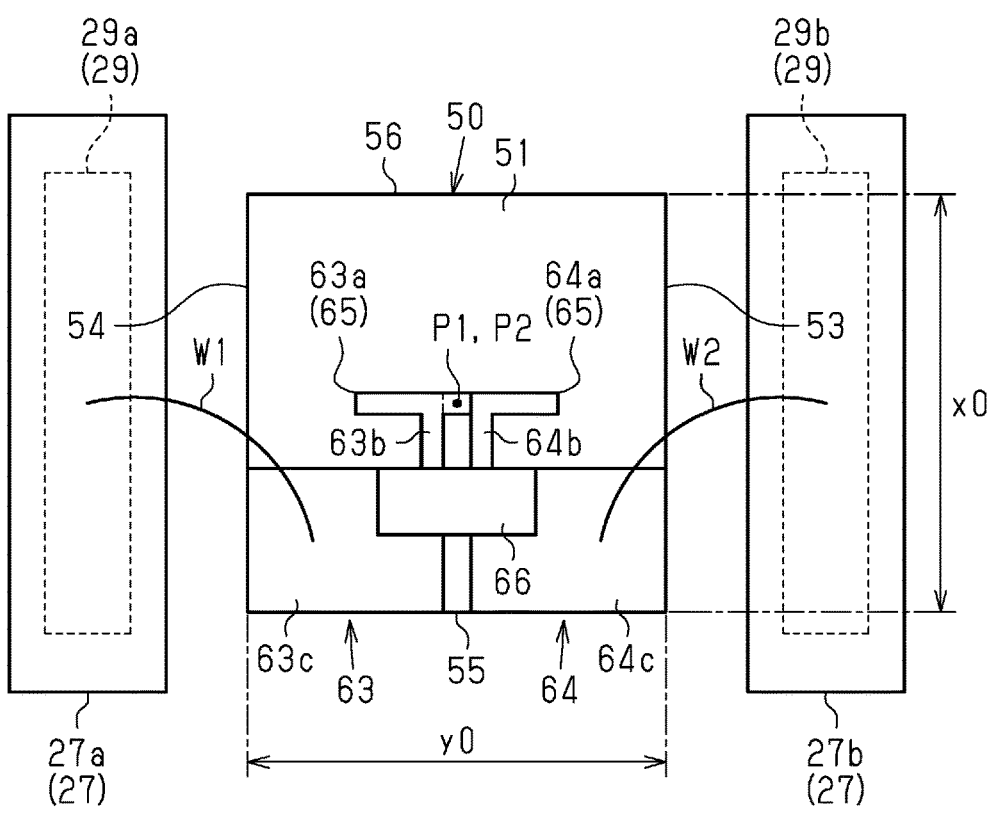
FIG. 8 is an enlarged plan view of the terahertz element and its surroundings.
Figure 8:
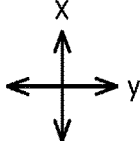

As shown in FIG. 8, the terahertz element 50 includes the generation point P1 that generates electromagnetic waves. The generation point P1 is formed on the element main surface 51. The element main surface 51 that includes the generation point P1 may be referred to as an active surface. Also, the generation point P1 may be referred to as a position on which the active element 62 is disposed.

In the present embodiment, the emission point P2 (the antenna 65) is disposed in the center of the element main surface 51. However, the position of the emission point P2, that is, the position of the antenna 65 on the element main surface 51, is not limited to the center of the element main surface 51 and may be changed in any manner. The position of the generation point P1 (the active element 62) and the emission point P2 does not have to be the same and may be changed in any manner.

As shown in FIG. 8, the first conductive layer 63 and the second conductive layer 64 are formed on the element main surface 51. The first conductive layer 63 and the second conductive layer 64 are insulated from each other. Each of the first conductive layer 63 and the second conductive layer 64 has a structure of stacked metals. In an example, the stacked structure of each of the first conductive layer 63 and the second conductive layer 64 is obtained by stacking Au, Pd and titanium (Ti). In another example, the stacked structure of each of the first conductive layer 63 and the second conductive layer 64 is obtained by stacking Au and Ti. The first conductive layer 63 and the second conductive layer 64 are formed through vacuum vapor deposition, sputtering, or the like.

The first conductive layer 63 includes a first conductive portion 63*a*, a first connection portion 63*b*, and a first pad electrode 63*c*. The second conductive layer 64 includes a second conductive portion 64*a*, a second connection portion 64*b*, and a second pad electrode 64*c*. The first pad electrode 63*c* corresponds to a main electrode. The second pad electrode 64*c* corresponds to a ground electrode.

The first conductive portion 63*a* and the second conductive portion 64*a* extend away from each other from the active element 62 in a direction (the y-direction) that is orthogonal to the element side surfaces 53 and 54 of the terahertz element 50. Thus, the first conductive portion 63*a* and the second conductive portion 64a are parallel to the element side surfaces 55 and 56 of the terahertz element 50.

The first conductive portion 63a and the second conductive portion 64a are used as the antenna 65. In the terahertz element 50, the antenna 65 is integrated at the side of the element main surface 51 by the first conductive portion 63a, which is part of the first conductive layer 63, and the second conductive portion 64a, which is part of the second conductive layer 64. Thus, the terahertz element 50 includes the active element 62, which generates electromagnetic waves having a frequency in the terahertz band, and the antenna 65, which has the emission pattern in a direction orthogonal to the element main surface 51 to emit the electromagnetic waves.

The antenna 65 is, for example, a dipole antenna. The distance between the distal end of the first conductive portion 63a and the distal end of the second conductive portion 64a, that is, the length of the antenna, is one-half of the wavelength (22) of electromagnetic waves emitted by the terahertz element 50. The antenna is not limited to a dipole antenna and may be a different antenna such as a biconical antenna, a slot antenna, a patch antenna, or a loop antenna. The length of the antenna may be changed in accordance with the configuration of the antenna.

The first connection portion 63b extends in the x-direction and connects the first conductive portion 63a to the first pad electrode 63c. The second connection portion 64b extends in the x-direction and connects the second conductive portion 64a to the second pad electrode 64c. The first pad electrode 63c and the second pad electrode 64c are spaced apart in the y-direction and insulated from each other.

In the present embodiment, the terahertz element 50 includes a metal insulator metal (MIM) reflector 66. The MIM reflector 66 has a stacked structure of a metal, an insulator, and a metal. In an example, the MIM reflector 66 is obtained by holding an insulator between part of the first pad electrode 63c and part of the second pad electrode 64c in the thickness-wise direction (z-direction) of the terahertz element 50. The insulator may be, for example, a $SiO_2$ film, a $Si_3N_4$ film, a $HfO_2$ film, or an $Al_2O_3$ film.

The MIM reflector 66 is configured to short-circuit the first conductive layer 63 and the second conductive layer 64 at a high frequency. The MIM reflector 66 reflects high-frequency electromagnetic waves. The MIM reflector 66 serves as a low-pass filter. The MIM reflector 66 is not necessary and may be omitted.

As shown in FIGS. 6 and 7, in the present embodiment, the first conductive portion 63a and the second conductive portion 64a are disposed at opposite sides of the active element 62 in the y-direction. The first conductive portion 63a includes a first connection region 63d that overlaps the active element 62 as viewed in the z-direction. The first connection region 63d is disposed on the GaInAs layer 71b in contact with the GaInAs layer 71b.

As shown in FIG. 6, the semiconductor layer 71a extends toward the second conductive portion 64a further than other layers such as the GaInAs layer 72a in the y-direction. As shown in FIGS. 6 and 7, the second conductive portion 64a includes a second connection region 64d stacked on part of the semiconductor layer 71a where the GaInAs layer 72a and other layers are not stacked. Thus, the active element 62 is electrically connected to the first conductive portion 63a and the second conductive portion 64a. The second connection region 64d is spaced apart from the GaInAs layer 72a and other layers in the y-direction.

Although not shown in FIG. 7, alternatively, a GaInAs layer doped with an n-type impurity at a high concentration may be disposed between the GaInAs layer 71b and the first connection region 63d. This results in satisfactory contact of the first conductive portion 63a with the GaInAs layer 71b.

As shown in FIG. 8, the first pad electrode 63c is electrically connected to the main conductor 27a of the support substrate 20 by a wire W1. The second pad electrode 64c is electrically connected to the ground conductor 27b of the support substrate 20 by a wire W2. Alternatively, the first pad electrode 63c may be connected to the ground conductor 27b, and the second pad electrode 64c may be connected to the main conductor 27a. Each of the wires W1 and W2 may include multiple wires. The number of wires W1 may differ from the number of W2.

In the terahertz element 50, the dimension in the x-direction is referred to as the element dimension x0, and the dimension in the y-direction is referred to as the element dimension y0. The element dimension x0 and the element dimension y0 are set based on a dielectric resonator antenna.

In the present embodiment, the emission point P2 is set in the center of the terahertz element 50. When the distance from the emission point P2 to the element side surface 55 is denoted by x1, the distance x1 is one-half of the element dimension x0. It is preferred that the distance x1 (=x½) is $(\lambda 1/2)+((\lambda 1/2)\times N$, where N is an integer greater than or equal to 0, that is, N=0, 1, 2, 3, . . . ). The effective wavelength of electromagnetic waves that transmit through the terahertz element 50 (element substrate 51) is λ1. When n1 denotes the refractive index of the terahertz element 50 (the element substrate 51), c denotes the speed of light, and fc denotes the center frequency of electromagnetic waves, λ1 is $(1/n1)\times(c/fc)$. In the same manner, when the distance from the emission point P2 to the element side surface 53 is denoted by y1, the distance y1 is one-half of the element dimension y0. It is preferred that y1 (=y½) is $(\lambda 1/2)+((\lambda 1/2)\times N$, where N is an integer greater than or equal to 0, that is, N=0, 1, 2, 3 . . . ). When the distances x1 and y1, that is, the element dimensions x0 and y0, are set as described above, electromagnetic waves emitted from the antenna 65 perform a free end reflection on each of the element side surfaces 53 to 56. Thus, the terahertz element 50 itself is designed as a resonator (primary resonator) of the terahertz device 10.

Each of the element side surfaces 53 to 56 may have a different value of the distance from the emission point P2 as long as the value is obtained by the above equation. In an example, in FIG. 8, the distance from the emission point P2 to the element side surface 53 may differ from the distance from the emission point P2 to the element side surface 54. The distance from the emission point P2 to the element side surface 55 may differ from the distance from the emission point P2 to the element side surface 56.

As shown in FIGS. 1, 2, and 4, the waveguide 30 is a hollow metal pipe that allows for transmission of electromagnetic waves. The waveguide 30 is formed from a conductive material that is non-transmissive to electromagnetic waves that are emitted from or received by the terahertz element 50. Such a material may be Cu, a Cu alloy, Al, or an Al alloy.

As shown in FIG. 2, in the present embodiment, as viewed in the z-direction, the waveguide 30 is square. As shown in FIGS. 2 and 4, the waveguide 30 includes a pipe main surface 31 and a pipe back surface 32, which face in opposite directions in the z-direction, and four pipe side surfaces 33 to 36, which are disposed between the pipe main surface 31 and the pipe back surface 32 in the z-direction and extend in directions that intersect with the pipe main surface 31 and the pipe back surface 32. In the present embodiment, each of the pipe side surfaces 33 to 36 extends in a direction orthogonal to the pipe main surface 31 and the pipe back surface 32.

As shown in FIGS. 2 and 3, the pipe side surface 33 and the substrate side surface 23 face in the same direction. The pipe side surface 34 and the substrate side surface 24 face in the same direction. The pipe side surface 35 and the substrate side surface 25 face in the same direction. The pipe side surface 36 and the substrate side surface 26 face in the same direction. In the present embodiment, the pipe side surface 33 is flush with the substrate side surface 23. The pipe side surface 34 is flush with the substrate side surface 24. The pipe side surface 35 is flush with the substrate side surface 25. The pipe side surface 36 is flush with the substrate side surface 26. Thus, the pipe side surface 33 includes part of the device side surface 13. The pipe side surface 34 includes part of the device side surface 14. The pipe side surface 35 includes part of the device side surface 15. The pipe side surface 36 includes part of the device side surface 16.

As shown in FIG. 4, the waveguide 30 is mounted on the substrate main surface 21 of the support substrate 20 and accommodates the terahertz element 50. More specifically, the waveguide 30 is mounted on the substrate main surface 21 via a first adhesive layer AH1.

The waveguide 30 has a through hole 37 extending through the waveguide 30 in the z-direction. As shown in FIG. 2, as viewed in the z-direction, the through hole 37 is circular. As shown in FIG. 4, the through hole 37 is formed so that the diameter is increased from the pipe back surface 32 toward the pipe main surface 31. In other words, the through hole 37 is defined by a tapered surface 37a having a diameter that is increased as the tapered surface 37a extends away from the support substrate 20, that is, the terahertz element 50, in the z-direction.

The shape of the through hole 37 as viewed in the z-direction may be changed in any manner. In an example, the shape of the through hole 37 as viewed in the z-direction may be a tetragon, a polygon having five or more sides, an ellipse, or an oblong circle (the form of an athletic track).

The through hole 37 serves as a transmission region 38 through which electromagnetic waves transmit. The transmission region 38 is defined by the tapered surface 37a defining the through hole 37. In the present embodiment, the transmission region 38 is circular as viewed in the z-direction. Thus, in the present embodiment, the waveguide 30 is a circular waveguide.

When the waveguide 30 is mounted on the support substrate 20, one side of the through hole 37 in the z-direction, that is, one side of the transmission region 38 in the z-direction, is closed. The waveguide 30 is mounted on the support substrate 20 (the terahertz element 50) so that an axis J of the waveguide 30 coincides with the emission point P2 of the terahertz element 50. The axis J of the waveguide 30 is an imaginary axis that extends through the center of the through hole 37 in the z-direction as viewed in the z-direction. Thus, the waveguide 30 accommodates the terahertz element 50. More specifically, the terahertz element 50 is disposed in the transmission region 38.

In the present embodiment, the waveguide 30, the support substrate 20, and the terahertz element 50 are disposed so that the emission direction in which the terahertz element 50 emits electromagnetic waves is parallel to the axis J of the waveguide 30. Thus, the terahertz element 50 is efficiently coupled to the waveguide 30.

The reflector 40 is a reflection member that reflects electromagnetic waves emitted from the terahertz element 50 in a direction intersecting the emission direction of the electromagnetic waves. More specifically, the reflector 40 is a reflection member that reflects electromagnetic waves, which are transmitted from the terahertz element 50 through the waveguide 30, in a predetermined direction. In an example, the reflector 40 includes a horn reflector antenna. In the present embodiment, the reflector 40 is formed from a metal material. The metal material may be, for example, Cu, a Cu alloy, aluminum (Al), or an Al alloy.

The reflector 40 includes an opening 40A that is open at one side in the y-direction, which corresponds to the above predetermined direction. More specifically, the opening 40A is open toward the device side surface 13. In other words, the opening 40A is open in a direction intersecting the thickness-wise direction of the terahertz element 50. More specifically, the opening 40A is open in a direction orthogonal to the thickness-wise direction of the terahertz element 50. In the present embodiment, the opening 40A is also open toward the device back surface 12 in the z-direction.

Figure 10:
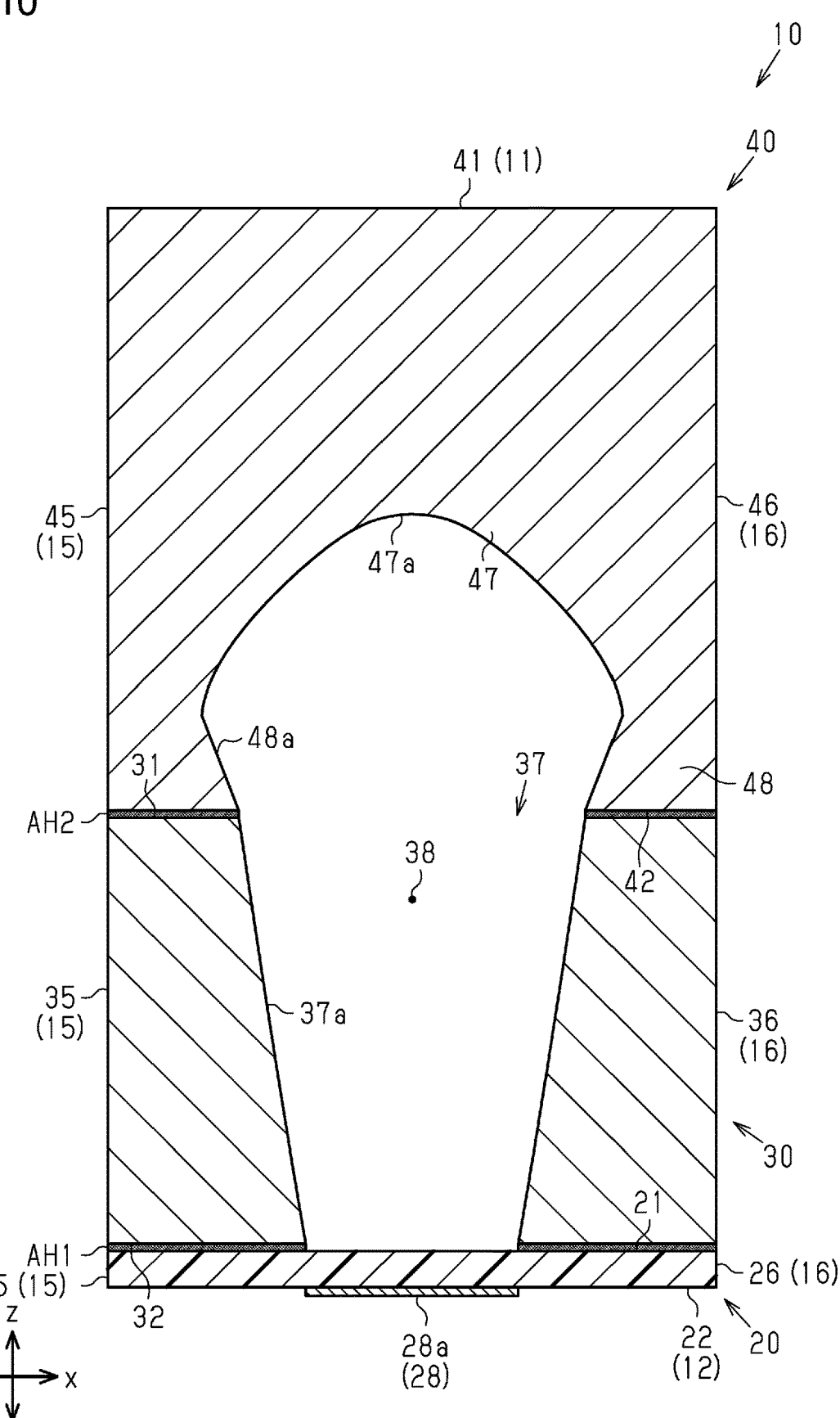
FIG. 10 is an end view showing an end structure of the terahertz device of the first embodiment as viewed in a direction differing from that of FIG. 4.

As shown in FIGS. 4 and 10, the reflector 40 includes a main surface 41 and a back surface 42, which face in the opposite directions in the z-direction, and side surfaces 43 to 46, which are disposed between the main surface 41 and the back surface 42 in the z-direction and extend in directions intersecting the main surface 41 and the back surface 42.

The main surface 41 and the pipe main surface 31 face in the same direction. The back surface 42 and the pipe back surface 32 face in the same direction. The main surface 41 includes the device main surface 11. The side surface 43 and the pipe side surface 33 face in the same direction. The side surface 44 and the pipe side surface 34 face in the same direction. The side surface 45 and the pipe side surface 35 face in the same direction. The side surface 46 and the pipe side surface 36 face in the same direction. In the present embodiment, the side surface 44 is flush with the pipe side surface 34. The side surface 45 is flush with the pipe side surface 35. The side surface 46 is flush with the pipe side surface 36. Thus, the side surface 44 includes part of the device side surface 14. The side surface 45 includes part of the device side surface 15. The side surface 46 includes part of the device side surface 16. The device side surface 13 includes the substrate side surface 23, the pipe side surface 33, and the side surface 43. The device side surface 14 includes the substrate side surface 24, the pipe side surface 34, and the side surface 44. The device side surface 15 includes the substrate side surface 25, the pipe side surface 35, and the side surface 45. The device side surface 16 includes the substrate side surface 26, the pipe side surface 36, and the side surface 46.

The side surface 43 is joined to the main surface 41 in the z-direction and spaced apart from the back surface 42 in the z-direction. Each of the side surfaces 44 to 46 includes a portion that joins the main surface 41 and the back surface 42 in the z-direction. The entirety of the side surface 44 joins the main surface 41 and the back surface 42 in the z-direction. Each of the side surfaces 45 and 46 includes a portion located close to the side surface 44 in the y-direction and joining the main surface 41 and the back surface 42 in the z-direction. Each of the side surfaces 45 and 46 includes a portion located close to the side surface 43 in the y-direction and having an inclined surface. The inclined surface is inclined toward the main surface 41 in the z-direction as the side surface 43 becomes closer in the y-direction. Thus, the portions of the side surfaces 45 and 46 located close to the side surface 43 in the y-direction are open in the x-direction.

The opening in the reflector 40 toward the device side surface 13 may be referred to as a device opening 17 formed in the device side surface 13. The device opening 17 is open in a direction intersecting the thickness-wise direction of the terahertz element 50. In the present embodiment, the device opening 17 is open in a direction orthogonal to the thickness-wise direction of the terahertz element 50. In the present embodiment, the device opening 17 is defined by the reflector 40 and the waveguide 30. When the terahertz element 50 performs oscillation, the device opening 17 may be referred as an outlet through which the electromagnetic waves emitted from the terahertz element 50 exit. In the present embodiment, the device opening 17 is also open in the portions of the device side surfaces 15 and 16 located close to the device side surface 13. Thus, in the present embodiment, the device opening 17 is open in opposite directions in the x-direction. As described above, the device opening 17 may have any shape as long as the portion opposed to the terahertz element 50 in the thickness-wise direction of the terahertz element 50 is not open in the thickness-wise direction of the terahertz element 50. In other words, the device opening 17 may have any structure that allows electromagnetic waves, which are emitted from the terahertz element 50 and reflected on a reflection surface 47a of the reflector 40, to exit the terahertz device 10 in a propagation direction of the electromagnetic waves. The reflection surface 47a will be described later.

The reflector 40 and the support substrate 20 are mounted on opposite sides of the waveguide 30. More specifically, the reflector 40 is attached to the waveguide 30 by a second adhesive layer AH2. The back surface 42 of the reflector 40 and the pipe main surface 31 of the waveguide 30 face each other in the z-direction. The second adhesive layer AH2 is disposed between the back surface 42 and the pipe main surface 31. In the present embodiment, the back surface 42 is formed to extend along three sides, namely, the device side surfaces 14 to 16.

The reflector 40 includes a reflection portion 47 that reflects electromagnetic waves emitted from the terahertz element 50 in a direction intersecting the emission direction of the electromagnetic waves. As shown in FIG. 4, in the y-direction, the reflection portion 47 includes a recessed curved surface that is curved from the side surface 44 toward the side surface 43 as the recessed curved surface extends from the back surface 42 toward the surface 41, defining the reflection surface 47a. As shown in FIG. 10, in the x-direction, the reflection surface 47a is a recessed curved surface that is curved toward the back surface 42 as the reflection surface 47a extends outward from the center of the reflector 40 in the x-direction. Thus, the reflector 40 includes the reflection surface 47a that reflects electromagnetic waves emitted from the terahertz element 50 in a direction intersecting the emission direction (z-direction) of the electromagnetic waves.

The reflection surface 47a includes an end located at the side surface 43 of the reflector 40 defining a distal end 47b. The reflection surface 47a includes an end located at the back surface 42 of the reflector 40 defining a basal end 47c. In the present embodiment, the opening 40A of the reflector 40 is defined by the distal end 47b. The device opening 17 is defined by the distal end 47b and the pipe main surface 31 of the waveguide 30. In other words, the device opening 17 is a region between the distal end 47b and the pipe main surface 31 of the waveguide 30.

In an example, when the reflection surface 47a of the reflection portion 47 is aspherical, in the cross-sectional view of the reflector 40 shown in FIG. 4, the reflection surface 47a of the reflection portion 47 may be set to satisfy $y=z^2/4f$ as y and z coordinates on the y-z plane specified in the z-direction and the y-direction. The coordinate in the y-direction is denoted by y. The coordinate in the z-direction is denoted by z. In FIG. 4, the edge of the reflection surface 47a that is in contact with the back surface 42 is the origin of the y and z coordinates, and f denotes the distance between the portion (the basal end 47c) of the reflection surface 47a located closest to the device side surface 14 and the emission point P2 of the terahertz element 50 in a direction orthogonal to the z-direction. The z-direction may be referred to as the thickness-wise direction of the terahertz element 50. The y-direction may be referred to as a direction in which electromagnetic waves emitted from the terahertz element 50 are reflected toward the reflection surface 47a orthogonal to the thickness-wise direction of the terahertz element 50. In the present embodiment, the reflection surface 47a has the form of a paraboloid of revolution. More specifically, the reflection surface 47a is obtained by rotation about a straight line extending from the origin of the y and z coordinates in the y-direction and serving as a rotational axis.

As shown in FIGS. 4 and 10, the reflection surface 47a is spaced apart and opposed to the element main surface 51 of the terahertz element 50 in the z-direction. The reflection surface 47a is disposed to cover the terahertz element 50 in the z-direction. The reflection surface 47a is disposed to cover the transmission region 38 in the z-direction. More specifically, as shown in FIG. 4, in the y-direction, the reflection surface 47a is disposed to cover the entirety of the terahertz element 50 and the entirety of the transmission region 38 from the z-direction. The maximum value of the dimension of the reflection surface 47a in the y-direction is greater than the maximum value of the dimension of the through hole 37 of the waveguide 30 in the y-direction. As shown in FIG. 10, in the x-direction, the reflection surface 47a is disposed to cover the entirety of the terahertz element 50 (refer to FIG. 4) and the entirety of the transmission region 38 in the z-direction. The maximum value of the dimension of the reflection surface 47a in the x-direction is greater than the maximum value of the dimension of the through hole 37 in the x-direction.

As shown in FIG. 4, as viewed in the z-direction, the reflection surface 47a covers the entire region of the waveguide 30 extending from the tapered surface 37a along the tapered surface 37a in the z-direction. In the present embodiment, as shown in FIG. 4, the distal end 47b of the reflection surface 47a extends to a position that intersects an imaginary line LV that extends along the tapered surface 37a in the z-direction from a portion of the tapered surface 37a of the through hole 37 in the waveguide 30 corresponding to the pipe side surface 33.

The basal end 47c of the reflection surface 47a is connected to the back surface 42. Thus, the basal end 47c of the reflection surface 47a is joined to the pipe main surface 31 of the waveguide 30 (the wall surface of the through hole 37) by the second adhesive layer AH2. The position of the basal end 47c of the reflection surface 47a, in a direction orthogonal to the z-direction, is the same as the position of an open rim of the pipe main surface 31 in the through hole 37 of the waveguide 30 or is located at an outer side of the open rim as viewed in the z-direction.

As shown in FIG. 4, when electromagnetic waves are emitted from the emission point P2 of the terahertz element 50 toward the reflection portion 47 in the z-direction as spherical waves and are transmitted via the transmission region 38, the electromagnetic waves are reflected on the reflection surface 47a in a direction (toward device side surface 13) intersecting the emission direction (the z-direction) of electromagnetic waves of the terahertz element 50. The electromagnetic waves reflected on the reflection surface 47a changes from the spherical waves into plane waves and are emitted from the device opening 17 to the outside of the terahertz device 10.

Figure 9:
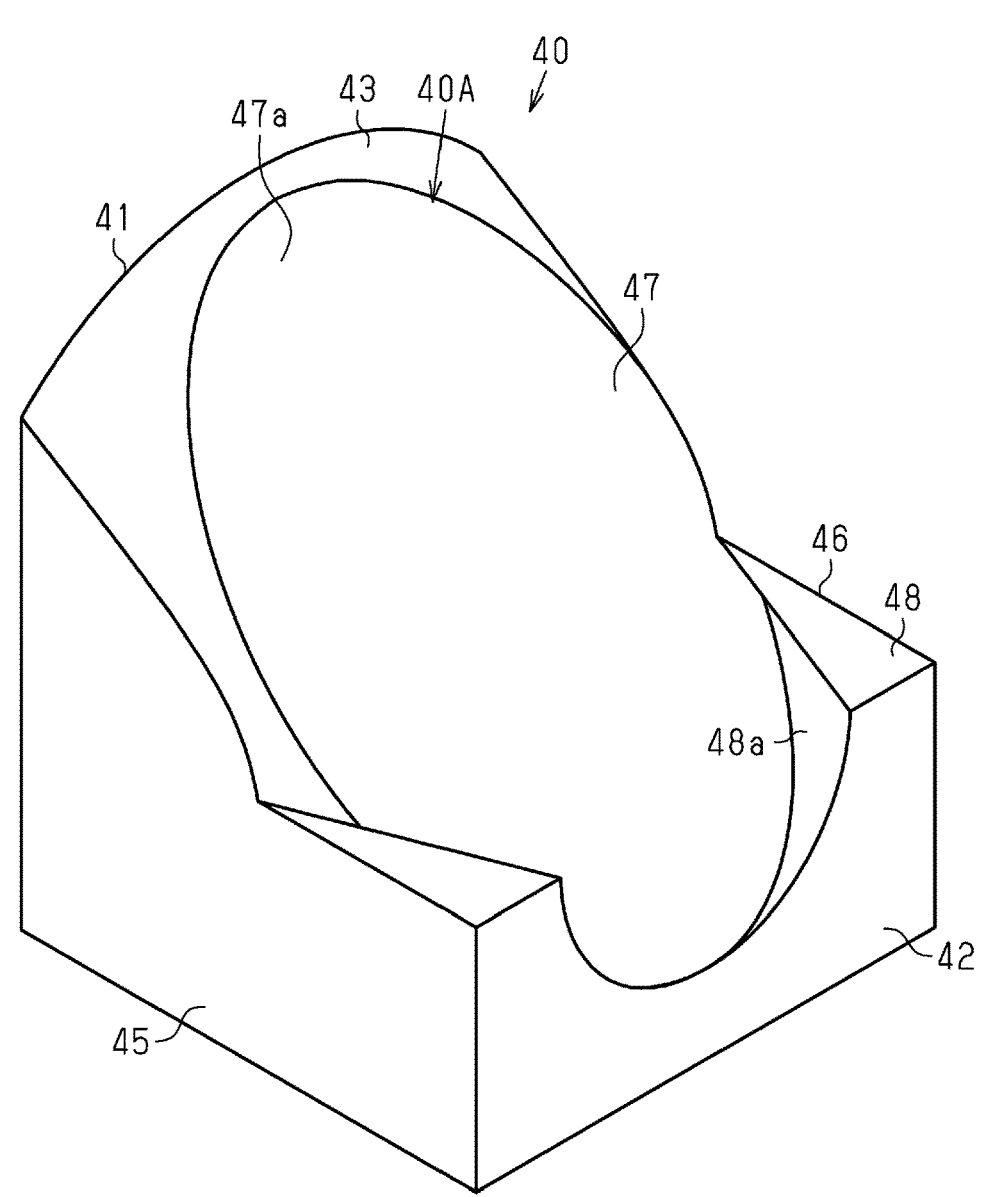
FIG. 9 is a perspective view of the reflector.
Figure 9:
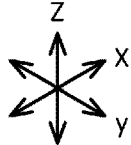

As shown in FIGS. 9 and 10, the reflector 40 includes a bonding portion 48 that is bonded to the waveguide 30 by the second adhesive layer AH2. The bonding portion 48 includes an inner surface 48a including the back surface 42 of the reflector 40 and joined to the reflection surface 47a. As shown in FIG. 9, the inner surface 48a is curved. As shown in FIG. 10, the inner surface 48a is tapered so that the diameter increases from the back surface 42 of the reflector 40 toward the main surface 41. As viewed in the z-direction, the inner surface 48a is disposed at the same position as the open rim of the pipe main surface 31 in the through hole 37 of the waveguide 30 or at an outer side of the open rim in a direction orthogonal to the z-direction.

Operation

Figure 11:
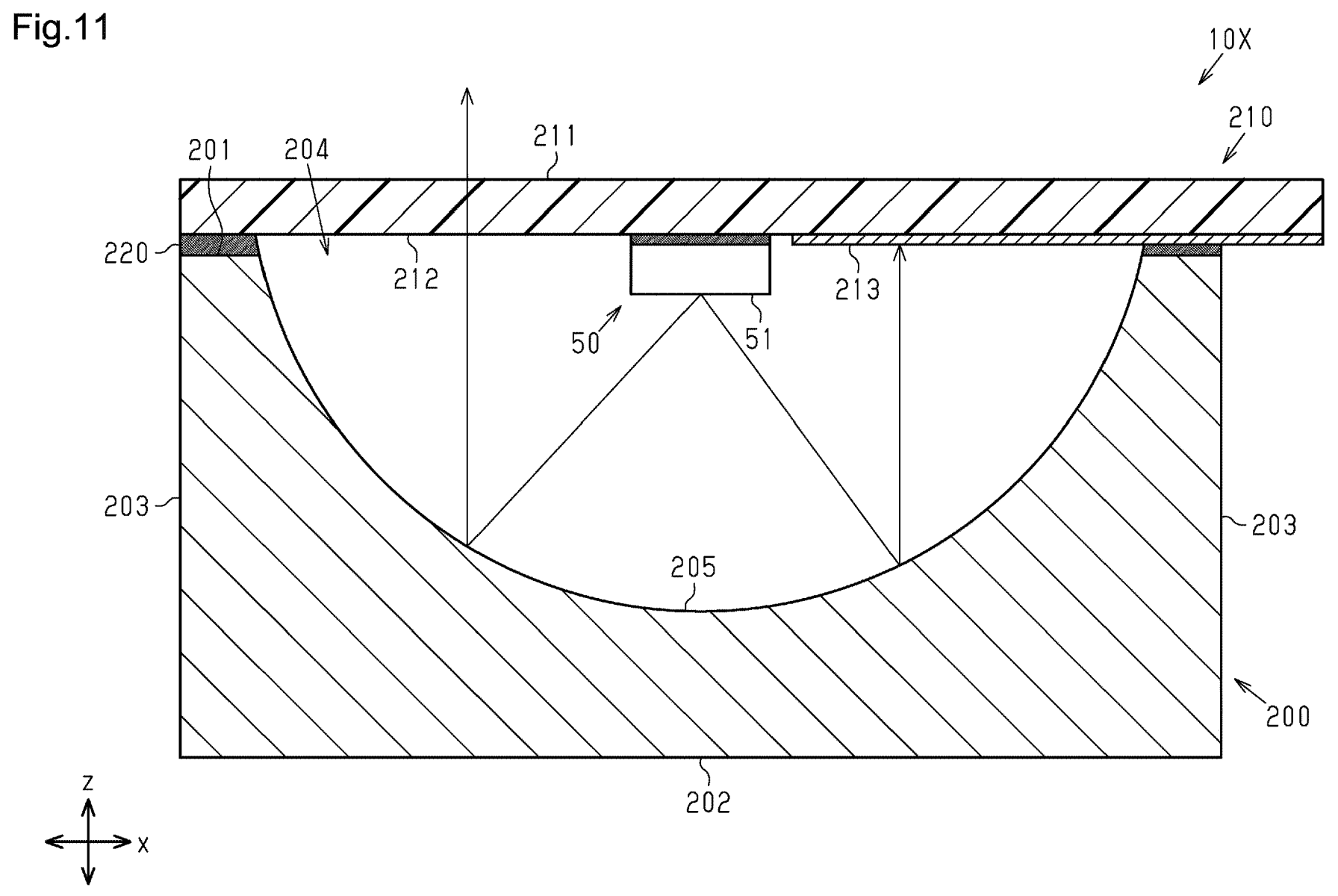

The operation of the terahertz device 10 of the present embodiment will now be described with reference to FIGS. 4 and 11. FIG. 11 is a cross-sectional view of a comparative example of a terahertz device 10X when the terahertz device 10X is cut along a plane extending in the z-direction and the x-direction.

As shown in FIG. 11, the terahertz device 10X includes an antenna base 200, a support substrate 210, and the terahertz element 50 mounted on the support substrate 210. The antenna base 200 is formed from a conductive material that is non-transmissive to electromagnetic waves and is formed from, for example, Cu or Al. The antenna base 200 includes a base main surface 201 and a base back surface 202, which face in opposite directions in the z-direction, and four base side surfaces 203, which are disposed between the base main surface 201 and the base back surface 202 and extend in directions orthogonal to the base main surface 201 and the base back surface 202.

The antenna base 200 includes a concaved portion 204 that is spherically recessed from the base main surface 201 toward the base back surface 202. The surface of the concaved portion 204 includes a reflection surface 205 that reflects electromagnetic waves.

In an example, the support substrate 210 is rectangular and is mounted on the base main surface 201 of the antenna base 200 by an adhesive layer 220. The support substrate 210 includes a substrate main surface 211 and a substrate back surface 212 facing in opposite directions in the z-direction. The substrate main surface 211 and the base main surface 201 face in the same direction. The substrate back surface 212 and the base back surface 202 face in the same direction. The support substrate 210 projects from one side of the base side surfaces 203 in the x-direction.

The support substrate 210 is formed from a material that is transmissive to electromagnetic waves. The terahertz element 50 is mounted on the substrate back surface 212.

The terahertz element 50 is mounted on the substrate back surface 212 so that the element main surface 51 and the substrate back surface 212 face in the same direction and the element back surface 52 and the substrate main surface 211 face in the same direction. As shown in FIG. 11, the terahertz element 50 is disposed in the concaved portion 204 of the antenna base 200. The terahertz element 50, which is configured to generate and emit electromagnetic waves in the terahertz band, emits electromagnetic waves toward the concaved portion 204.

A power supply line 213 is formed on the substrate back surface 212 of the support substrate 210. The power supply line 213 is formed of, for example, Cu. Thus, the power supply line 213 is formed of a conductive material that is non-transmissive to electromagnetic waves. The power supply line 213 projects from one side of the base side surfaces 203 in the x-direction and is connected to an external terminal or a connector, which is not shown in the drawings.

In the terahertz device 10X of the comparative example, when electromagnetic waves are emitted from the terahertz element 50, the emitted electromagnetic waves are reflected on the reflection surface 205 and emitted to the outside of the terahertz device 10X as electromagnetic waves propagating in the z-direction. Thus, the electromagnetic waves have directivity.

However, in the terahertz device 10X of the comparative example, when electromagnetic waves are emitted from the terahertz element 50 and reflected on the reflection surface 205, the reflected electromagnetic waves may partially strike the power supply line 213 and fail to exit the terahertz device 10X. Since the power supply line 213 is disposed on the path through which the electromagnetic waves are emitted from the inside of the terahertz device 10X to the outside, the electromagnetic waves are blocked by the power supply line 213.

To solve such shortcomings, in the present embodiment, as shown in FIG. 4, the terahertz element 50 is mounted on the substrate main surface 21 of the support substrate 20, on which the power supply line 27 is formed. Thus, the element main surface 51 of the terahertz element 50 is located closer to the reflector 40 than the power supply line 27 is to the reflector 40, in the z-direction. In other words, the power supply line 27 is formed at a side of the element main surface 51 of the terahertz element 50 opposite to the emission direction of the electromagnetic waves. That is, the power supply line 27 is not disposed on the path through which electromagnetic waves are emitted from the inside of the terahertz device 10 to the outside. When the power supply line 27 is not disposed on the path through which electromagnetic waves are emitted from the inside of the terahertz device 10 to the outside, the blocking of electromagnetic waves by the power supply line 27 is avoided.

In addition, the terahertz device 10 includes the reflector 40 including the reflection surface 47a that covers the element main surface 51 of the terahertz element 50 in the z-direction. In other words, the reflection surface 47a covers the element main surface 51 of the terahertz element 50 in the emission direction of the electromagnetic waves from the terahertz element 50. The electromagnetic waves emitted from the terahertz element 50 are reflected on the reflection surface 47a and exits the terahertz device 10 in a direction orthogonal to the z-direction. This increases the directivity of electromagnetic waves in a direction that intersects the thickness-wise direction of the terahertz element 50.

Effects

The terahertz device 10 of the present embodiment has the following advantages.

(1-1) The terahertz device 10 includes the terahertz element 50 and the reflector 40. The terahertz element 50 includes the element main surface 51 and the element back surface 52, which face in opposite directions, and emits electromagnetic waves in the terahertz band. The reflector 40 includes the reflection surface 47a. The reflection surface 47a is spaced apart and opposed to the element main surface 51 in the z-direction and is configured to reflect electromagnetic waves emitted from the terahertz element 50 in a direction (the z-direction) that intersects the thickness-wise direction of the terahertz element 50.

In this structure, the reflection surface 47a of the reflector 40 is spaced apart and opposed to the element main surface 51 in the emission direction of electromagnetic waves from the terahertz element 50. Thus, the electromagnetic waves emitted from the terahertz element 50 in the thickness-wise direction (the z-direction) of the terahertz element 50 are reflected on the reflection surface 47a and propagated in a direction (in the present embodiment, the y-direction) that intersects the thickness-wise direction of the terahertz element 50. This increases the directivity of electromagnetic waves in the direction intersecting the thickness-wise direction of the terahertz element 50. Thus, antenna gain is improved.

(1-2) The terahertz device 10 includes the support substrate 20 including the substrate main surface 21. The terahertz element 50 is mounted on the substrate main surface 21 so that the element main surface 51 and the substrate main surface 21 face in the same direction. The power supply line 27 is arranged on the substrate main surface 21 and is electrically connected to the terahertz element 50.

With this structure, the power supply line 27 is disposed at a side of the element main surface 51 of the terahertz element 50 opposite to the direction in which electromagnetic waves are emitted. Thus, the blocking of electromagnetic waves emitted from the element main surface 51 of the terahertz element 50 by the power supply line 27 is avoided. The terahertz device 10 of the present embodiment improves antenna gain while avoiding the blocking that is caused by the power supply line 27.

(1-3) In the terahertz element 50, the element main surface 51 includes the generation point P1, which generates electromagnetic waves, and the emission point P2. In this structure, the terahertz element 50 is disposed in the transmission region 38. Thus, both the generation point P1 and the emission point P2 are disposed in the transmission region 38. Thus, the terahertz device 10 obtains a strong coupling of the terahertz element 50 to the waveguide 30 as compared to a structure that generates electromagnetic waves by transmitting a high frequency signal from an oscillation element disposed outside the transmission region 38 through a transmission line to an antenna disposed in the transmission region.

(1-4) The shape of the reflection surface 47a of the reflector 40 may be set in accordance with y=z²/4f, where in the z-direction, f is the distance in the y-direction between the basal end 47c of the reflection surface 47a and the emission point P2 of the terahertz element 50. In this structure, when the terahertz element 50 emits electromagnetic waves, the electromagnetic waves are reflected on the reflection surface 47a in a direction intersecting the thickness-wise direction of the terahertz element 50. This increases the directivity of electromagnetic waves in a direction intersecting the thickness-wise direction of the terahertz element 50.

(1-5) The reflection surface 47a of the reflector 40 includes a paraboloid of revolution. In this structure, when the terahertz element 50 emits electromagnetic waves, the electromagnetic waves are reflected on the reflection surface 47a in a direction intersecting the thickness-wise direction of the terahertz element 50. This increases the directivity of electromagnetic waves in a direction intersecting the thickness-wise direction of the terahertz element 50.

(1-6) The terahertz device 10 includes the waveguide 30 including the transmission region 38 through which electromagnetic waves transmit. The terahertz element 50 is disposed in the transmission region 38. The reflector 40 is disposed on the waveguide 30 so that the reflector 40 and the support substrate 20 are located at opposite sides of the waveguide 30. In this structure, all of the electromagnetic waves emitted from the terahertz element 50 toward the reflector 40 are directed by the waveguide 30 toward the reflection surface 47a of the reflector 40. This increases antenna gain.

(1-7) The reflector 40 and the waveguide 30 are separately provided. This structure allows the reflector 40 to be attached to a waveguide of a conventional terahertz device that includes, for example, a support substrate, a terahertz element mounted on the support substrate, and the waveguide having a transmission region that accommodates the terahertz element.

(1-8) As viewed in the z-direction, the reflection surface 47a of the reflector 40 covers the entirety of the through hole 37 of the waveguide 30. This structure increases the probability of reflection of electromagnetic waves, which are transmitted from the terahertz element 50 through the transmission region 38 formed in the through hole 37, on the reflection surface 47a. This increases the directivity of electromagnetic waves emitted from the terahertz device 10 through the device opening 17 in a direction that intersects the thickness-wise direction of the terahertz element 50, thereby improving antenna gain.

(1-9) The distal end 47b of the reflection surface 47a of the reflector 40 is disposed so as to intersect the imaginary line LV, which extends from the tapered surface 37a of the through hole 37 in the waveguide 30. This structure further increases the probability of reflection of electromagnetic waves, which are transmitted from the terahertz element 50 through the transmission region 38 formed in the through hole 37, on the reflection surface 47a. This further increases the directivity of electromagnetic waves emitted from the terahertz device 10 through the device opening 17 in a direction that intersects the thickness-wise direction of the terahertz element 50, thereby improving antenna gain.

(1-10) The external terminal 28 is disposed on the substrate back surface 22 of the support substrate 20 and is electrically connected to the terahertz element 50. In this structure, when the terahertz device 10 is mounted on a circuit substrate, the terahertz device 10 may be flip-chip-mounted on the circuit substrate.

(1-11) The terahertz element 50 is disposed so that the emission point P2 is located in the center of the transmission region 38. This structure further facilitates direct emission of electromagnetic waves from the terahertz element 50 into the transmission region 38 of the waveguide 30. Thus, a strong coupling is obtained between the waveguide 30 and the terahertz element 50.

(1-12) The terahertz element 50 includes the element main surface 51 and the element back surface 52 and includes an emission pattern that emits electromagnetic waves in a direction orthogonal to the element main surface 51 and the element back surface 52. The terahertz element 50 is disposed with respect to the waveguide 30 so that the emission direction of electromagnetic waves in the terahertz element 50 is parallel to the axis J of the waveguide 30. This structure efficiently couples the terahertz element 50 to the waveguide 30.

(1-13) As viewed in the z-direction, the back surface 42 of the reflector 40 is disposed at the same position as the wall surface of the pipe main surface 31 defining the opening of the through hole 37 in the waveguide 30 or at an outer side of the wall surface. In this structure, when electromagnetic waves are emitted from the terahertz element 50, reflection of the electromagnetic waves on the back surface 42 of the reflector 40 is avoided. This facilitates propagation of electromagnetic waves emitted from the terahertz element 50 toward the reflection surface 47a.

(1-14) The reflector 40 is formed of a conductive material that is non-transmissive to electromagnetic waves. In this structure, the reflector 40, which is a single component, serves to reflect electromagnetic waves from the terahertz element 50.

(1-15) The inner surface 48a of the bonding portion 48 of the reflector 40 includes a curved surface the diameter of which increases from the back surface 42 of the reflector 40 toward the main surface 41. This structure limits a strike of electromagnetic waves from the terahertz element 50 against the inner surface 48a of the bonding portion 48. This reduces situations in which electromagnetic waves are reflected on the inner surface 48a and strike the reflection surface 47a at an unexpected incident angle. Thus, the electromagnetic waves from the terahertz element 50 reflect on the reflection surface 47a and readily change into plane waves directed from the device opening 17 in the y-direction.

Second Embodiment

A second embodiment of a terahertz device 10 will now be described with reference to FIGS. 12 to 17. The present embodiment of the terahertz device 10 differs from the first embodiment of the terahertz device 10 mainly in the attachment structure of the reflector 40 to the waveguide 30. In the following description, differences from the first embodiment will be described in detail. Same reference characters are given to those components that are the same as the corresponding components of the terahertz device 10 in the first embodiment. Such components will not be described in detail.

Figure 12:
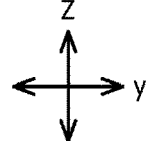
FIG. 12 is a side view showing a second embodiment of a terahertz device.
Figure 13:
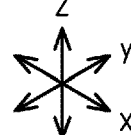
FIG. 13 is an exploded perspective view of the terahertz device shown in FIG. 12.

As shown in FIGS. 12 and 13, in the present embodiment, the reflector 40 is removably attached to the waveguide 30. The structure of the reflector 40 of the present embodiment is obtained by adding an attachment 49 to the reflector 40 of the first embodiment. The attachment 49 is removably attached to the waveguide 30. In the present embodiment, the reflector 40 includes the reflection portion 47 and the attachment 49. In the present embodiment, the reflector 40 is a single component in which the reflection portion 47 and the attachment 49 are formed integrally. Thus, in the present embodiment, the second adhesive layer AH2 is not disposed between the attachment 49 and the waveguide 30.

The attachment 49 is disposed at the side of the back surface 42 of the reflector 40 with respect to the reflection portion 47. Thus, the attachment 49 includes the back surface 42 of the reflector 40. The attachment 49 extends from the basal end 47c of the reflection surface 47a in the z-direction.

The attachment 49 includes a first attachment portion 49A and a second attachment portion 49B. The first attachment portion 49A includes the back surface 42 of the reflector 40. The second attachment portion 49B is disposed between the first attachment portion 49A and the reflection surface 47a in the z-direction.

As shown in FIG. 13, the first attachment portion 49A has the form of a rectangular frame that surrounds the waveguide 30 in the x-direction and the y-direction and is partially cut by a slit 49a extending in the z-direction. In the present embodiment, the slit 49a is disposed in a part of the first attachment portion 49A that is spaced apart from the basal end 47c of the reflection surface 47a in the y-direction. The slit 49a extends through the first attachment portion 49A in the z-direction and the y-direction.

Figure 14:
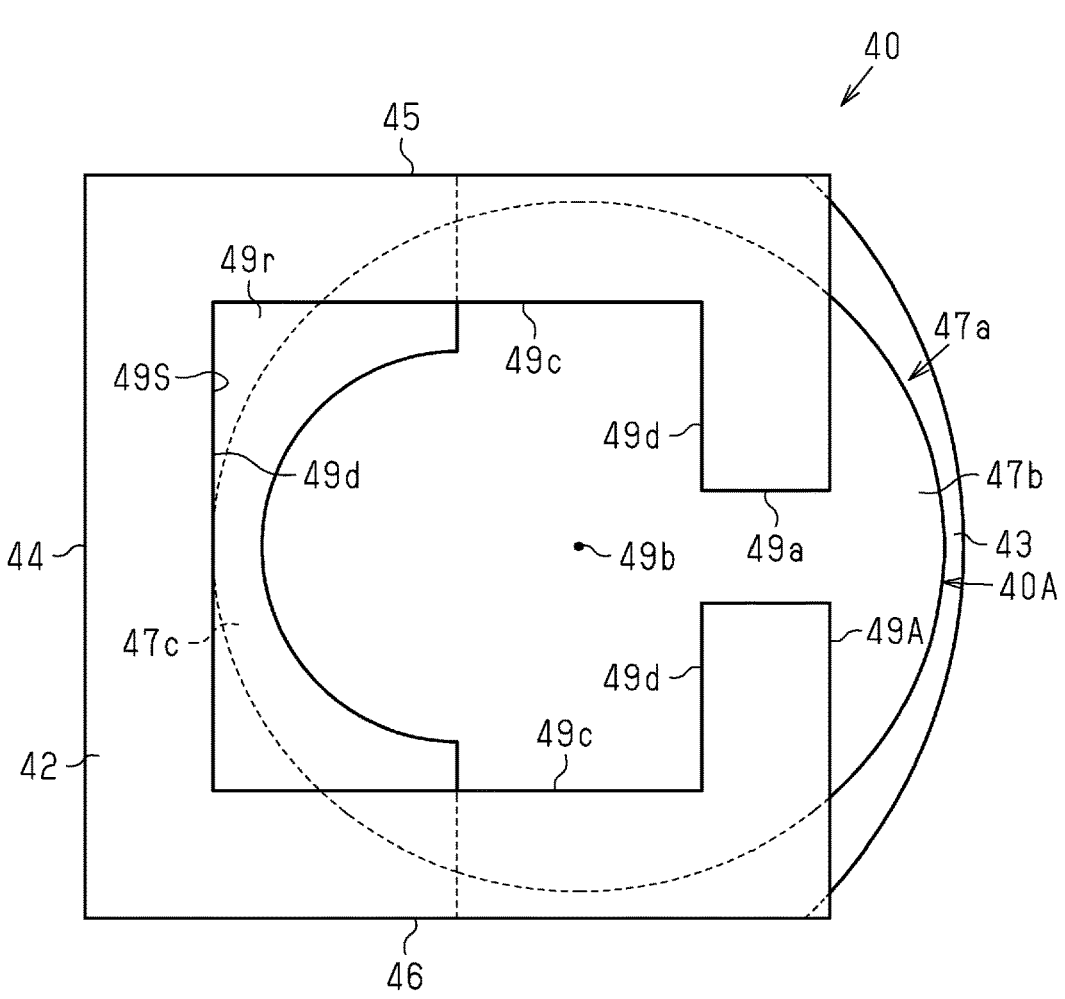
FIG. 14 is a back view of a reflector.
Figure 14:
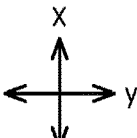

The first attachment portion 49A has an opening 49b extending through the first attachment portion 49A in the z-direction and allowing for insertion of the waveguide 30. As shown in FIG. 14, the opening 49b is defined by two wall surfaces 49c opposed to each other in the x-direction. The distance between the wall surfaces 49c, that is, the dimension of the opening 49b in the x-direction, is equal to the distance between the pipe side surface 35 and the pipe side surface 36 (refer to FIG. 3) of the waveguide 30, that is, the dimension of the waveguide 30 in the x-direction. The opening 49b is also defined by two wall surfaces 49d opposed to each other in the y-direction. The distance between the wall surfaces 49d, that is, the dimension of the opening 49b in the y-direction, is equal to the distance between the pipe side surface 33 and the pipe side surface 34 (refer to FIG. 3) of the waveguide 30, that is, the dimension of the waveguide 30 in the y-direction. The dimension of the opening 49b in the x-direction being equal to the dimension of the waveguide 30 in the x-direction includes a relationship of the dimension of the opening 49b in the x-direction with the dimension of the waveguide 30 in the x-direction that allows the waveguide 30 to be inserted into the attachment 49 and accomplishes a transition fit or an interference fit. Also, the dimension of the opening 49b in the y-direction being equal to the dimension of the waveguide 30 in the y-direction includes a relationship of the dimension of the opening 49b in the y-direction with the dimension of the waveguide 30 in the y-direction that allows the waveguide 30 to be inserted into the attachment 49 and accomplishes a transition fit or an interference fit.

Figure 15:
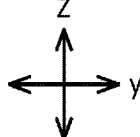
FIG. 15 is a side view of the reflector.

As shown in FIGS. 14 and 15, the reflector 40 includes a step 49S disposed in the boundary between the first attachment portion 49A and the second attachment portion 49B. As shown in FIG. 15, the second attachment portion 49B includes an end surface 49r located at the attachment 49 in the z-direction, and the step 49S is defined by the end surface 49r and the wall surfaces 49d of the attachment 49. The end surface 49r projects inward from the wall surfaces 49c and 49d of the opening 49b. As shown in FIG. 14, the end surface 49r includes a semicircular inner edge as viewed in the z-direction. The diameter of the inner edge of the end surface 49r is equal to the diameter of the through hole 37 (refer to FIG. 13) of the waveguide 30.

The second attachment portion 49B includes an inclined surface 49e joined to the reflection surface 47a. As viewed in the z-direction, the second attachment portion 49B surrounds the reflection surface 47a from both sides in the x-direction and one side in the y-direction. The inclined surface 49e is a curved surface the diameter of which increases from the back surface 42 of the reflector 40 toward the main surface 41.

Figure 16:
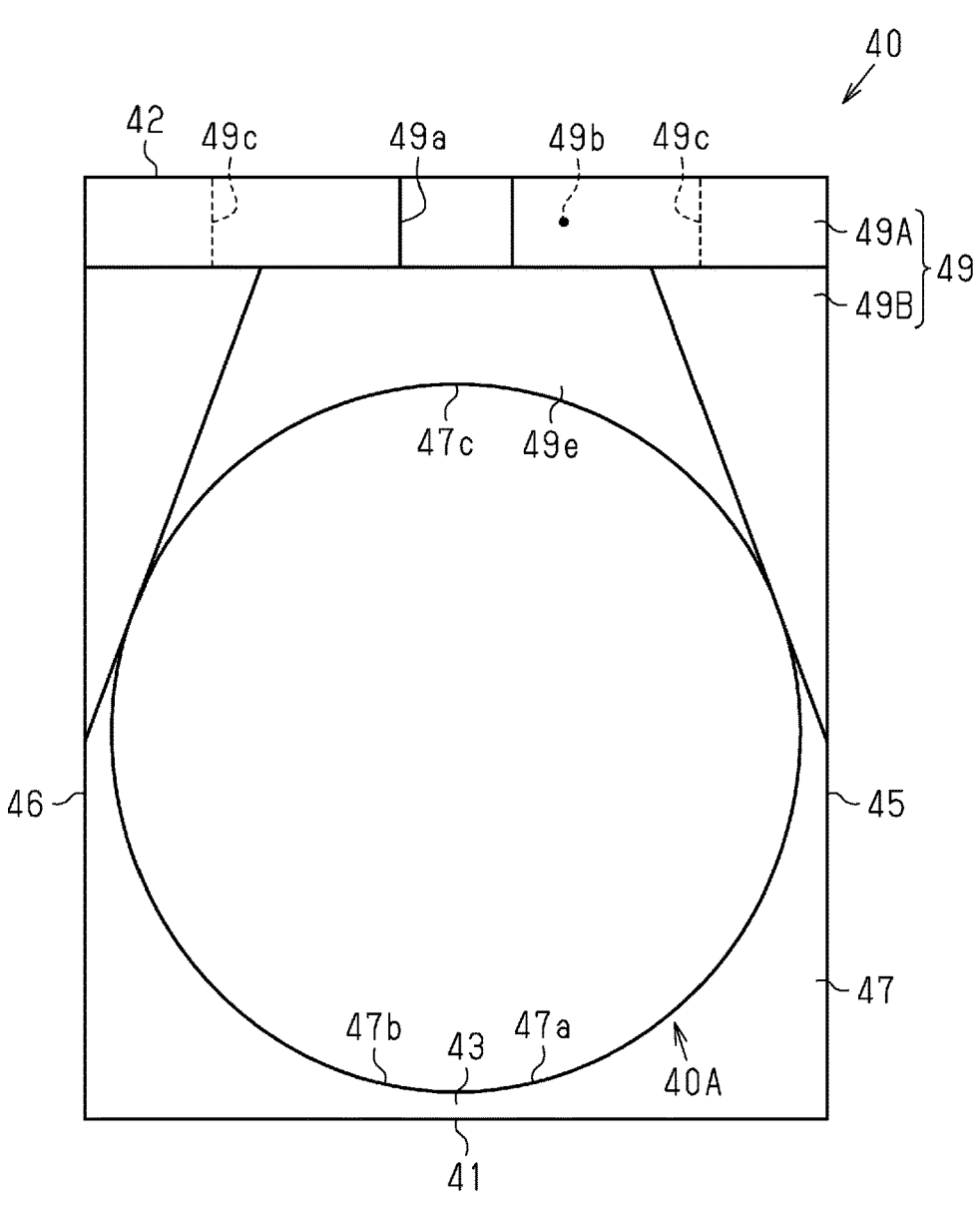
FIG. 16 is a front view of the reflector.
Figure 16:
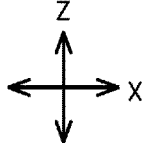

As shown in FIG. 15, the inclined surface 49e includes a portion located close to the side surface 44 and inclined toward the side surface 44 as the first attachment portion 49A extends farther in the z-direction. The portion of the inclined surface 49e located close to the side surface 44 is joined to the basal end 47c of the reflection surface 47a. As shown in FIG. 16, the inclined surface 49e includes two end portions in the x-direction that are inclined away from each other as the first attachment portion 49A extends father in the z-direction.

In the present embodiment, as shown in FIG. 12, the inclination angle of the inclined surface 49e from the end surface 49r of the step 49S is set to be smaller than the inclination angle of the wall surface of the waveguide 30 defining the through hole 37 from the pipe main surface 31. Alternatively, the inclination angle of the inclined surface 49e from the end surface 49r of the step 49S may be set to be equal to the inclination angle of the wall surface of the waveguide 30 defining the through hole 37 from the pipe main surface 31.

The second attachment portion 49B is disposed closer to the main surface 41 of the reflector 40 than the step 49S. Thus, the reflection portion 47 is spaced apart from the step 49S and disposed closer to the main surface 41 than the step 49S in the z-direction.

Figure 17:
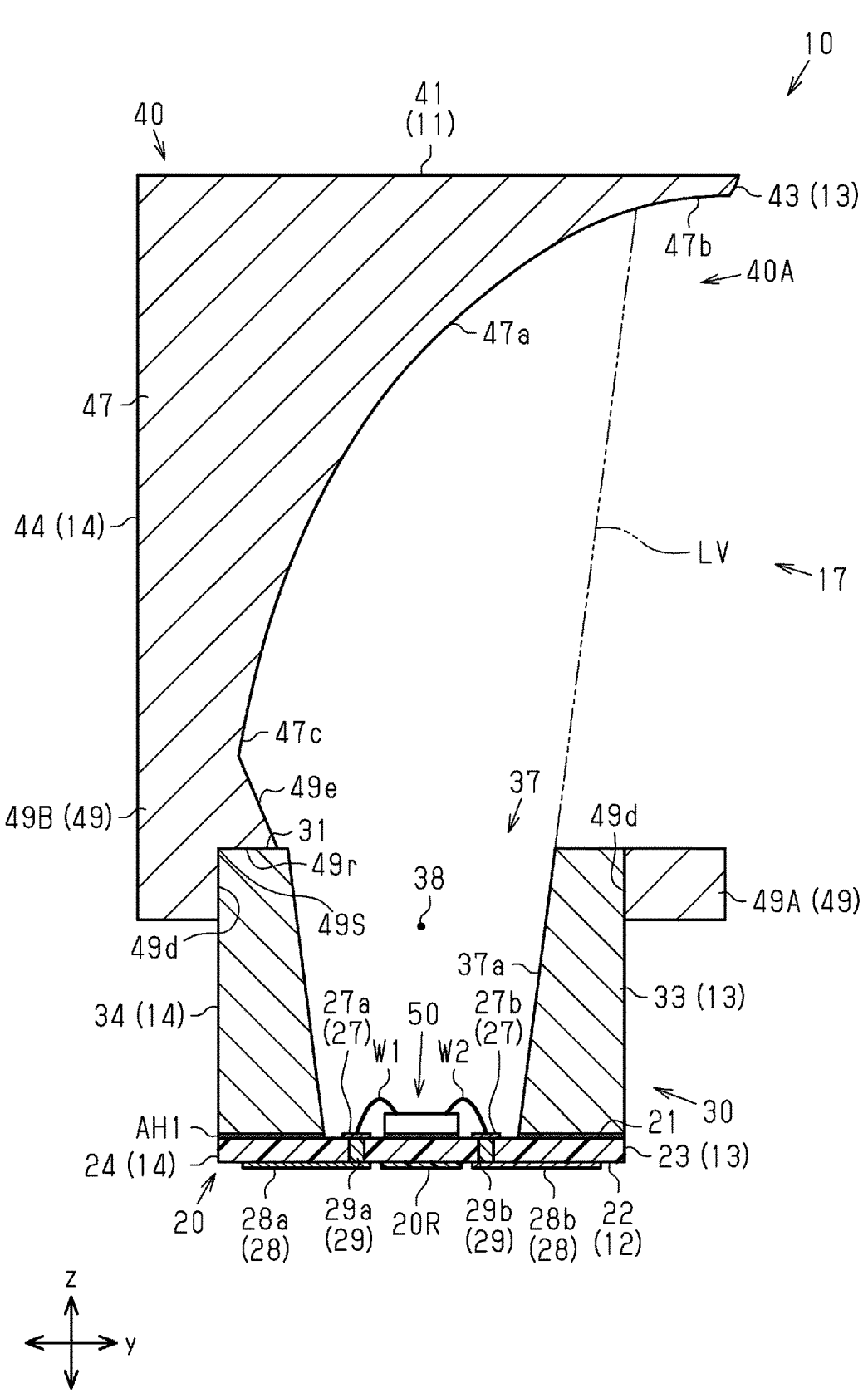
FIG. 17 is an end view showing an end structure of the terahertz device of the second embodiment.

As shown in FIG. 17, when the reflector 40 is attached to the waveguide 30, the step 49S is in contact with the pipe main surface 31 of the waveguide 30. More specifically, the end surface 49r of the step 49S is in contact with the pipe main surface 31 of the waveguide 30 in the z-direction. As viewed in the z-direction, the inner edge of the end surface 49r is located outward from the edge of the pipe main surface 31, which defines the through hole 37 of the waveguide 30 in a direction orthogonal to the z-direction.

The position of the inner edge of the end surface 49r of the step 49S may be changed in any manner. In an example, the inner edge of the end surface 49r may be aligned with the edge of the pipe main surface 31 defining the through hole 37 of the waveguide 30 in a direction orthogonal to the z-direction. In the present embodiment, the pipe main surface 31 is in contact with the end surface 49r, which is a portion of the step 49S located closer to the main surface 41 than the back surface 42. Thus, the pipe main surface 31 is disposed closer to the main surface 41 than the back surface 42 of the reflector 40.

The reflection portion 47 of the present embodiment has the same structure as the reflection portion 47 of the first embodiment. In the present embodiment, the opening 40A of the reflector 40 is defined by the distal end 47b of the reflection surface 47a. The device opening 17 is defined by the distal end 47b and the pipe main surface 31 of the waveguide 30. In other words, the device opening 17 is a region between the distal end 47b and the pipe main surface 31 of the waveguide 30. In the present embodiment, the reflector 40 includes the attachment 49. Therefore, the device opening 17 of the present embodiment is greater in size than the device opening 17 of the first embodiment.

In the present embodiment, the reflection surface 47a is spaced apart from the pipe main surface 31 of the waveguide 30 in the z-direction. More specifically, the inclined surface 49e is disposed between the reflection surface 47a and the pipe main surface 31.

As shown in FIGS. 15 to 17, in the same manner as the first embodiment, the reflection portion 47 includes a recessed curved surface that is curved from the side surface

44 toward the side surface 43 as the recessed curved surface extends from the back surface 42 toward the main surface 41.

In an example, when the reflection surface 47a of the reflection portion 47 is aspherical, in a cross-sectional view of the reflector 40 shown in FIG. 17, the reflection surface 47a of the reflection portion 47 may be set to satisfy the relationship of $y=z^2/4f$ in the same manner as the first embodiment. In the equation, y denotes the coordinate in the y-direction, z denotes the coordinate in the z-direction, and f denotes the distance between the portion of the reflection surface 47a located closest to the device side surface 14 and the emission point P2 of the terahertz element 50. In the same manner as the first embodiment, the reflection surface 47a of the present embodiment has the form of a paraboloid of revolution.

As shown in FIG. 17, the reflection surface 47a is disposed to cover the terahertz element 50 in the z-direction. More specifically, the reflection surface 47a is disposed to cover the transmission region 38 in the z-direction. As viewed in the z-direction, the reflection surface 47a covers the entire region of the waveguide 30 extending from the tapered surface 37a along the tapered surface 37a in the z-direction. In the present embodiment, as shown in FIG. 17, the distal end 47b of the reflection surface 47a extends to a position that intersects an imaginary line LV that extends along the tapered surface 37a in the z-direction from a portion of the tapered surface 37a of the through hole 37 in the waveguide 30 corresponding to the pipe side surface 33.

When electromagnetic waves are emitted from the emission point P2 of the terahertz element 50, the electromagnetic waves are transmitted as spherical waves via the transmission region 38 and are reflected on the reflection surface 47a in one direction (toward the device side surface 13). That is, electromagnetic waves emitted from the terahertz element 50 are reflected on the reflection surface 47a toward the device opening 17. The electromagnetic waves reflected on the reflection surface 47a change from spherical waves into plane waves and are emitted from the device opening 17 to the outside of the terahertz device 10.

Effects

The terahertz device 10 of the present embodiment has the following advantages in addition to the advantages of the first embodiment.

(2-1) The reflector 40 is removably attached to the waveguide 30. This structure allows for a change in the attachment direction of the reflector 40 to the waveguide 30 in the x-direction or the y-direction. Thus, even after the reflector 40 is attached to the waveguide 30, the position of the device opening 17 of the terahertz device 10 is changeable.

(2-2) The reflector 40 includes the step 49S. When the reflector 40 is attached to the waveguide 30, the step 49S is in contact with the pipe main surface 31 of the waveguide 30 in the z-direction. In this structure, the reflector 40 is readily positioned with respect to the waveguide 30 in the z-direction. Thus, the reflector 40 is readily attached to the waveguide 30.

(2-3) The attachment 49 of the reflector 40 includes the slit 49a extending through the attachment 49 in the z-direction. In this structure, even when the dimensions of the waveguide 30 and the dimension of the opening 49b in the attachment 49 have variations, the slit 49a allows for increases in the dimension of the opening 49b in the attachment 49. Thus, the reflector 40 is readily inserted into the waveguide 30.

(2-4) As viewed in the z-direction, the wall surface of the attachment 49 defining the opening 49b is located at the same position as the wall surface of the pipe main surface 31 defining the opening of the through hole 37 in the waveguide 30 or at an outer side of the wall surface. In this structure, when electromagnetic waves are emitted from the terahertz element 50, reflection of the electromagnetic waves caused by the opening 49b of the attachment 49 is avoided. This facilitates propagation of electromagnetic waves emitted from the terahertz element 50 toward the reflection surface 47a.

Third Embodiment

A third embodiment of a terahertz device 10 will now be described with reference to FIGS. 18 to 20.

Figure 18:
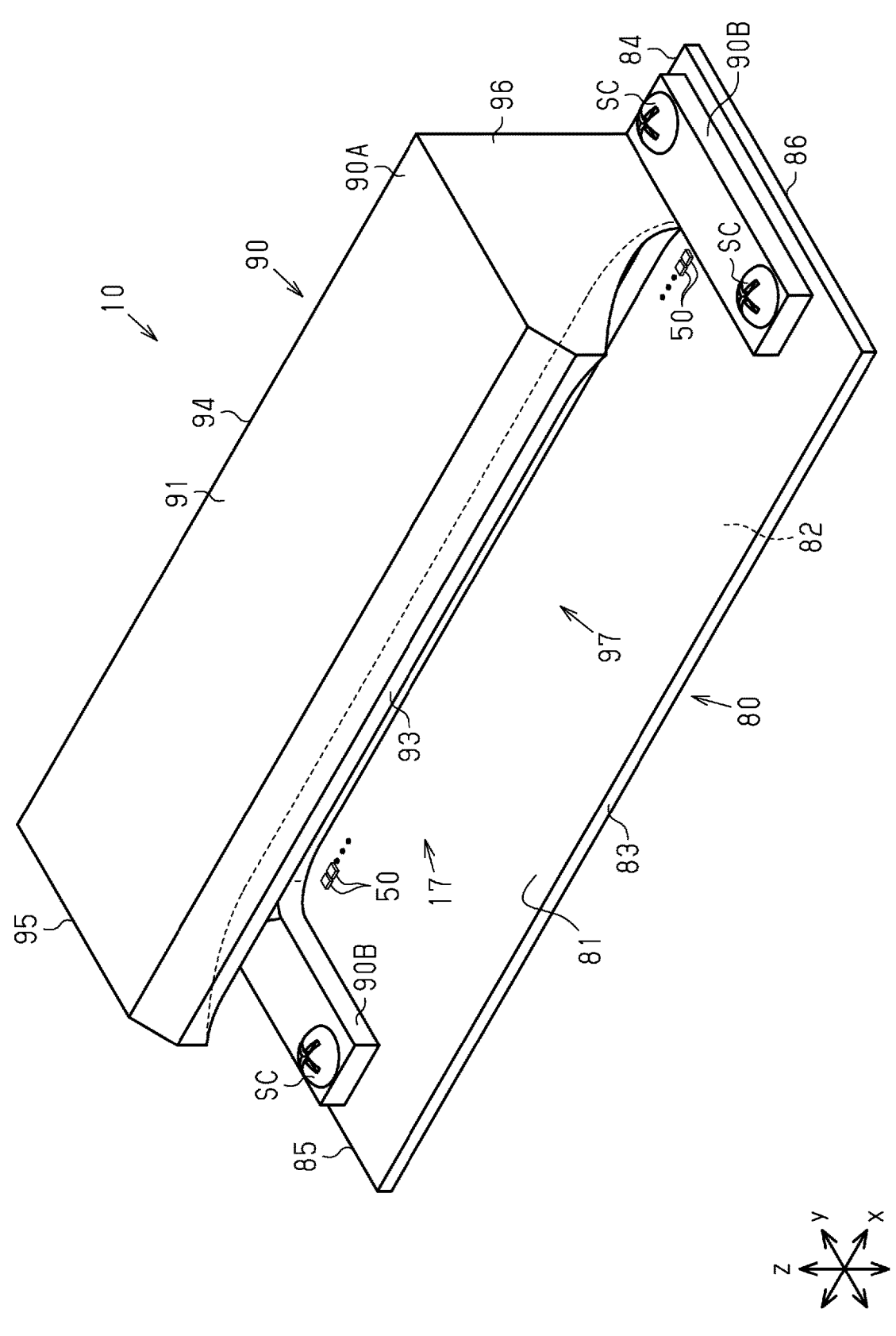
FIG. 18 is a perspective view showing a third embodiment of a terahertz device.

As shown in FIG. 18, the present embodiment of a terahertz device 10 includes a support substrate 80, a plurality of (in the present embodiment, sixty-four) terahertz elements 50 mounted on the support substrate 80, and a reflector 90 covering the terahertz element 50. For the sake of convenience, FIG. 18 does not show some of the terahertz elements 50 and a power supply line 88 formed on the support substrate 80. The power supply line 88 will be described later.

The support substrate 80 is formed from an electrically-insulative material and is formed from, for example, a glass-epoxy resin. The support substrate 80 is rectangular-plate-shaped. The support substrate 80 includes a substrate main surface 81 and a substrate back surface 82, which face in opposite directions in the thickness-wise direction (the z-direction) and substrate side surfaces 83 to 86, which are disposed between the substrate main surface 81 and the substrate back surface 82 in the z-direction and extend in directions that intersect with the substrate main surface 81 and the substrate back surface 82. In the present embodiment, each of the substrate side surfaces 83 to 86 extend in a direction orthogonal to the substrate main surface 81 and the substrate back surface 82.

As viewed in the z-direction, the substrate main surface 81 and the substrate back surface 82 are identical in shape. As viewed in the z-direction, the substrate main surface 81 is rectangular so that the long sides extend in the x-direction and the short sides extend in the y-direction. As viewed in the z-direction, the substrate main surface 81 and the substrate back surface 82 may have different shapes.

Figure 19:
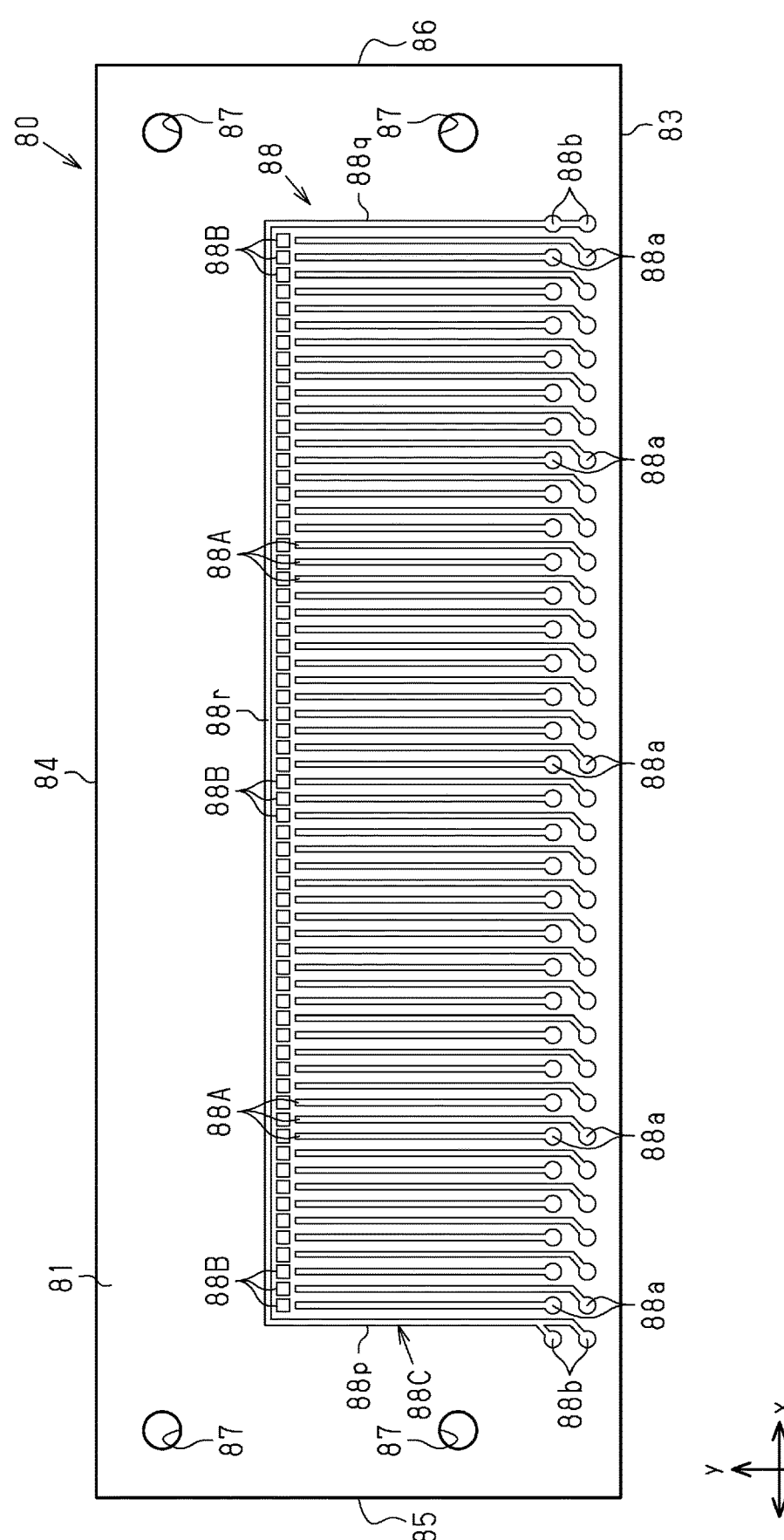
FIG. 19 is a plan view of a support substrate of the terahertz device shown in FIG. 18.

As shown in FIG. 19, the substrate side surfaces 83 and 84 face in opposite directions in the y-direction. As viewed in the z-direction, the substrate side surfaces 83 and 84 extend in the x-direction. The substrate side surfaces 85 and 86 face in opposite directions in the x-direction. As viewed in the z-direction, the substrate side surfaces 85 and 86 extend in the y-direction.

As shown in FIG. 19, the support substrate 80 has a plurality of (in the present embodiment, four) attachment holes 87 used to attach the reflector 90. The attachment holes 87 are through holes extending through the support substrate 80 in the z-direction. In the present embodiment, two attachment holes 87 are arranged in each of the two ends of the support substrate 80 in the x-direction.

As shown in FIG. 19, the power supply line 88 is formed on the substrate main surface 81. The power supply line 88 includes a plurality of (in the present embodiment, sixty-four) main conductors 88A electrically connected to the first pad electrodes 63c (refer to FIG. 8) of the terahertz elements 50, a plurality of (in the present embodiment, sixty-four) pads 88B on which the terahertz elements 50 (refer to FIG. 18) are mounted, and a ground conductor 88C electrically connected to the second pad electrodes 64c (refer to FIG. 8) of the terahertz elements 50.

The number of main conductors 88A and the number of the pads 88B are set in accordance with the number of terahertz elements 50.

The pads 88B are disposed on a portion of the substrate main surface 81 located closer to the substrate side surface 84 than the center of the substrate main surface 81 in the y-direction. The pads 88B are aligned with each other in the y-direction and spaced apart from each other in the x-direction. That is, the pads 88B are arranged in a line in the x-direction.

The main conductors 88A extend in the y-direction. As viewed in the z-direction, the main conductors 88A are aligned with the pads 88B in the x-direction and are spaced apart from each other in the y-direction. The main conductors 88A are disposed closer to the substrate side surface 84 than the pads 88B. The main conductors 88A each include two ends in the y-direction, and one of the two ends located closer to the substrate side surface 83 includes a connection land 88a. In the present embodiment, the dimension of the connection land 88a in the x-direction is greater than the dimension of a portion of the main conductor 88A other than the connection land 88a in the x-direction. Hence, when two of the main conductors 88A that are adjacent to each other in the x-direction are referred to as a pair of the main conductors 88A, the pair of the main conductors 88A is formed so that the connection lands 88a in the pair of the main conductors 88A are aligned with each other in the x-direction and spaced apart in the y-direction.

The connection lands 88a are, for example, circular. Although not shown in the drawings, through holes extend through the connection lands 88a and the support substrate 80 in the z-direction.

The ground conductor 88C is arranged as a common conductor shared by the terahertz elements 50. The ground conductor 88C is U-shaped as viewed in the z-direction and surrounds the main conductors 88A and the pads 88B from both sides in the x-direction and from a side of the substrate side surface 84 in the y-direction.

The ground conductor 88C includes a first conductive part 88p and a second conductive part 88q extending in the y-direction and a joint conductive part 88r that joins the first conductive part 88p to the second conductive part 88q in the x-direction.

The first conductive part 88p is disposed closer to the substrate side surface 85 than the main conductors 88A and the pads 88B in the x-direction.

The second conductive part 88q is disposed closer to the substrate side surface 86 than the main conductors 88A and the pads 88B in the x-direction.

The conductive parts 88p and 88q each include two ends in the y-direction, and one of the two ends located closer to the substrate side surface 83 includes two connection lands 88b. The two connection lands 88b are aligned with each other in the x-direction and are spaced apart from each other in the y-direction. In the present embodiment, the connection lands 88b and the connection lands 88a are aligned with each other in the x-direction. In the present embodiment, the dimension of the connection land 88b in the x-direction is greater than the dimension of the conductive parts 88p and 88q in the x-direction.

The connection land 88*b* is, for example, circular. Although not shown in the drawings, through holes extend through the connection lands 88*b* and the support substrate 80 in the z-direction.

The joint conductive part 88*r* is disposed closer to the substrate side surface 84 than the main conductors 88A and the pads 88B in the y-direction. The joint conductive part 88*r* is disposed adjacent to each of the pads 88B in the y-direction and extends in the x-direction. The joint conductive part 88*r* joins one of the two ends of the conductive part 88*p* located closer to the substrate side surface 84 in the y-direction to one of the two ends of the conductive part 88*q* located closer to the substrate side surface 84 in the y-direction.

Although not shown in the drawings, pin headers are inserted into the through holes of the support substrate 80 from the side of the substrate back surface 82. The pin headers are connected to the connection lands 88*a* and 88*b* of the substrate main surface 81 by a conductive bonding material such as solder. Connectors are connected to the pin headers located at the side of the substrate back surface 82 to transmit and receive (input or output) a high frequency signal to and from the terahertz element 50. Instead of pin headers, surface mount type connectors may be mounted on the substrate back surface 82.

Figure 20:
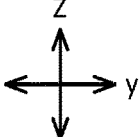
FIG. 20 is an end view showing an end structure of a third embodiment of a terahertz device.

As shown in FIG. 20, the terahertz element 50 is mounted on the pad 88B. More specifically, the terahertz element 50 is bonded to the pad 88B by, for example, a conductive bonding material. That is, the terahertz element 50 is die-bonded to the pad 88B. The terahertz elements 50, which are mounted on the pads 88B, are aligned with each other in the y-direction and spaced apart from each other in the x-direction. That is, the terahertz elements 50 are arranged, for example, in the x-direction.

Each of the terahertz elements 50 is mounted on the pad 88B so that the element main surface 51 and the substrate main surface 81 face in the same direction and the element back surface 52 and the substrate back surface 82 face in the same direction. Each of the terahertz elements 50 has the same structure as the terahertz element 50 of the first embodiment. Thus, the terahertz element 50 emits electromagnetic waves in the z-direction.

The terahertz element 50 and the main conductor 88A are connected by a first wire W1. The first wire W1 is connected to the first pad electrode 63*c* (refer to FIG. 8) of the terahertz element 50. The first wire W1 is also connected to one of the two ends of the main conductor 88A in the y-direction located closer to the terahertz element 50. Thus, the first pad electrode 63*c* of the terahertz element 50 is electrically connected to the main conductor 88A.

The terahertz element 50 and the ground conductor 88C are connected by a second wire W2. The second wire W2 is connected to the second pad electrode 64*c* (refer to FIG. 8) of the terahertz element 50. The second wire W2 is also connected to the joint conductive part 88*r* of the ground conductor 88C. Thus, the second pad electrode 64*c* of the terahertz element 50 is electrically connected to the ground conductor 88C.

As shown in FIG. 18, the reflector 90 is attached to the substrate main surface 81 of the support substrate 80 using a plurality of (in the present embodiment, four) screws SC and nuts (not shown). The reflector 90 is a component that reflects electromagnetic waves from the terahertz element 50 in a direction intersecting the z-direction. More specifically, the reflector 90 is a reflection member that reflects electromagnetic waves, which are transmitted from the terahertz element 50 through the waveguide 30, in a predetermined direction. In an example, the reflector 90 includes a horn reflector antenna. The reflector 90 is formed from a conductive material that is non-transmissive to electromagnetic waves emitted from the terahertz element 50. The material may be a metal material such as Cu, a Cu alloy, Al, or an Al alloy. In other words, the reflector 90 is formed from a metal material.

The reflector 90 includes an opening 97 that is open at one side in the y-direction, which corresponds to the above predetermined direction. More specifically, the opening 97 is open toward the substrate side surface 83. In other words, the opening 97 is open in a direction intersecting the thickness-wise direction of the terahertz element 50. More specifically, the opening 97 is open in a direction orthogonal to the thickness-wise direction of the terahertz element 50.

When the reflector 90 is attached to the support substrate 80, the terahertz device 10 has the device opening 17. The device opening 17 is open in a direction intersecting the thickness-wise direction of the terahertz element 50. In the present embodiment, the device opening 17 is open in a direction orthogonal to the thickness-wise direction of the terahertz element 50. The device opening 17 is defined by the reflector 90 and the support substrate 80. When the terahertz element 50 performs oscillation, the device opening 17 may be referred as an outlet through which the electromagnetic waves emitted from the terahertz element 50 exit. The device opening 17 may have any shape as long as the portion opposed to the terahertz element 50 in the thickness-wise direction of the terahertz element 50 is not open in the thickness-wise direction of the terahertz element 50. In other words, the device opening 17 may have any structure that allows electromagnetic waves, which are emitted in the z-direction from the terahertz element 50 and reflected on the reflection surface 47*a*, to exit the terahertz device 10 in a propagation direction of the electromagnetic waves.

The reflector 90 is disposed to cover all of the terahertz elements 50 in the z-direction. The reflector 90 includes a main surface 91 and a back surface 92 (refer to FIG. 20), which face in opposite directions in the z-direction, and side surfaces 93 to 96, which are disposed between the main surface 91 and the back surface 92 in the z-direction and extend in directions intersecting the main surface 91 and the back surface 92.

The main surface 91 and the substrate main surface 81 face in the same direction. The back surface 92 and the substrate back surface 82 face in the same direction. Thus, the reflector 90 is disposed on the support substrate 80 when the back surface 92 is in contact with the substrate main surface 81.

The side surface 93 and the substrate side surface 83 face in the same direction. The side surface 94 and the substrate side surface 84 face in the same direction. The side surface 95 and the substrate side surface 85 face in the same direction. The side surface 96 and the substrate side surface 86 face in the same direction. The side surfaces 94 to 96 extend from the back surface 92 of the reflector 90 to the main surface 91. The side surface 93 is spaced apart from the back surface 92 in the z-direction. The side surface 93 is disposed closer to the main surface 91 than the back surface 92 in the z-direction.

The reflector 90 includes a reflection portion 90A and attachments 90B. In the present embodiment, the reflector 90 is a single component in which the reflection portion 90A and the attachments 90B are formed integrally.

As shown in FIG. 20, the reflection portion 90A includes a reflection surface 98 that reflects electromagnetic waves emitted by the terahertz element 50 in the z-direction in a direction intersecting the z-direction. In the present embodiment, the reflection surface 98 is a recessed curved surface that is curved toward the side surface 93 as the reflection surface 98 extends from the back surface 92 toward the main surface 91 in the z-direction. In an example, the curve shape of the reflection surface 98 may be the same as the curve shape of the reflection surface 47*a* of the first embodiment.

The reflection surface 98 includes an end located at the side surface 93 of the reflector 90 defining a distal end 98*a*. The reflection surface 98 includes an end located at the back surface 92 of the reflector 90 defining a basal end 98*b*. In the present embodiment, the opening 97 of the reflector 90 is defined by the distal end 98*a*. The device opening 17 is defined by the distal end 98*a* and the substrate main surface 81 of the support substrate 80. In other words, the device opening 17 is a region between the distal end 98*a* and the substrate main surface 81 of the support substrate 80.

The reflection portion 90A includes a perpendicular surface 99. The perpendicular surface 99 is a flat surface that joins the basal end 98*b* of the reflection surface 98 to the back surface 92 and extends in the z-direction and the x-direction. In other words, the reflection surface 98 is spaced apart from the back surface 92 of the reflector 90 in the z-direction. Thus, the reflection surface 98 is spaced apart from the substrate main surface 81 of the support substrate 80 in the z-direction.

As shown in FIG. 20, in the present embodiment, one of the two ends (the basal end 98*b*) of the reflection surface 98 in the z-direction located closer to the perpendicular surface 99 is located closer to the main surface 91 of the reflector 90 than the element main surface 51 of the terahertz element 50.

As shown in FIG. 18, as viewed in the z-direction, the attachments 90B project in the x-direction from the side surfaces 95 and 96, which are located at opposite sides of the reflector 90 in the x-direction. The attachments 90B are strip-shaped and extend in the y-direction. Each attachment 90B has insertion holes (not shown) through which the screws SC are inserted. The insertion holes extend through the attachment 90B in the z-direction. The screws SC are also inserted into the attachment holes 87, which is shown in FIG. 19. The attachment 90B and the support substrate 80 are held by the screw heads of the screws SC and the nuts (not shown) located at the side of the substrate back surface 82 of the support substrate 80. This attaches the reflector 90 to the support substrate 80.

As shown in FIG. 20, in the y-direction, the terahertz element 50 is disposed closer to the substrate side surface 84 than the center of the reflection surface 98 of the reflector 90 in the y-direction.

The joint conductive part 88*r* of the ground conductor 88C, which is disposed closer to the substrate side surface 84 than the terahertz element 50 in the y-direction, is disposed to overlap the reflection surface 98 as viewed in the z-direction.

In the present embodiment, of the connection lands 88*a* of the main conductors 88A and the connection lands 88*b* of the ground conductor 88C, the connection lands 88*a* and 88*b* that are located close to the substrate side surface 83 in the y-direction are disposed so as to not overlap the reflector 90, as viewed in the z-direction.

Electromagnetic waves emitted from the terahertz elements 50 toward the reflection surface 98 as spherical waves are reflected on the reflection surface 98 toward the opening 97. The electromagnetic waves reflected on the reflection surface 98 are emitted through the opening 97 to the outside of the terahertz device 10 as plane waves.

Effects

The terahertz device 10 of the present embodiment has the following advantages.

(3-1) The terahertz device 10 includes a plurality of terahertz elements 50, and the reflector 40 covers the element main surfaces 51 of the terahertz elements 50 in the z-direction. In this structure, the reflection surface 98 of the reflector 90 is spaced apart and opposed to the element main surfaces 51 in the emission direction in which the terahertz elements 50 emit electromagnetic waves. Thus, the electromagnetic waves emitted from each terahertz element 50 are reflected on the reflection surface 98 and propagated in a direction (in the present embodiment, the y-direction) that intersects the vertical direction. This increases the directivity of electromagnetic waves emitted from the terahertz element 50 on the reflection surface 98, that is, the directivity of electromagnetic waves in the direction intersecting the thickness-wise direction of the terahertz element 50.

(3-2) The power supply line 88 is formed on the substrate main surface 81 of the support substrate 80 and electrically connected to the terahertz elements 50. The terahertz elements 50 are mounted on the substrate main surface 81. In this structure, when electromagnetic waves are emitted from the element main surfaces 51 of the terahertz elements 50, blocking of electromagnetic waves by the power supply line 88 is avoided.

(3-3) The power supply line 88, which corresponds to a power supply line, includes the main conductors 88A and the ground conductor 88C. The main conductors 88A are electrically connected to the first pad electrodes 63*c*, or the main electrodes, of the terahertz elements 50. The ground conductor 88C is electrically connected to the second pad electrodes 64*c*, or the ground electrodes, of the terahertz elements 50. The main conductor 88A is arranged for each terahertz element 50. The ground conductor 88C is arranged as a common conductor shared by the terahertz elements 50.

This structure reduces the number of power supply lines 88 as compared to a structure in which a ground conductor 88C is arranged for each terahertz element 50. This limits increases in size of the support substrate 20 for formation of the power supply line 88.

(3-4) The connection lands 88*a* of the main conductors 88A and the connection lands 88*b* of the ground conductor 88C are both provided on the end of the substrate main surface 81 that is located close to the substrate side surface 83. This structure allows the main conductors 88A and the ground conductor 88C to be connected to a common pin header or a common connector. Thus, signals may be transmitted to and from the terahertz elements 50 from the side of the substrate back surface 82.

(3-5) The reflector 90 is formed of a conductive material that is non-transmissive to electromagnetic waves. In this structure, the reflector 90, which is a single component, serves to reflect electromagnetic waves from the terahertz elements 50.

(3-6) Some of the pin headers coupled to the support substrate 80 are located closer to the substrate side surface 83 than the reflector 90 as viewed in the z-direction. In this structure, when electromagnetic waves are emitted from the terahertz elements 50 and reflected on the reflection surface 98, interference of the reflected electromagnetic waves with the pin headers is limited. This limits decreases in antenna gain.

(3-7) The ground conductor 88C surrounds the main conductors 88A from both sides in the x-direction and from a side in the y-direction. In this structure, the ground conductor 88C serves as a wire shield for the main conductors 88A and reduces leakage of noise produced from the main conductors 88A to the outside of the terahertz device 10.

Fourth Embodiment

Figure 22:
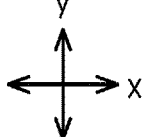
FIG. 22 is a plan view of the terahertz device of the fourth embodiment with a reflector and an antenna of a waveguide omitted.

A fourth embodiment of a terahertz device 10 will now be described with reference to FIGS. 21 to 23. The present embodiment of the terahertz device 10 differs from the first embodiment of the terahertz device 10 mainly in that a shorting portion 130 is added and in the structure of a waveguide 100. In the following description, differences from the first embodiment will be described in detail. Same reference characters are given to those components that are the same as the corresponding components of the terahertz device 10 in the first embodiment. Such components will not be described in detail. FIG. 22 is a plan view of the terahertz device 10 from which the reflector 40, an antenna portion 110 (the waveguide 30), and a connector 140 are omitted. The antenna portion 110 and the connector 140 will be described later.

Figure 21:
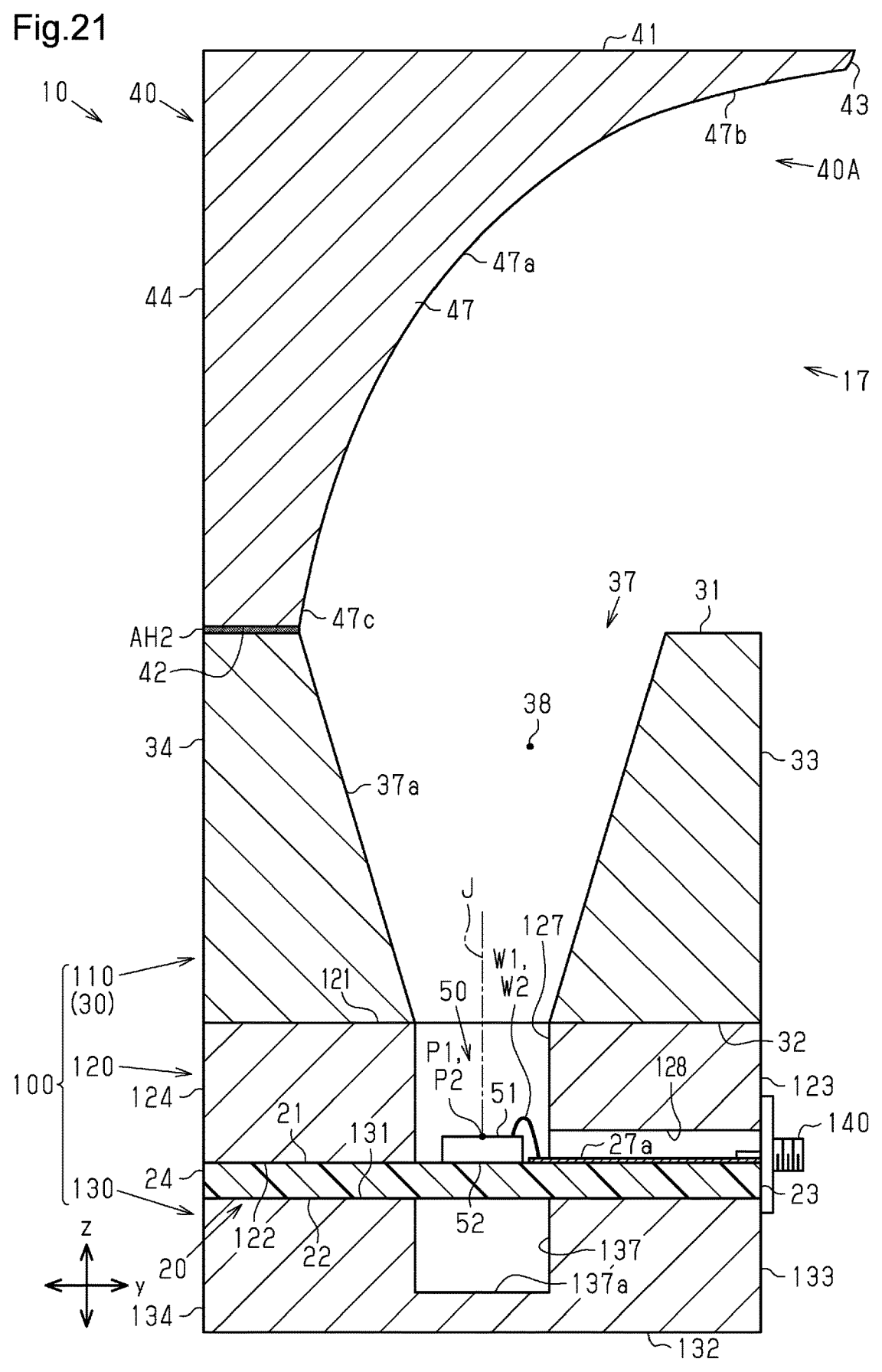

As shown in FIG. 21, the waveguide 100 includes the antenna portion 110, a body portion 120, and the shorting portion 130. The antenna portion 110 corresponds to the waveguide 30 of the first embodiment. The body portion 120 is joined to the antenna portion 110. The shorting portion 130 and the antenna portion 110 are disposed at opposite sides of the body portion 120. The antenna portion 110, the body portion 120, and the shorting portion 130 are formed separately. The antenna portion 110 has the same structure as the waveguide 30 of the first embodiment. Thus, same reference characters are given to those components that are the same as the corresponding components of the waveguide 30. Such components will not be described in detail.

The body portion 120 is a part that is mounted on the substrate main surface 21 of the support substrate 20 to accommodate the terahertz element 50. The body portion 120 is rectangular-box-shaped. As viewed in the z-direction, the body portion 120 has the form of a rectangular ring. The body portion 120 is formed from a conductive material that is non-transmissive to electromagnetic wave that are emitted from or received by the terahertz element 50. The material may be a metal such as Cu, a Cu alloy, Al, or an Al alloy.

As shown in FIGS. 21 and 22, the body portion 120 includes a body main surface 121 and a body back surface 122, which face in opposite directions in the z-direction, and body side surfaces 123 to 126, which are disposed between the body main surface 121 and the body back surface 122 in the z-direction and extend in directions intersecting the body main surface 121 and the body back surface 122. In the present embodiment, each of the body side surfaces 123 to 126 extends in a direction orthogonal to the body main surface 121 and the body back surface 122.

As shown in FIG. 21, the body side surface 123 and the pipe side surface 33 of the antenna portion 110 (the waveguide 30) face in the same direction. The body side surface 124 and the pipe side surface 34 of the antenna portion 110 face in the same direction. Although not shown, the body side surface 125 and the pipe side surface 35 of the antenna portion 110 face in the same direction. The body side surface 126 and the pipe side surface 36 of the antenna portion 110 face in the same direction.

As shown in FIGS. 21 and 22, the body portion 120 has a through hole 127. The through hole 127 extends through the body portion 120 from the body main surface 121 of the body portion 120 to the body back surface 122. In other words, the through hole 127 extends through the body portion 120 in the z-direction (the thickness-wise direction of the body portion 120). As shown in FIG. 22, as viewed in the z-direction, the through hole 127 is circular. The diameter of the through hole 127 is constant in the z-direction. The diameter of the through hole 127 is equal to the minimum value of the diameter of the through hole 37 in the antenna portion 110. The minimum value of the diameter of the through hole 37 corresponds to the diameter of the through hole 37 in the pipe back surface 32 of the antenna portion 110.

The through hole 127 is continuous with the through hole 37 of the antenna portion 110. Thus, in the same manner as the through hole 37 in the antenna portion 110, the through hole 127 serves as the transmission region 38 through which electromagnetic waves transmit.

The body portion 120 further includes a groove 128. The groove 128 is recessed from the body back surface 122 of the body portion 120 toward the body main surface 121. The groove 128 extends from the body side surface 123 of the body portion 120 to the circumferential surface defining the through hole 127. That is, the groove 128 is continuous with the through hole 127. In the present embodiment, as viewed in the y-direction, the groove 128 is semicircular.

The groove 128 extends along the main conductor 27a of the power supply line 27, which is disposed on the support substrate 20 and will be described later, to surround the main conductor 27a. Thus, the body portion 120 is not in contact with the main conductor 27a. The shape of the groove 128 as viewed in the x-direction is not limited to a semicircle as long as the body portion 120 is not in contact. The shape of the groove 128 as viewed in the x-direction may be changed to any shape such as a tetragon or a triangle.

The support substrate 20 is mounted on the body back surface 122 of the body portion 120. The support substrate 20 is mounted on the body back surface 122 of the body portion 120 so that the substrate main surface 21 is opposed to the body back surface 122 in the z-direction. The support substrate 20 and the body portion 120 are bonded by, for example, an adhesive. When the support substrate 20 is mounted on the body portion 120, the through hole 127 in the body portion 120 is closed from the side of the body back surface 122.

In the present embodiment, the support substrate 20 is formed from a material that is non-transmissive to electromagnetic waves that are emitted from or received by the terahertz element 50. In the present embodiment, the support substrate 20 is formed from a dielectric. Examples of the dielectric include quartz glass, sapphire, a rigid resin such as an epoxy resin, and a single crystal intrinsic semiconductor such as silicon (Si). In the present embodiment, quartz glass is used. In the same manner as the first embodiment, the power supply line 27 is formed on the substrate main surface 21 of the support substrate 20. However, the power supply line 27 differs from the first embodiment of the power supply line 27 in structure, layout, and shape.

As shown in FIG. 22, in the present embodiment, the power supply line 27 includes the main conductor 27a and two ground conductors 27b and 27c. The ground conductors 27b and 27c are disposed at opposite sides of the main conductor 27a in the x-direction. The main conductor 27a and the ground conductors 27b and 27c are formed from, for example, Cu. As shown in FIG. 21, the main conductor 27a is connected to a cable core of the connector 140 disposed on the substrate side surface 23 of the support substrate 20. The connector 140 is configured to transmit a high-frequency signal and is, for example, a subminiature type A (SMA) connector. The housing of the connector 140 is connected to the body portion 120 of the waveguide 30. As shown in FIG. 22, the ground conductors 27b and 27c are in contact with the body back surface 122 (refer to FIG. 21) of the body portion 120 and electrically connected to the body portion 120. Since the power supply line 27 is connected to the connector 140 as described above, the present embodiment of the support substrate 20 differs from the first embodiment of the support substrate 20. The external terminal 28 (refer to FIGS. 4 and 5) is not formed on the substrate back surface 22.

As shown in FIGS. 21 and 22, the terahertz element 50 is disposed in the through hole 127 of the body portion 120. In other words, the through hole 127 of the body portion 120 accommodates the terahertz element 50. Thus, the terahertz element 50 is disposed in the transmission region 38. More specifically, the generation point P1 and the emission point P2 of the terahertz element 50 are both disposed in the transmission region 38. The terahertz element 50 is disposed with respect to the body portion 120 so that the emission direction of electromagnetic waves is parallel to the axis J of the body portion 120.

As shown in FIG. 22, the first pad electrode 63c of the terahertz element 50 is electrically connected to the main conductor 27a of the support substrate 20 by a wire W1. The second pad electrode 64c is electrically connected to the ground conductor 27b of the support substrate 20 by a wire W2. Alternatively, the first pad electrode 63c may be connected to the ground conductor 27c, and the second pad electrode 64c may be connected to the main conductor 27a. Each of the wires W1 and W2 may include multiple wires. The number of wires W1 may differ from the number of W2.

The shorting portion 130 includes part of the waveguide 100 and is mounted on the substrate back surface 22 of the support substrate 20. The support substrate 20 is sandwiched between the body portion 120 and the shorting portion 130. In other words, the support substrate 20 is disposed between the shorting portion 130 and the body portion 120 in the z-direction. The shorting portion 130 is formed from a conductive material that is non-transmissive to electromagnetic waves that are emitted from or received by the terahertz element 50. Such a material may be Cu, a Cu alloy, Al, or an Al alloy.

The shorting portion 130 is rectangular-box-shaped. The shorting portion 130 includes a main surface 131 and a back surface 132, which face in opposite directions in the z-direction, and four outer side surface 133 to 136, which are disposed between the main surface 131 and the back surface 132 in the z-direction and extend in directions intersecting the main surface 131 and the back surface 132.

As shown in FIG. 22, the outer side surface 133 and the body side surface 123 of the body portion 120 face in the same direction. The outer side surface 134 and the body side surface 124 face in the same direction. The outer side surface 135 and the body side surface 125 face in the same direction. The outer side surface 136 and the body side surface 126 face in the same direction. In the present embodiment, the outer side surface 133 is flush with the body side surface 123. The outer side surface 134 is flush with the body side surface 124. The outer side surface 135 is flush with the body side surface 125. The outer side surface 136 is flush with the body side surface 126.

The shorting portion 130 is attached to the support substrate 20 by an adhesive layer (not shown). More specifically, the main surface 131 of the shorting portion 130 is opposed to the substrate back surface 22 of the support substrate 20 in the z-direction. The adhesive layer is disposed between the main surface 131 of the shorting portion 130 and the substrate back surface 22 of the support substrate 20 in the z-direction.

The shorting portion 130 closes one side of the transmission region 38, which extends through the body portion 120. Thus, the waveguide 100 includes the transmission region 38 as a waveguide path that is open at one side and forms a short-circuit at the other side.

The shorting portion 130 includes a back short part 137. The back short part 137 is a recess that is recessed from the main surface 131 of the shorting portion 130 toward the back surface 132. The shape of the back short part 137 as viewed in the z-direction is circular. The diameter of the back short part 137 is equal to the diameter of the through hole 127 in the body portion 120. The diameter of the back short part 137 is equal to the minimum value of the diameter of the through hole 37 in the antenna portion 110.

The dimension (thickness) of the terahertz element 50, the support substrate 20, and the back short part 137 in the z-direction may be set in accordance with, for example, the frequency (wavelength) of electromagnetic waves emitted from the terahertz element 50. The dimension (thickness) of the terahertz element 50, the support substrate 20, and the back short part 137 in the z-direction may be set so that, for example, the phases are aligned with each other.

Figure 23:
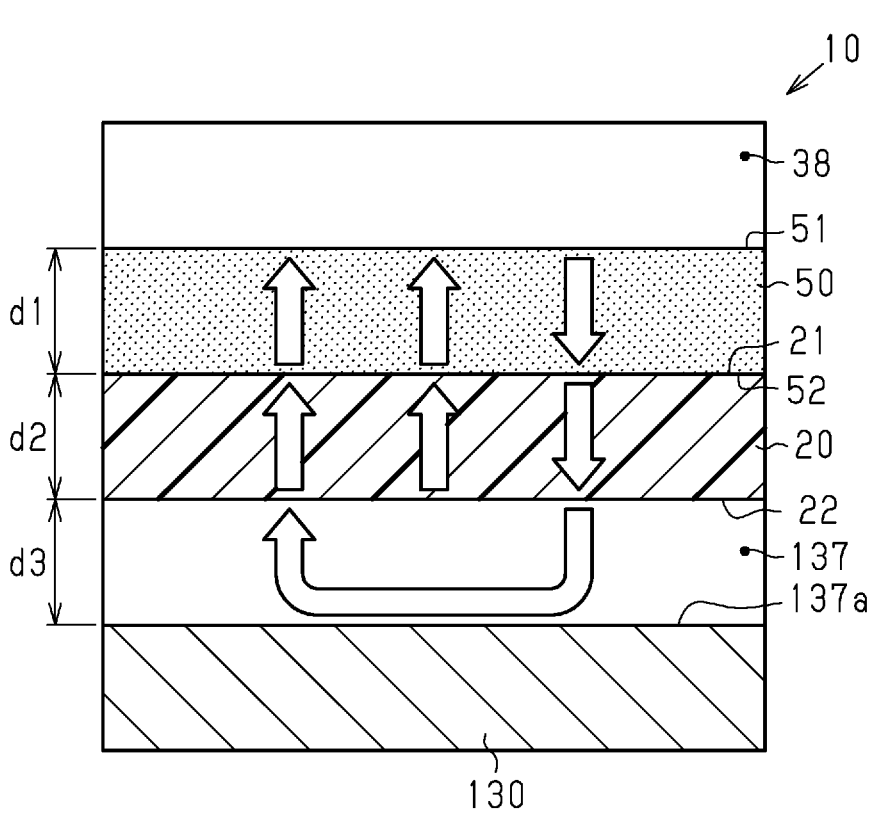
FIG. 23 is a diagram illustrating phase matching in the terahertz device of the fourth embodiment.

In FIG. 23, the white arrows indicate propagation of electromagnetic waves (optical paths) in the terahertz device 10 of the present embodiment. The active element 62, which is shown FIGS. 6 and 7, is mounted on the element main surface 51 of the terahertz element 50. The active element 62 generates terahertz waves as the generation point P1. The antenna 65 emits electromagnetic waves as the emission point P2. In FIG. 23, the terahertz element 50 emits electromagnetic waves in directions orthogonal to the element main surface 51, that is, a direction toward the opening of the body portion 120 and a direction toward the shorting portion 130.

As shown in FIG. 23, when electromagnetic waves are emitted from the side of the element back surface 52 of the terahertz element 50, the electromagnetic waves transmit through the terahertz element 50, the support substrate 20, and the back short part 137 in this order and reflected on a bottom surface 137a of the back short part 137 as indicated by the white arrows in FIG. 23. The reflected electromagnetic waves transmit through the back short part 137, the support substrate 20, and the terahertz element 50 in this order and are emitted from the element main surface 51 of the terahertz element 50 into the body portion 120 of the waveguide 100.

The terahertz element 50 is formed of InP or the like. The support substrate 20 is formed of quartz glass. The back short part 137 is an empty space, and the electromagnetic waves propagate in the air.

In the terahertz element 50, the optical path length in the terahertz element 50 is set to be an integer multiple of $2\pi$. Electromagnetic waves perform free end reflection in the interface between the support substrate 20 and the back short part 137. In the back short part 137, electromagnetic waves perform fixed end reflection on the bottom surface 137a. This results in a $\pi$ phase shift. In the back short part 137, taking into consideration a phase shift amount ($\pi$) caused by reflection, the optical path length is set to be an odd multiple of $\pi$. This results in an aligned phase.

Based on the description above, the terahertz element 50 may have a thickness d1 that is equal to ($\lambda1/2$)×M, where M is an integer greater than or equal to one, that is, M=1, 2, 3, . . . , and $\lambda1$ is the effective wavelength of electromagnetic waves propagated in the terahertz element 50. When n1 denotes the refractive index of the terahertz element 50 (the element substrate 61), c denotes the speed of light, and fc denotes the center frequency of electromagnetic waves, $\Delta1$ is (1/n1)×(c/fc). Electromagnetic waves perform free end reflection in the interface between the terahertz element 50 and the support substrate 20. When the thickness d1 of the terahertz element 50 is set as described above, the phases are aligned with each other.

The support substrate 20 may have a thickness d2 that is equal to ($\lambda2/2$)×M, where M is an integer greater than or equal to one, that is, M=1, 2, 3, . . . , and $\lambda2$ is the effective wavelength of electromagnetic waves propagated in the support substrate 20. When n2 denotes the refractive index of the support substrate 20, c denotes the speed of light, and fc denotes the center frequency of electromagnetic waves, $\lambda2$ is (1/n2)×(c/fc). Electromagnetic waves perform free end reflection in the interface between the support substrate 20 and the space of the back short part 137. When the thickness d2 of the support substrate 20 is set as described above, the phases are aligned with each other.

The back short part 137 may have a thickness d3 that is equal to ($\lambda/4$)+($\lambda/2$)×M, where M is an integer that is greater than or equal to zero, that is, M=0, 1, 2, . . . , and $\Delta$ is the wavelength of electromagnetic waves emitted by the terahertz element 50. When the thickness d1 of the terahertz element 50, the thickness d2 of the support substrate 20, and the thickness d3 of the back short part 137 are set as described above, the phases are aligned with each other.

Effects

The terahertz device 10 of the present embodiment has the following advantages in addition to the advantages of the first embodiment.

(4-1) The waveguide 100 includes the shorting portion 130 disposed at the side of the element back surface 52 of the terahertz element 50. The shorting portion 130 includes the back short part 137 that is recessed from the main surface 131 toward the back surface 132. In this structure, the electromagnetic waves emitted from the element back surface 52 of the terahertz element 50 are reflected on the bottom surface 137a of the back short part 137 and emitted to the transmission region 38 of the waveguide 100. This increases the output of the electromagnetic waves emitted from the terahertz device 10. Thus, the antenna gain of the terahertz device 10 is improved.

(4-2) The thickness d1 of the terahertz element 50, the thickness d2 of the support substrate 20, and the thickness d3 of the back short part 137 are set taking into consideration the phases determined by the optical path length of electromagnetic waves. In this structure, the phases of electromagnetic waves that are emitted toward the transmission region 38 are aligned. Thus, the terahertz element 50 is efficiently coupled to the waveguide 100.

Modified Examples

The embodiments exemplify, without any intention to limit, applicable forms of a terahertz device according to the present disclosure. The terahertz device according to the present disclosure may be applicable to forms differing from the above embodiments. In an example of such a form, the structure of the embodiments is partially replaced, changed, or omitted, or a further structure is added to the embodiments. The modified examples described below may be combined with one another as long as there is no technical inconsistency. In the modified examples, the same reference characters are given to those components that are the same as the corresponding components of the above embodiment. Such components will not be described in detail.

In the first embodiment, the shape of the reflection surface 47a of the reflector 40 may be changed in any manner. The reflection surface 47a may include a flat inclined surface instead of a paraboloid of revolution and an aspherical recessed curved surface. The inclined surface is inclined from the side surface 44 of the reflector 40 to the side surface 43 as the inclined surface extends from the back surface 42 of the reflector 40 toward the main surface 41. Alternatively, the reflection surface 47a may include a spherical recessed curved surface.

In the first embodiment, the size of the reflection portion 47 may be changed in any manner. The reflection portion 47 may cover at least the entirety of the through hole 37 in the waveguide 30. More specifically, the distal end 47b of the reflection portion 47 may be disposed so as not to intersect the imaginary line LV (refer to FIG. 4) extending from the through hole 37.

Figure 24:
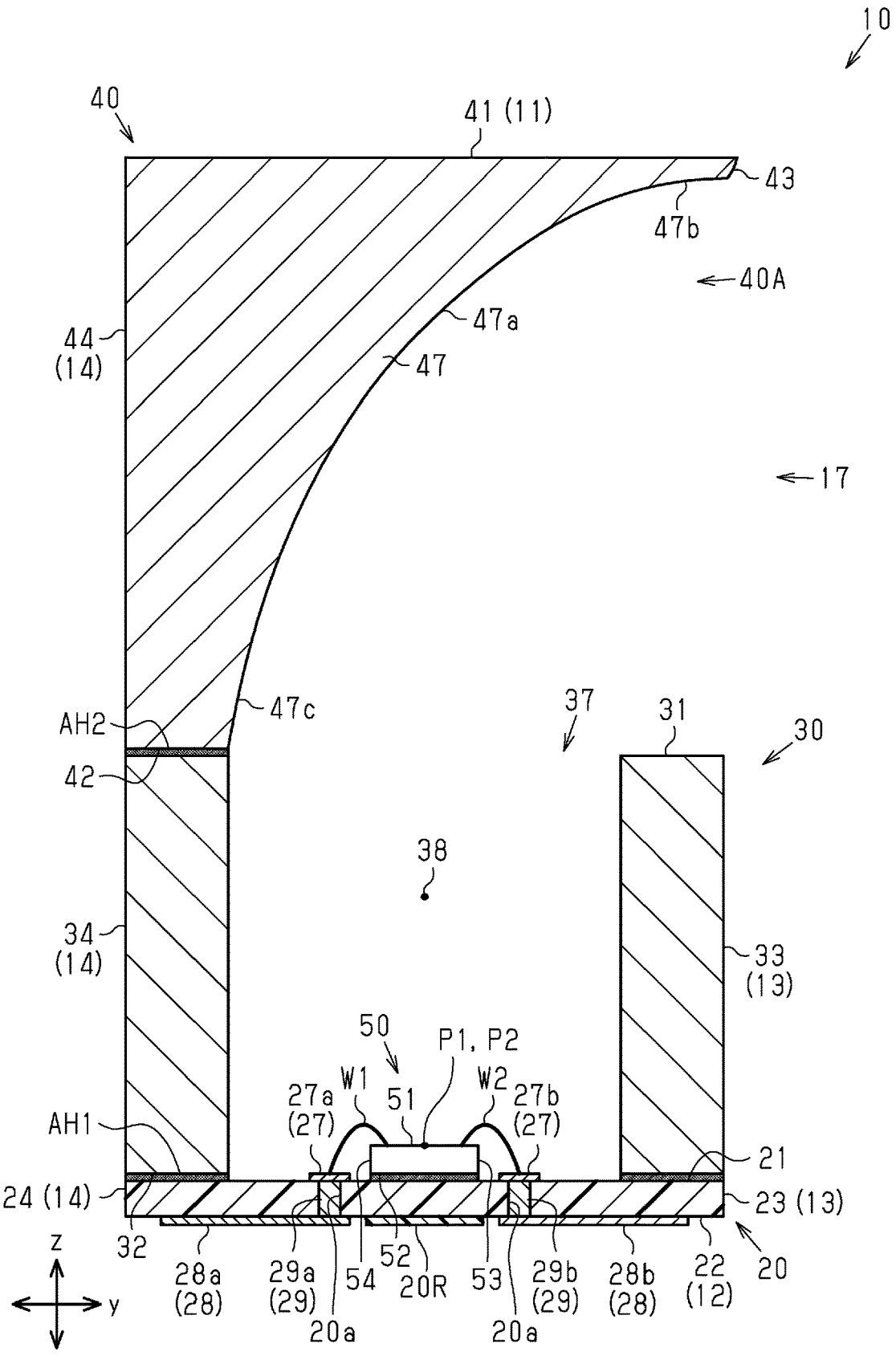
FIG. 24 is an end view showing an end structure of a modified example of a terahertz device.

In the first embodiment, the shape of the through hole 37 in the waveguide 30 may be changed in any manner. In an example, as shown in FIG. 24, the diameter of the through hole 37 may be constant in the z-direction instead of being tapered. Also, the waveguides 30 and 100 of the second to fourth embodiments may be changed in the same manner.

Figure 25:
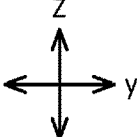
FIG. 25 is an end view showing an end structure of a modified example of a terahertz device.

In the first embodiment, as shown in FIG. 25, the waveguide 30 may be omitted from the terahertz device 10. In this case, the reflector 40 is mounted on the substrate main surface 21 of the support substrate 20. In an example, the reflector 40 is attached to the substrate main surface 21 by, for example, an adhesive. Thus, the second adhesive layer AH2 is formed between the back surface 42 of the reflector 40 and the substrate main surface 21. The reflection surface 47a of the reflector 40 is formed to cover the entirety of the element main surface 51 of the terahertz element 50. In other words, the reflection surface 47a is formed to reflect all of the electromagnetic waves emitted from the terahertz element 50.

In FIG. 25, the device opening 17 of the terahertz device 10 is defined by the reflector 40 and the support substrate 20. More specifically, in the terahertz device 10 shown in FIG. 25, the opening 40A of the reflector 40 is defined by the distal end 47b of the reflection surface 47a, and the device opening 17 is defined by the distal end 47b and the substrate main surface 21 of the support substrate 20. In other words, the device opening 17 is a region between the distal end 47b and the substrate main surface 21 of the support substrate 20.

This structure obtains the advantage (1-1) of the first embodiment and decreases the height of the terahertz device 10 as a result of omission of the waveguide 30. Also, in the terahertz device 10 of the fourth embodiment, the waveguide 30 may be omitted from the terahertz device 10.

Figure 26:
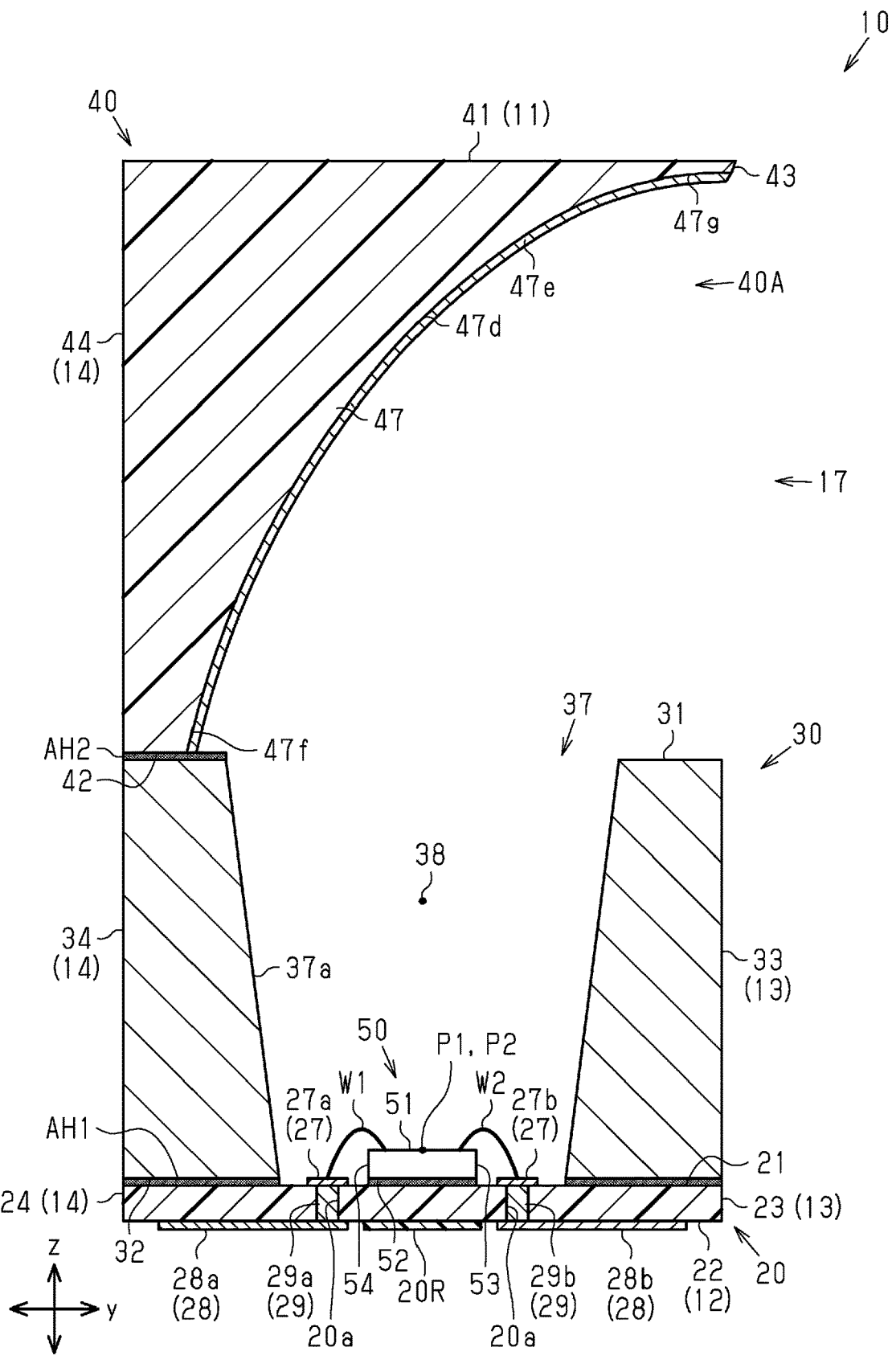
FIG. 26 is an end view showing an end structure of a modified example of a terahertz device.

In the first embodiment, the reflector 40 is formed from a conductive material that is non-transmissive to electromagnetic waves. However, there is no limit to such a configuration. In an example, as shown in FIG. 26, the reflector 40 may be formed from a material that is transmissive to electromagnetic waves. In this case, a recessed surface 47d is formed as the same paraboloid of revolution as the reflection surface 47a of the first embodiment, and a conductive film 47e is formed on the recessed surface 47d and is formed from a conductive material non-transmissive to electromagnetic waves. That is, the surface of the conductive film 47e includes a reflection surface that reflects electromagnetic waves. In the illustrated example, the conductive film 47e is formed on the recessed surface 47d from a basal end 47f, which is an end located at the back surface 42 of the reflector 40, to a distal end 47g, which is an end located at the side surface 43 of the reflector 40.

In the terahertz device 10 shown in FIG. 26, the opening 40A of the reflector 40 is defined by the conductive film 47e formed on the distal end 47g. The device opening 17 is defined by the conductive film 47e formed on the distal end 47g and the pipe main surface 31 of the waveguide 30. In other words, the device opening 17 is a region between the conductive film 47e formed on the distal end 47g and the pipe main surface 31 of the waveguide 30.

As shown in FIG. 26, the conductive film 47e formed on the basal end 47f is located outward from the wall surface of the waveguide 30 defining the opening of the through hole 37 corresponding to the pipe main surface 31 in a direction orthogonal to the z-direction. That is, the reflection surface of the reflector 40 is located outward from the through hole 37 of the waveguide 30 in a direction orthogonal to the z-direction.

In the direction orthogonal to the z-direction, if the reflection surface of the reflector 40 is located inward from the through hole 37 of the waveguide 30, that is, if the back surface 42 of the reflector 40 partially covers the through hole 37, some of the electromagnetic waves emitted from the terahertz element 50 will be reflected on the back surface 42 of the reflector 40 and fail to exit the terahertz device 10. Also, the reflectors 40 and 90 of the second to fourth embodiments may be changed in the same manner.

Figure 27:
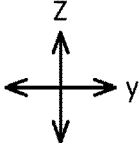
FIG. 27 is an end view showing an end structure of a modified example of a terahertz device.

In the modified example shown in FIG. 25, as shown in FIG. 27, the reflector 40 may be changed in structure to a reflector 40 such as that shown in FIG. 26. More specifically, the reflector 40 is formed from a material that is transmissive to electromagnetic waves, and the conductive film 47e is formed on the recessed surface 47d of the reflector 40. Also, the reflector 40 of the fourth embodiment may be changed in the same manner.

In FIG. 27, the device opening 17 of the terahertz device 10 is defined by the reflector 40 and the support substrate 20. More specifically, in the terahertz device 10 shown in FIG. 27, the opening 40A of the reflector 40 is defined by the conductive film 47e formed on the distal end 47g. The device opening 17 is defined by the conductive film 47e formed on the distal end 47g and the substrate main surface 21 of the support substrate 20. In other words, the device opening 17 is a region between the conductive film 47e formed on the distal end 47g and the substrate main surface 21 of the support substrate 20.

Figure 28:
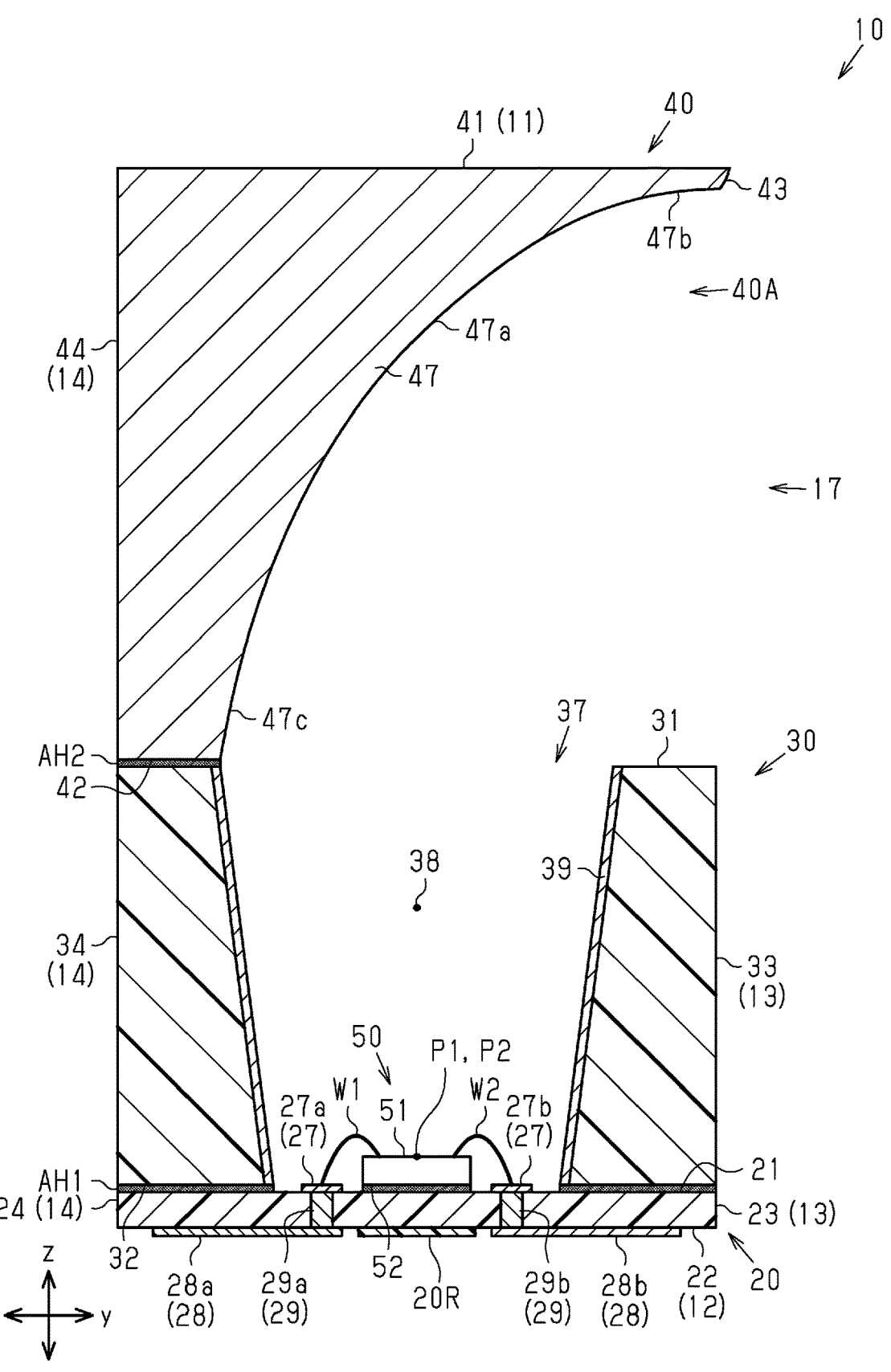
FIG. 28 is an end view showing an end structure of a modified example of a terahertz device.

In the first embodiment, the waveguide 30 is formed from a conductive material that is non-transmissive to electromagnetic waves. However, there is no limit to such a configuration. In an example, as shown in FIG. 28, the waveguide 30 may be formed from a material that is transmissive to electromagnetic waves. In this case, a conductive film 39 is formed on the wall surface of the waveguide 30 defining the through hole 37 and is formed from a conductive material that is non-transmissive to electromagnetic waves. Thus, electromagnetic waves emitted from the terahertz element 50 are reflected on the conductive film 39 and propagated toward the reflection surface 47a of the reflector 40.

Figure 29:
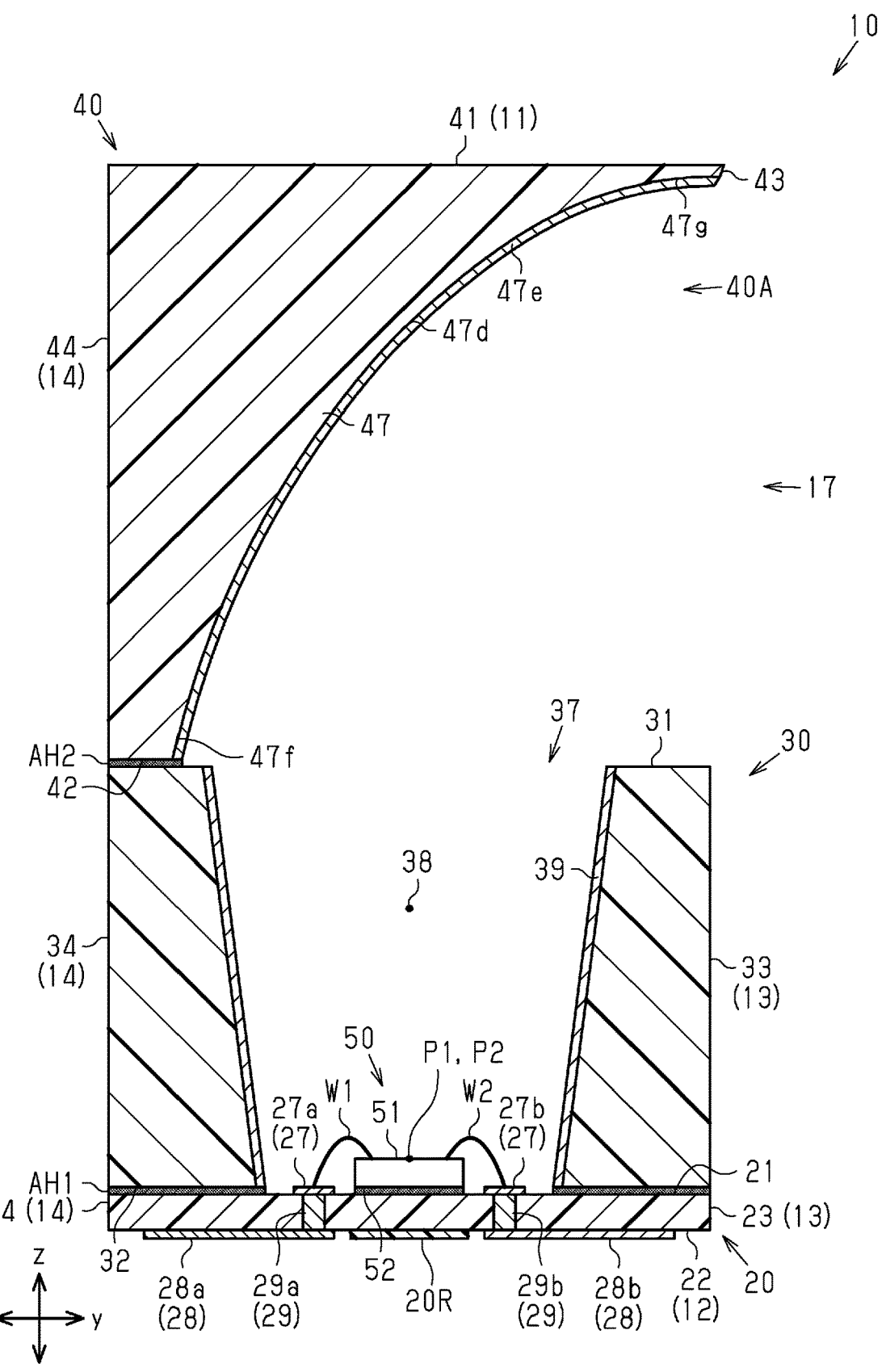
FIG. 29 is an end view showing an end structure of a modified example of a terahertz device.

In a modified example of the embodiment of FIG. 28, as shown in FIG. 29, the reflector 40 may be changed in structure to a reflector 40 such as that shown in FIG. 26. More specifically, the reflector 40 is formed from a material that is transmissive to electromagnetic waves, and the conductive film 47e is formed on the recessed surface 47d of the reflector 40.

In the first embodiment, the waveguide 30 and the reflector 40 may be formed integrally. In this case, the waveguide 30 and the reflector 40 are formed integrally as a single member. In the same manner, the waveguide 100 and the reflector 40 of the fourth embodiment may be formed integrally.

Figure 30:
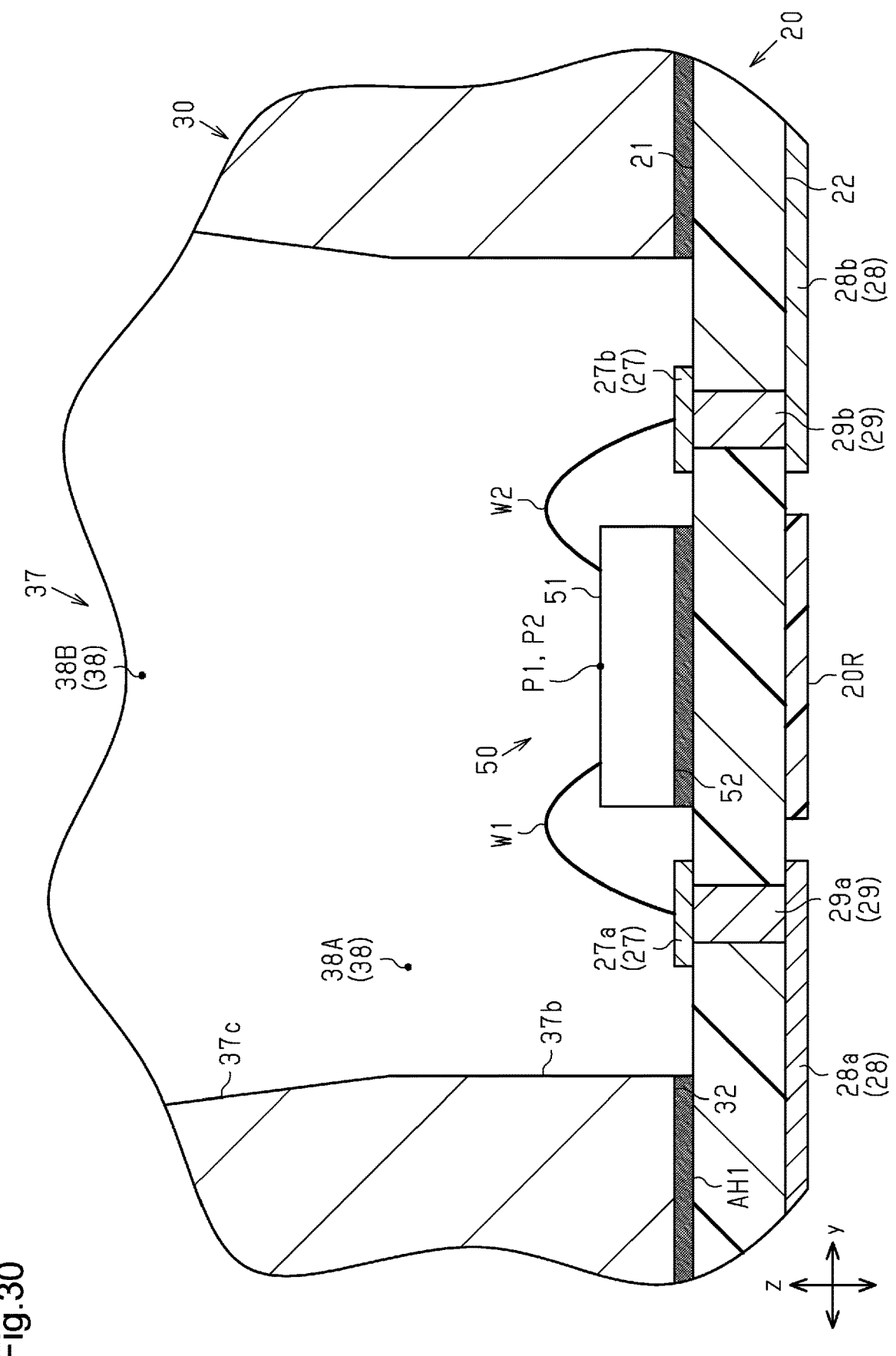
FIG. 30 is an enlarged end view showing an end structure of a modified example of a terahertz device including a terahertz element and its surrounding.

In the first embodiment, the shape of the through hole 37 in the waveguide 30 may be changed in any manner. In an example, as shown in FIG. 30, the through hole 37 has a first inner part 37b, the diameter of which is constant in the z-direction, and a tapered second inner part 37c, the diameter of which is increased from the first inner part 37b toward the pipe main surface 31. In other words, the transmission region 38 includes a first transmission region 38A, which is constant as viewed in the z-direction, and a second transmission region 38B, which enlarges from the first transmission region 38A toward the pipe main surface 31 as viewed in the z-direction.

The first inner part 37b is located adjacent to the support substrate 20 in the z-direction. Thus, the terahertz element 50 is accommodated in the first inner part 37b. In other words, the terahertz element 50 is disposed in the first transmission region 38A. In the illustrated example, the element main surface 51 of the terahertz element 50 is located closer to the substrate main surface 21 of the support substrate 20 than the second inner part 37c.

In the second embodiment, the waveguide 30 and the reflector 40 may be fixed by an adhesive. Alternatively, the waveguide 30 and the reflector 40 may be joined through a thermal process or the like. That is, the reflector 40 may be fixed to the waveguide 30 in a non-removable manner.

In the second embodiment, the first attachment portion 49A and the second attachment portion 49B of the reflector 40 may be formed separately. More specifically, an attachment portion that attaches the reflector 40 to the waveguide 30 of the first embodiment may be provided as a component separate from the reflector 40 and the waveguide 30. In this case, the attachment 49 may be omitted from the reflector 40. The waveguide 30 may include an attachment that attaches the reflector 40. In this case, the attachment 49 may be omitted from the reflector 40.

In the second embodiment, the second attachment portion 49B may be omitted from the attachment 49 of the reflector 40. In this case, the basal end 47c of the reflection surface 47a is joined to the back surface 42 of the reflector 40. Thus, when the reflector 40 is attached to the waveguide 30, the reflection surface 47a is joined to the pipe main surface 31 of the waveguide 30 by the second adhesive layer AH2.

In the second embodiment, the waveguide 100 may be used instead of the waveguide 30. That is, the terahertz device 10 of the second embodiment may include the shorting portion 130. In other words, the reflector 40 of the terahertz device 10 of the fourth embodiment may be changed to the reflector 40 of the second embodiment.

In the third embodiment, a waveguide may be disposed between the support substrate 80 and the reflector 90 in the z-direction. The waveguide is formed from a conductive material that is non-transmissive to electromagnetic waves and has the form of a rectangular frame having a through hole extending through the waveguide in the z-direction. The space defined in the through hole serves as a transmission region through which electromagnetic waves are transmitted from the terahertz elements 50. The terahertz elements 50 are disposed in the transmission region. In other words, the waveguide accommodates the terahertz elements 50. The waveguide is attached to the substrate main surface 81 of the support substrate 80 by, for example, an adhesive. The reflector 90 is fixed to the waveguide by, for example, an adhesive. In this case, the attachment 90B may be omitted from the reflector 90.

Instead of attaching the reflector 90 and the waveguide by an adhesive, the reflector 90 and the waveguide may be attached in a removable manner. In an example, the reflector 90 may include an attachment that is removably attached to the waveguide in the same manner as the reflector 40 of the second embodiment.

In the third embodiment, the perpendicular surface 99 may be omitted from the reflector 90. In this case, the reflection surface 98 is joined to the back surface 92 of the reflector 90. Thus, when the reflector 90 is attached to the support substrate 80, the reflection surface 98 is joined to the substrate main surface 81 of the support substrate 80.

In the third embodiment, instead of the pin headers, external terminals may be disposed on the substrate back surface 82 of the support substrate 80. The external terminals include, for example, a conductive layer formed on the substrate back surface 82. The conductive layer is formed of, for example, a copper foil. The external terminals are connected to the main conductors 88A and the ground conductor 88C by plated through holes or filled vias. Thus, for example, when the modified example of the terahertz device 10 is mounted on a circuit substrate, the terahertz device 10 may be surface-mounted on the circuit substrate.

In the third embodiment, the main conductors 88A and the ground conductor 88C extend to a position closer to the substrate side surface 83 than the reflector 90. In other words, the main conductors 88A and the ground conductor 88C extend to the outside of the reflector 90. However, there is no limit to this structure. As viewed in the z-direction, the conductive parts 88p and 88q of the main conductors 88A and the ground conductor 88C may be disposed closer to the substrate side surface 84 than the side surface 93 of the reflector 90. This structure reduces the lengths of the main conductors 88A and the ground conductor 88C, thereby shortening a conductive path extending from each the terahertz element 50 to the external terminal. This reduces inductance caused by the length of the conductive paths.

In the third embodiment, a partition wall may be arranged at the reflector 90. In an example, the reflector 90 includes partition walls (not shown) that separate the terahertz elements 50 located adjacent to each other in the x-direction. The partition walls extend downward from the reflection surface 98 of the reflector 90. The partition walls each have a distal surface in the z-direction that is in contact with the substrate main surface 81 of the support substrate 80. An adhesive layer may be formed between the distal surface of the partition wall and the substrate main surface 81. The layout position of the partition walls may be changed in any manner. In an example, the partition walls may separate a plurality of the terahertz elements 50 from another plurality of terahertz elements 50 in the x-direction.

In the fourth embodiment, the body portion 120 may be omitted from the waveguide 30. In this case, instead of using an SMP connector as the connector 140, a connector that is mountable on the support substrate 80 may be used.

In the fourth embodiment, the terahertz element 50 is mounted on the substrate main surface 21 of the support substrate 20. Instead, the terahertz element 50 may be mounted on the substrate back surface 22 of the support substrate 20. In this case, the terahertz element 50 emits electromagnetic waves toward the shorting portion 130. The electromagnetic waves are reflected on the shorting portion 130, propagated through the support substrate 20, the body portion 120, and the antenna portion 110, and reflected on the reflection surface 47a of the reflector 40. The reflected electromagnetic waves are propagated in the y-direction and exit the terahertz device 10.

In the first, second, and fourth embodiments, the contour of the waveguides 30 and 100 may be changed in any manner. In an example, the contour of the waveguides 30 and 100 as viewed in the z-direction may be rectangular so that the long sides extend in one of the x-direction and the y-direction and the short sides extend in the other one of the x-direction and the y-direction, instead of being square. Alternatively, the counter of the waveguides 30 and 100 as viewed in the z-direction may be circular, elliptical, oval (the form of an athletic track), or polygonal, instead of being rectangular. In the second embodiment, the shape of the attachment 49 may be changed in accordance with the contour of the waveguide 30.

In the waveguides 30 and 100 of the first, second, and fourth embodiments, the transmission region 38 is defined by a circular waveguide. Instead, a rectangular waveguide may be used so that the shape of the transmission region (the through holes 37 and 127) is rectangular as viewed in the z-direction.

Figure 31:
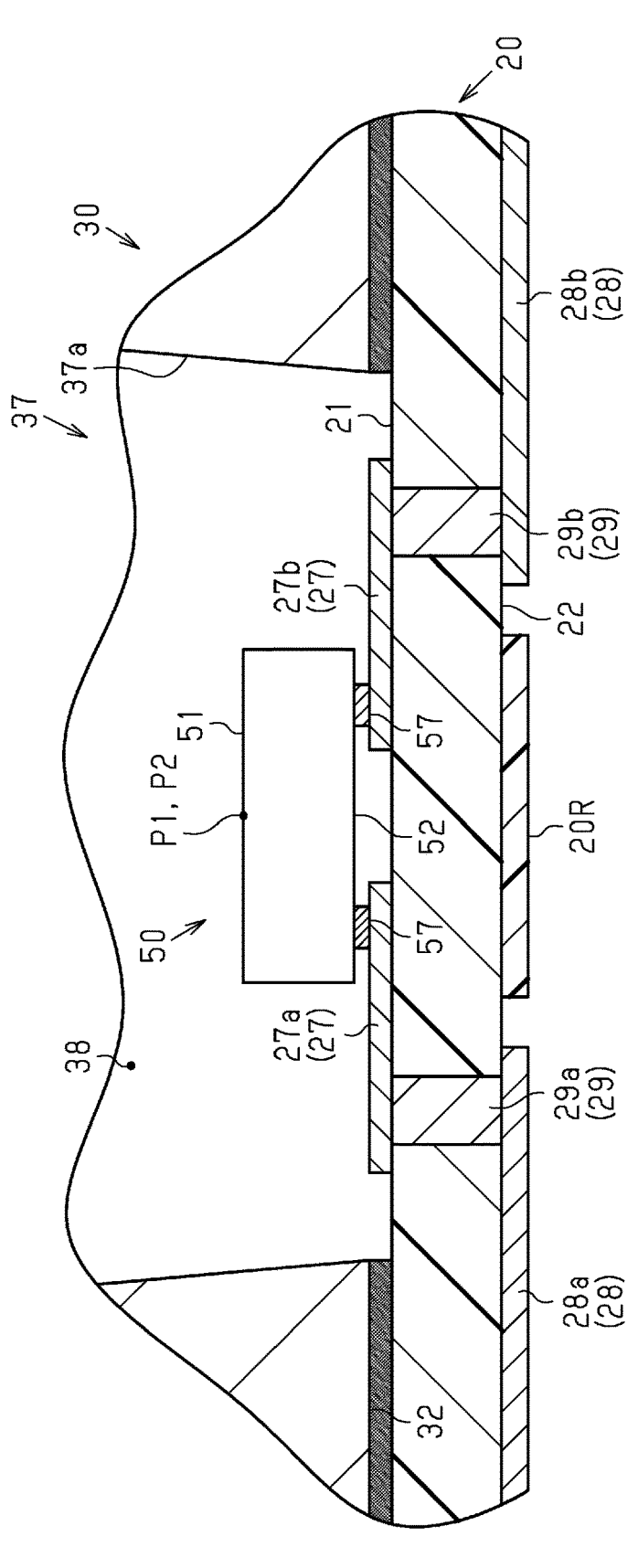
FIG. 31 is an enlarged end view showing an end structure of a modified example of a terahertz device including a terahertz element and its surrounding.
Figure 31:
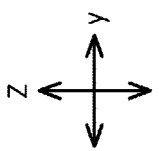

In each embodiment, the terahertz element 50 and the power supply line 27 (the power supply line 88) are connected by the wires W1 and W2. However, the connection structure may be changed in any manner. In an example, as shown in FIG. 31, the terahertz element 50 may be flip-chip-mounted on the power supply line 27. More specifically, bumps 57 are arranged on the element back surface 52 of the terahertz element 50. In the illustrated example, the bumps 57 protrude from the element back surface 52 toward the substrate main surface 21 of the support substrate 20. In the z-direction, the power supply line 27 is opposed to the bumps 57 in the z-direction.

In this structure, the conductive path between the terahertz element 50 and the power supply line 27 (the power supply line 88) is shortened as compared to the wires W1 and W2. Thus, signals are transmitted at a higher speed. In addition, the propagation mode in the waveguides 30 and 100 is less affected by wires connecting the terahertz element 50 and the support substrate 20.

In each embodiment, the terahertz element 50 may be at least partially embedded in the support substrates 20 and 80. This structure shortens the wires W1 and W2, which connect the terahertz element 50 to the support substrates 20 and 80, thereby increasing the transmission speed of signals. From the viewpoint for shortening the wires W1 and W2, it is preferred that the element main surface 51 of the terahertz element 50 is flush with the substrate main surfaces 21 and 81 of the support substrates 20 and 80.

In the first, second, and fourth embodiments, a reflection film may be formed on the substrate main surfaces 21 and 81 of the support substrates 20 and 80 to reflect electromagnetic waves. The reflection film may be formed of, for example, Cu. The reflection film is, for example, continuously connected to the ground conductor 27b. In this case, the reflection film causes electromagnetic waves to perform a fixed end reflection. This results in a π phase shift. When the wavelength of electromagnetic waves in the terahertz element 50 is denoted by Δ1, the dimension of the terahertz element 50 in the z-direction may be (λ1/4)+(integer multiple of (λ1/2)).

The reflection film may be formed on, for example, the terahertz element 50. In an example, in the element substrate 61, the reflection film is formed on the element back surface 52, which is located opposite to the element main surface 51 on which the active element 62 is mounted. The reflection film includes, for example, Au/Ti, Au/Pd/Ti, and the like. The reflection film may be formed on each of the substrate main surface 21 of the support substrate 20 and the element back surface 52 of the terahertz element 50.

In each embodiment, the terahertz element 50 may convert incident electromagnetic waves in the terahertz band into electrical energy. In other words, the terahertz element 50 receives electromagnetic waves in the terahertz band and converts the electromagnetic waves into electrical energy. Thus, the terahertz element 50 detects terahertz waves. A terahertz device 10 that includes a terahertz element 50 configured to receive and detect electromagnetic waves in the terahertz band will be specifically described using the terahertz device 10 of the first embodiment.

The active element 62 of the terahertz element 50 converts incident electromagnetic waves in the terahertz band (terahertz waves) into electrical energy. Thus, the terahertz element 50 receives terahertz waves with the antenna 65 and detects the terahertz waves with the active element 62. Therefore, the antenna 65 may be referred to as a reception point that receives terahertz waves and also a resonance point that is resonated by terahertz waves. Thus, the terahertz element 50 includes a reception point and a detection point in the center of the element main surface 51. In this case, the power supply line 27 formed on the support substrate 20 serves as a transmission line that outputs the electrical energy converted by the terahertz element 50 as an electrical signal to the outside of the terahertz device 10.

In addition, the terahertz element 50 may be configured to perform both generation and detection of terahertz waves, and the active element 62 may be referred to as the generation point and the detection point. In this case, the power supply line 27 formed on the support substrate 20 serves as a line that provides a high-frequency electric signal so that the terahertz element 50 emits electromagnetic waves and as a transmission line that outputs electrical energy converted by the terahertz element 50 as an electronic signal to the outside of the terahertz device 10.

In the first and second embodiments, when electromagnetic waves in the terahertz band are propagated in a direction intersecting the thickness-wise direction of the terahertz element 50 (the z-direction) and received from the outside of the terahertz device 10 toward the device opening 17 of the terahertz device 10, the electromagnetic waves propagated through the device opening 17 are reflected on the reflection surface 47a of the reflector 40. The electromagnetic waves reflected on the reflection surface 47a are propagated toward the support substrate 20, that is toward the terahertz element 50, through the transmission region 38. The terahertz element 50 receives the electromagnetic waves reflected on the reflection surface 47a. When the terahertz element 50 receives electromagnetic waves, the device opening 17 may be referred to as an incident portion through which electromagnetic waves are input into the terahertz element 50 from the outside.

In this structure, when electromagnetic waves are propagated through the device opening 17 in a direction (the y-direction) intersecting the thickness-wise direction of the terahertz element 50, the electromagnetic waves are reflected on the reflection surface 47a of the reflector 40 and propagated toward the terahertz element 50. This improves the antenna gain of electromagnetic waves propagated in a direction intersecting the thickness-wise direction of the terahertz element 50.

In comparison with the terahertz device 10X of the comparative example shown in FIG. 11, when receiving and detecting electromagnetic waves, the terahertz element 50 receives and detects electromagnetic waves that are transmitted from the outside of the terahertz device 10 through the support substrate 210 and are reflected on the reflection surface 205 of the concaved portion 204. When electromagnetic waves are received from the outside of the terahertz device 10X, the received electromagnetic waves are reflected on the reflection surface 205 toward the element main surface 51 of the terahertz element 50. Thus, electromagnetic waves are appropriately received by the terahertz element 50.

In the terahertz device 10X of the comparative example, some of the incident electromagnetic waves from the outside of the terahertz device 10X toward the reflection surface 205 may strike the power supply line 213 and may not be received by the reflection surface 205. Since the power supply line 213 is disposed on the path through which the electromagnetic waves are input from the outside of the terahertz device 10X to the inside, the electromagnetic waves are blocked by the power supply line 213.

To solve this shortcoming, in the terahertz device 10, as shown in FIG. 4, the terahertz element 50 is mounted on the substrate main surface 21 of the support substrate 20, on which the power supply line 27 is formed. Thus, the element main surface 51 of the terahertz element 50 is located closer to the reflector 40 than the power supply line 27 in the z-direction. In other words, the power supply line 27 is formed at a side of the terahertz element 50 opposite from the element main surface 51 in the incident direction of the electromagnetic waves. That is, the power supply line 27 is not disposed on the path through which electromagnetic waves are propagated from the outside of the terahertz device 10 to the inside. Thus, blocking of the electromagnetic wave by the power supply line 27 is avoided.

In the third embodiment, when electromagnetic waves are input from the outside of the terahertz device 10 to the terahertz device 10, electromagnetic waves are input through the opening 97 and reflected on the reflection surface 98 toward the substrate main surface 81. The terahertz elements 50, which are mounted on the substrate main surface 81, receive the electromagnetic waves reflected on the reflection surface 98. At this time, the reflection of the electromagnetic waves on the reflection surface 98 increases the directivity of electromagnetic waves. Thus, antenna gain is improved.

In each embodiment, the generation point P1 and the emission point P2 of the terahertz element 50 may be disposed on different positions. For example, the generation point P1 may be disposed between the antenna 65 (the emission point P2) and the first pad electrode 63c and the second pad electrode 64c. In the same manner, the reception point and the detection point of the terahertz element 50 may be disposed on different positions. For example, the detection point may be disposed between the antenna 65 (the reception point) and the first pad electrode 63c and the second pad electrode 64c.

CLAUSES

The technical aspects that are understood from the embodiments and the modified examples will be described below.

A1. A terahertz device, including:

a terahertz element including an element main surface and an element back surface that face in opposite directions and emitting an electromagnetic wave in a terahertz band, the terahertz element having a thickness-wise direction that is orthogonal to the element main surface; and a reflector spaced apart and opposed to the element main surface in the thickness-wise direction and including a reflection surface, wherein when the terahertz element emits an electromagnetic wave in the thickness-wise direction, the reflection surface reflects the electromagnetic wave in a direction intersecting the thickness-wise direction.

A2. The terahertz device according to clause A1, wherein the terahertz element includes an active element disposed on the generation point, and the active element performs conversion between the electromagnetic wave and the electrical energy.

A3. The terahertz device according to clause A2, wherein the terahertz element includes an antenna connected to the active element, and an emission direction in which the antenna emits the electromagnetic wave conforms to a direction that is orthogonal to the element main surface and toward the reflection surface.

A4. The terahertz device according to clause A2, wherein the active element includes at least one of a resonant tunneling diode, a TUNNETT diode, an IMPATT diode, a GaAs-base field effect transistor, a GaN-base FET, a high electron mobility transistor, and a hetero-junction bipolar transistor.

A5. The terahertz device according to clause A3, wherein the antenna includes at least one of a dipole antenna, a biconical antenna, a slot antenna, a patch antenna, and a loop antenna.

A6. The terahertz device according to any one of clauses A1 to A5, further including:

a support substrate including a substrate main surface, wherein the terahertz element is mounted on the substrate main surface so that the element main surface and the substrate main surface face in the same direction, and the substrate main surface includes a transmission line connected to the terahertz element.

A7. The terahertz device according to clause A6, wherein the terahertz element is connected to the transmission line by a wire.

A8. The terahertz device according to clause A6, wherein the terahertz element is connected to the transmission line by a bump.

A9. The terahertz device according to any one of clauses A6 to A8, wherein the transmission line includes at least one of a coplanar line, a microstrip line, a strip-line, and a slotline.

A10. The terahertz device according to any one of clauses A1 to A9, further including:

a support substrate on which the terahertz element is mounted; and a waveguide mounted on the support substrate and including a transmission region through which the electromagnetic wave transmits, wherein the terahertz element includes a generation point that generates the electromagnetic wave and an emission point that emits the electromagnetic wave, the generation point and the emission point are disposed on the element main surface, and the emission point is disposed in a center of the transmission region.

A11. The terahertz device according to any one of clauses A1 to A11, further including:

a support substrate including a substrate main surface; and a waveguide mounted on the substrate main surface and including a transmission region through which the electromagnetic wave transmits, wherein the terahertz element is mounted on the substrate main surface so that the element main surface and the substrate main surface face in the same direction in the transmission region, the reflector is disposed on the waveguide so that the reflector and the support substrate are disposed at opposite sides of the waveguide, and the waveguide is formed from a conductive material that is non-transmissive to the electromagnetic wave.

A12. The terahertz device according to any one of clauses A1 to A11, further including:

a support substrate including a substrate main surface; and a waveguide mounted on the substrate main surface and including a transmission region through which the electromagnetic wave transmits, wherein the reflector is disposed on the waveguide so that the reflector and the support substrate are disposed at opposite sides of the waveguide, the waveguide includes a through hole, the through hole extends through the waveguide in the thickness-wise direction and defines the transmission region, the waveguide is formed from a material that is transmissive to the electromagnetic wave, the terahertz element is mounted on the substrate main surface so that the element main surface and the substrate main surface face in the same direction in the through hole in the transmission region, and a conductive film is formed on a wall surface that defines the through hole and formed from a conductive material that is non-transmissive to the electromagnetic wave.

A13. The terahertz device according to any one of clauses A1 to A12, further including:

a reflection portion disposed at the element back surface of the terahertz element to reflect the electromagnetic wave.

A14. The terahertz device according to clause A13, further including:

a support substrate including a substrate main surface; and a waveguide mounted on the support substrate and including a transmission region through which the electromagnetic wave transmits, wherein the terahertz element is mounted on the substrate main surface so that the element main surface and the substrate main surface face in the same direction in the transmission region, the waveguide includes a body portion forming the transmission region and a shorting portion that forms a short-circuit at one end of the transmission region, and the reflection portion includes a bottom surface of a recess formed in the shorting portion.

A15. The terahertz device according to any one of clauses A1 to A10, further including:

a support substrate including a substrate main surface; and a waveguide mounted on the substrate main surface and including a transmission region through which the electromagnetic wave transmits, wherein the terahertz element is mounted on the substrate main surface so that the element main surface and the substrate main surface face in the same direction in the transmission region, the reflector is removably attached to the waveguide so that the reflector and the support substrate are disposed at opposite sides of the waveguide, and the reflector includes a step that is in contact with the waveguide in the thickness-wise direction.

A16. The terahertz device according to any one of clauses A1 to A10, further including:

a support substrate on which the terahertz element is mounted; and a waveguide mounted on the support substrate and including a transmission region through which the electromagnetic wave transmits, wherein the reflector is disposed on the waveguide so that the reflector and the support substrate are disposed at opposite sides of the waveguide, the waveguide includes a through hole, the through hole extends through the waveguide in the thickness-wise direction and defines the transmission region, the terahertz element is mounted on the substrate main surface so that the element main surface and the substrate main surface face in the same direction in the through hole in the transmission region, the reflection surface includes an end located close to the waveguide, defining a basal end, and as viewed in the thickness-wise direction, the basal end is located at the same position as a wall surface defining the through hole or at an outer side of the wall surface.

B1. A terahertz device, including:

a terahertz element including an element main surface and an element back surface that face in opposite directions, the terahertz element receiving and detecting an electromagnetic wave in a terahertz band, the terahertz element having a thickness-wise direction that is orthogonal to the element main surface; and a reflector including an opening that is open in a direction intersecting the thickness-wise direction and a reflection surface spaced apart and opposed to the element main surface in the thickness-wise direction, wherein when an electromagnetic wave is propagated through the opening from outside the terahertz device, the reflection surface reflects the electromagnetic wave toward the terahertz element.

B2. The terahertz device according to clause B1, wherein the terahertz element includes a reception point that receives the electromagnetic wave and a detection point that detects the electromagnetic wave, and the reception point and the detection point are disposed on the element main surface.

B3. The terahertz device according to clause B2, wherein the terahertz element includes an active element disposed on the detection point, and the active element performs conversion between the electromagnetic wave and electrical energy.

B4. The terahertz device according to clause B3, wherein the terahertz element includes an antenna that is connected to the active element, and a reception direction in which the antenna receives the electromagnetic wave conforms to the thickness-wise direction.

B5. The terahertz device according to clause B3 or B4, wherein the active element includes at least one of a resonant tunneling diode, a TUNNETT diode, an IMPATT diode, a GaAs-base field effect transistor, a GaN-base FET, a high electron mobility transistor, and a heterojunction bipolar transistor.

B6. The terahertz device according to clause B4, wherein the antenna includes at least one of a dipole antenna, a biconical antenna, a slot antenna, a patch antenna, and a loop antenna.

B7. The terahertz device according to any one of clauses B1 to B6, wherein the thickness-wise direction is referred to as a z-direction, a direction in which the electromagnetic wave is reflected and orthogonal to the z-direction is referred to as a y-direction, the reflection surface is curved toward the y-direction as the reflection surface extends away from the terahertz element in the z-direction, the reflection surface includes two ends in the z-direction, defining a basal end and a distal end, the distal end being located farther from the terahertz element than the basal end, and the reflection surface has a curved shape that is set by $y=z^2/4f$ that is y and z coordinates on a y-z plane specified in the z-direction and the y-direction, where f denotes a distance between the basal end and an emission point of the terahertz element, which emits the electromagnetic wave, in a direction orthogonal to the z-direction.

B8. The terahertz device according to any one of clauses B1 to B7, wherein the reflection surface includes a paraboloid of revolution.

B9. The terahertz device according to any one of clauses B1 to B8, further including:

a support substrate including a substrate main surface; and a waveguide mounted on the substrate main surface and including a transmission region through which the electromagnetic wave transmits, wherein the terahertz element is mounted on the substrate main surface so that the element main surface and the substrate main surface face in the same direction in the transmission region, and the reflector is disposed on the waveguide so that the reflector and the support substrate are disposed at opposite sides of the waveguide.

B10. The terahertz device according to clause B9, wherein the reflector and the waveguide are formed separately from each other, and the reflector is attached to the waveguide.

B11. The terahertz device according to clause B10, wherein the reflector is removably attached to the waveguide.

B12. The terahertz device according to any one of clauses B9 to B11, wherein the waveguide includes a through hole, the through hole extends through the waveguide in the thickness-wise direction and defines the transmission region, the terahertz element is disposed in the through hole, and the reflection surface entirely covers the through hole as viewed in the thickness-wise direction.

B13. The terahertz device according to clause B12, wherein the through hole is defined by a wall surface including a tapered surface that widens from the support substrate as the reflector becomes closer, and as viewed in the thickness-wise direction, the reflection surface entirely covers a region that extends from the tapered surface along the tapered surface in the thickness-wise direction.

B14. The terahertz device according to any one of clauses B9 to B13, wherein the waveguide is formed from a conductive material that is non-transmissive to the electromagnetic wave.

B15. The terahertz device according to any one of clauses B9 to B13, wherein the waveguide includes a through hole, the through hole extends through the waveguide in the thickness-wise direction and defines the transmission region, the waveguide is formed from a material that is transmissive to the electromagnetic wave, the terahertz element is mounted on the substrate main surface so that the element main surface and the substrate main surface face in the same direction in the through hole, and a conductive film is formed on a wall surface that defines the through hole and formed from a conductive material that is non-transmissive to the electromagnetic wave.

B16. The terahertz device according to any one of clauses B9 to B15, wherein the terahertz element includes a reception point that receives the electromagnetic wave and a detection point that detects the electromagnetic wave, the reception point and the detection point are disposed on the element main surface, and the detection point is disposed in a center of the transmission region.

B17. The terahertz device according to any one of clauses B1 to B8, further including:

a support substrate including a substrate main surface, wherein the terahertz element is mounted on the substrate main surface so that the element main surface and the substrate main surface face in the same direction, and the reflector is mounted on the substrate main surface.

B18. The terahertz device according to any one of clauses B1 to B8, further including:

a support substrate including a substrate main surface, wherein the terahertz element is mounted on the substrate main surface so that the element main surface and the substrate main surface face in the same direction, and the substrate main surface includes a transmission line connected to the terahertz element.

B19. The terahertz device according to clause B18, wherein the terahertz element is connected to the transmission line by a wire.

B20. The terahertz device according to clause B18, wherein the terahertz element is connected to the transmission line by a bump.

B21. The terahertz device according to any one of clauses B18 to B20, wherein the transmission line includes at least one of a coplanar line, a microstrip line, a stripline, and a slotline.

B22. The terahertz device according to any one of clauses B1 to B8, further including:

a reflection portion disposed at the element back surface of the terahertz element to reflect the electromagnetic wave.

B23. The terahertz device according to clause B22, further including:

a support substrate including a substrate main surface; and a waveguide mounted on the support substrate and including a transmission region through which the electromagnetic wave transmits, wherein the terahertz element is mounted on the substrate main surface so that the element main surface and the substrate main surface face in the same direction in the transmission region, the waveguide includes a body portion forming the transmission region and a shorting portion that forms a short-circuit at one end of the transmission region, and the reflection portion includes a bottom surface of a recess formed in the shorting portion.

B24. The terahertz device according to clause B11, wherein the reflector includes a step that is in contact with the waveguide in the thickness-wise direction.

B25. The terahertz device according to clause B12, wherein the reflection surface includes an end located close to the waveguide, defining a basal end, and, as viewed in the thickness-wise direction, the basal end is located at the same position as a wall surface defining the through hole or at an outer side of the wall surface.

B26. The terahertz device according to any one of clauses B9 to B21 and B23 to B25, wherein the support substrate includes a substrate main surface and a substrate back surface that face in opposite directions, the substrate main surface faces a side at which the reflector is disposed, the terahertz element is mounted on the substrate main surface so that the element main surface and the substrate main surface face in the same direction, and the substrate back surface includes an external terminal electrically connected to the terahertz element.

B27. The terahertz device according to clause B1, wherein the terahertz element includes multiple terahertz elements, and the reflector covers the element main surfaces of the terahertz elements in the thickness-wise direction.

B28. The terahertz device according to clause B27, further including:

a support substrate including a substrate main surface, wherein each of the terahertz elements is mounted on the substrate main surface so that the element main surface and the substrate main surface face in the same direction, each of the terahertz elements includes a main electrode and a ground electrode, the substrate main surface includes a power supply line electrically connected to each of the terahertz elements, the power supply line includes main conductors and a ground conductor, the main conductors are separately electrically connected to the main electrodes of the terahertz elements, and the ground conductor is commonly electrically connected to the ground electrodes of the terahertz elements.

B29. The terahertz device according to any one of clauses B1 to B28, wherein the reflector is formed from a conductive material that is non-transmissive to the electromagnetic wave.

B30. The terahertz device according to any one of clauses B1 to B28, wherein the reflector is formed from a material that is transmissive to the electromagnetic wave, and a conductive film is formed on the reflection surface and formed from a conductive material that is non-transmissive to the electromagnetic wave.

REFERENCE SIGNS LIST 10) terahertz device; 20) support substrate; 21) substrate main surface; 22) substrate back surface; 27) power supply line; 27a) main conductor; 27b, 27c) ground conductor; 28) external terminal; 30) waveguide; 37) through hole; 37a) tapered surface; 38) transmission region; 40) reflector; 40A) opening; 47a) reflection surface; 47b) distal end; 47c) basal end; 47e) conductive film; 50) terahertz element; 51) element main surface; 52) element back surface; 62) active element; 63c) first pad electrode (main electrode); 64c) second pad electrode (ground electrode); 80) support substrate; 81) substrate main surface; 82) substrate back surface; 88) power supply line; 88A) main conductor; 88C) ground conductor; 90) reflector; 97) opening; 98) reflection surface; 98a) distal end; 98b) basal end; 100) waveguide; 130) shorting portion; 137) back short part; P1) generation point; P2) emission point

The invention claimed is:

1. A terahertz device, comprising:

a terahertz element including an element main surface and an element back surface that face in opposite directions and emitting an electromagnetic wave in a terahertz band, the terahertz element having a thickness-wise direction that is orthogonal to the element main surface; and a reflector spaced apart and opposed in the thickness-wise direction to the element main surface and including a reflection surface, wherein when the terahertz element emits an electromagnetic wave in the thickness-wise direction, the reflection surface reflects the electromagnetic wave in a direction intersecting the thickness-wise direction, and the reflection surface includes a paraboloid of revolution.

2. The terahertz device according to claim 1, wherein the terahertz element includes a generation point that generates the electromagnetic wave and an emission point that emits the electromagnetic wave, and the generation point and the emission point are disposed on the element main surface.

3. The terahertz device according to claim 1, wherein the thickness-wise direction is referred to as a z-direction, a direction in which the electromagnetic wave is reflected and orthogonal to the z-direction is referred to as a y-direction, the terahertz element includes an emission point that emits the electromagnetic wave, the reflection surface is curved toward the y-direction as the reflection surface extends away from the terahertz element in the z-direction, the reflection surface includes two ends in the z-direction, defining a basal end and a distal end, the distal end being located farther from the terahertz element than the basal end, and the reflection surface has a curved shape that is set by $y = z^2/4f$ that is y and z coordinates on a y-z plane specified in the z-direction and the y-direction, where f denotes a distance between the basal end and the emission point, in a direction orthogonal to the z-direction.

4. The terahertz device according to claim 1, further comprising:

a support substrate including a substrate main surface; and a power supply line formed on the substrate main surface and electrically connected to the terahertz element, wherein the terahertz element is mounted on the substrate main surface so that the element main surface and the substrate main surface face in the same direction.

5. The terahertz device according to claim 1, further comprising:

a support substrate including a substrate main surface; and a waveguide mounted on the substrate main surface and including a transmission region through which the electromagnetic wave transmits, wherein the terahertz element is mounted on the substrate main surface so that the element main surface and the substrate main surface face in the same direction in the transmission region, and the reflector is disposed on the waveguide so that the reflector and the support substrate are disposed at opposite sides of the waveguide.

6. The terahertz device according to claim 5, wherein the reflector and the waveguide are formed separately from each other, and the reflector is attached to the waveguide.

7. The terahertz device according to claim 6, wherein the reflector is removably attached to the waveguide.

8. The terahertz device according to claim 5, wherein the waveguide includes a through hole, the through hole extends through the waveguide in the thickness-wise direction and defines the transmission region, the terahertz element is disposed in the through hole, and the reflection surface entirely covers the through hole as viewed in the thickness-wise direction.

9. The terahertz device according to claim 8, wherein the through hole is defined by a wall surface including a tapered surface that widens from the support substrate as the reflector becomes closer, and as viewed in the thickness-wise direction, the reflection surface entirely covers a region that extends from the tapered surface along the tapered surface in the thickness-wise direction.

10. The terahertz device according to claim 1, further comprising:

a support substrate including a substrate main surface, wherein the terahertz element is mounted on the substrate main surface so that the element main surface and the substrate main surface face in the same direction, and the reflector is mounted on the substrate main surface.

11. The terahertz device according to claim 1, further comprising:

a support substrate including a substrate main surface and a substrate back surface that face in opposite directions in the thickness-wise direction, wherein the terahertz element is mounted on the substrate main surface, and the substrate back surface includes an external terminal electrically connected to the terahertz element.

12. The terahertz device according to claim 1, wherein the terahertz element includes multiple terahertz elements, and the reflector covers the element main surfaces of the terahertz elements in the thickness-wise direction.

13. The terahertz device according to claim 12, further comprising:

a support substrate including a substrate main surface, wherein each of the terahertz elements is mounted on the substrate main surface so that the element main surface and the substrate main surface face in the same direction, each of the terahertz elements includes a main electrode and a ground electrode, the substrate main surface includes a power supply line electrically connected to each of the terahertz elements, the power supply line includes main conductors and a ground conductor, the main conductors are separately electrically connected to the main electrodes of the terahertz elements, and the ground conductor is commonly electrically connected to the ground electrodes of the terahertz elements.

14. The terahertz device according to claim 1, wherein the reflector is formed from a conductive material that is non-transmissive to the electromagnetic wave.

15. The terahertz device according to claim 1, wherein the reflector is formed from a material that is transmissive to the electromagnetic wave, and a conductive film is formed on the reflection surface and formed from a conductive material that is non-transmissive to the electromagnetic wave.

16. A terahertz device, comprising:

a terahertz element including an element main surface and an element back surface that face in opposite directions, the terahertz element receiving and detecting an electromagnetic wave in a terahertz band, the terahertz element having a thickness-wise direction that is orthogonal to the element main surface; and a reflector including an opening that is open in a direction intersecting the thickness-wise direction and a reflection surface spaced apart and opposed to the element main surface in the thickness-wise direction, wherein when an electromagnetic wave is propagated from outside the terahertz device through the opening, the reflection surface reflects the electromagnetic wave toward the terahertz element, and the reflection surface includes a paraboloid of revolution.

* * * * *